United States Patent
Inoue

(10) Patent No.: US 11,322,782 B2
(45) Date of Patent: May 3, 2022

(54) CONTROL MODULE CONNECTED TO BATTERY MODULE

(71) Applicant: DENSO CORPORATION, Kariya (JP)

(72) Inventor: Yoshimitsu Inoue, Kariya (JP)

(73) Assignee: DENSO CORPORATION, Kariya (JP)

( * ) Notice: Subject to any disclaimer, the term of this patent is extended or adjusted under 35 U.S.C. 154(b) by 323 days.

(21) Appl. No.: 15/973,698

(22) Filed: May 8, 2018

(65) Prior Publication Data
US 2018/0331394 A1   Nov. 15, 2018

(30) Foreign Application Priority Data

May 10, 2017   (JP) ................................ JP2017-094215

(51) Int. Cl.
| | |
|---|---|
| *H01M 10/42* | (2006.01) |
| *H01M 10/48* | (2006.01) |
| *H01M 50/20* | (2021.01) |
| *H01M 50/24* | (2021.01) |
| *H01M 50/30* | (2021.01) |
| *H01M 50/502* | (2021.01) |
| *G01R 1/18* | (2006.01) |
| *H01M 10/613* | (2014.01) |

(Continued)

(52) U.S. Cl.
CPC ............ *H01M 10/425* (2013.01); *G01R 1/18* (2013.01); *H01M 10/4207* (2013.01); *H01M 10/48* (2013.01); *H01M 10/482* (2013.01); *H01M 50/20* (2021.01); *H01M 50/24* (2021.01); *H01M 50/30* (2021.01); *H01M 50/502* (2021.01); *H01M 10/486* (2013.01); *H01M 10/613* (2015.04); *H01M 10/625* (2015.04); *H01M 10/6563* (2015.04); *H01M 2010/4271* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| | | | | |
|---|---|---|---|---|
| 2,836,775 A | * | 5/1958 | Adkins | ................ H01H 47/12 |
| | | | | 335/230 |
| 6,225,788 B1 | | 5/2001 | Kouzu et al. | |
| 6,344,728 B1 | | 2/2002 | Kouzu et al. | |

(Continued)

FOREIGN PATENT DOCUMENTS

WO    WO 2016/148032 A1 * 9/2016 ............. G01R 15/20

*Primary Examiner* — Ula C Ruddock
*Assistant Examiner* — Tony S Chuo
(74) *Attorney, Agent, or Firm* — Oliff PLC

(57) ABSTRACT

A control module is arranged side by side with a battery module. The control module includes a bus bar by which the battery module and an electric load are electrically connected to each other; a switch by which an electrical connection between the bus bar and the electric load is switched on and off; a current sensor by which a current of the bus bar is detected; and a shielding part. The current sensor detects current passing through the bus par by converting, to an electrical signal, a magnetic field generated by the current passing though the bus bar. The switch generates a magnetic field to switch over connections between the bus bar and the electric load based on the generated magnetic field. The shielding part is arranged between the current sensor and the switch.

13 Claims, 27 Drawing Sheets

(51) Int. Cl.
*H01M 10/625* (2014.01)
*H01M 10/6563* (2014.01)

(56) References Cited

U.S. PATENT DOCUMENTS

| | | |
|---|---|---|
| 6,411,063 B1 | 6/2002 | Kouzu et al. |
| 2010/0182154 A1* | 7/2010 | Kawai ............... H04L 29/12254 340/636.1 |
| 2012/0129023 A1* | 5/2012 | Nakahama ............. H01M 2/02 429/83 |
| 2014/0141287 A1* | 5/2014 | Bertucci ............. H01M 10/425 429/7 |
| 2015/0293150 A1* | 10/2015 | Wand ...................... B60L 58/10 361/818 |
| 2018/0026458 A1* | 1/2018 | Kawamura ............. B60L 58/10 320/135 |
| 2018/0031613 A1* | 2/2018 | Nakayama ............. G01R 33/05 |
| 2018/0326863 A1 | 11/2018 | Soki et al. |
| 2018/0331395 A1 | 11/2018 | Inoue |
| 2018/0331396 A1 | 11/2018 | Soki et al. |
| 2018/0331402 A1 | 11/2018 | Inoue |

* cited by examiner

FIG.13
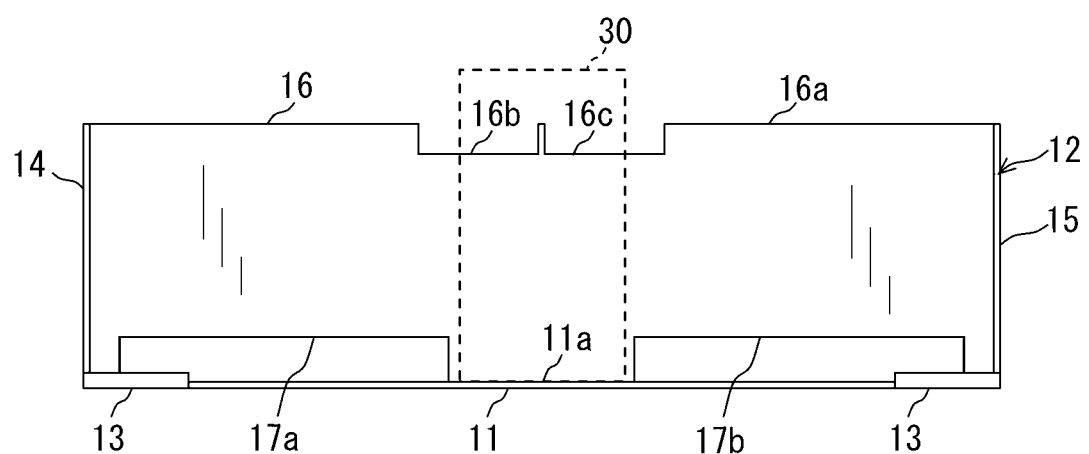
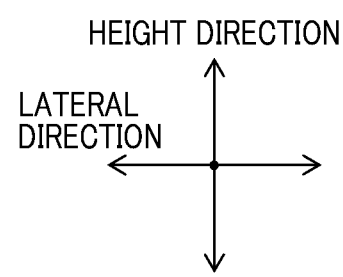

CONTROL MODULE CONNECTED TO BATTERY MODULE

CROSS-REFERENCE TO RELATED APPLICATION

This application claims priority to and the benefit of Japanese Patent Application No. 2017-94215 filed in the Japanese Patent Office on May 10, 2017, the entire contents of which are incorporated herein by reference.

BACKGROUND

Field of the Disclosure

The present disclosure relates to a control module to which a battery module is connected, and in particular, to such a combined unit of the control module and battery module mounted in, by way of example, in a vehicle.

Description of the Related Art

Patent document 1 discloses a battery power source device that is provided with a battery pack, and a charge/discharge circuit unit. The battery pack is provided with two battery holders that accommodate a required number of the battery modules in which a plurality of single batteries (battery cells) are connected to each other in series. The charge/discharge circuit unit accommodates a relay, a current sensor, and the like. The battery power source device disclosed in patent document 1 outputs driving electric power to an electric motor.

[Patent Document 1] JP-B 4117655

The above information disclosed in this Background section is only to enhance the understanding of the background of the disclosure and therefore it may contain information that does not form the prior art that is already known to a person of ordinary skill in the art.

In recent years, as demand of a hybrid vehicle and an electric vehicle dramatically increases, a development of a high output motor has been in progress. Accordingly, along with the development of the high output motor, a battery module provided with high output performance and high capacity performance that is capable of supplying driving electric power to the motor has been continuously in development. In consideration of the aforementioned development, a size of the battery module has a tendency to increase so as to achieve required performance thereof.

As described above, the battery power source device is provided with the charge/discharge circuit unit as well as the battery pack including the battery module. With respect to an increase in the size of the battery module, if the charge/discharge circuit unit can be made smaller in its size, it may be possible to suppress a size of the battery power source device from increasing. However, in such a construction, a distance between a relay and a current sensor, which are accommodated in the charge/discharge circuit unit, become shorter. Hence, the current sensor is apt to be influenced by factors such as electromagnetic noise which will occur when relay connections are switched over.

SUMMARY

With consideration of such circumstances, it is thus desired to provide a control module whose body size is suppressed form being larger and which can be protected more steadily from being influenced by the electromagnetic noise.

An exemplary embodiment provides a control module that is arranged side by side with a battery module including battery stacks in which a plurality of battery cells are arranged in a longitudinal direction that is orthogonal to a height direction ranging from an upper end surface on which electrodes of the battery cells are provided, to a lower end surface that is disposed at an opposite side of the upper end surface, the control module comprising: a bus bar by which the battery module and an electric load are electrically connected to each other; a switch by which an electrical connection between the bus bar and the electric load is switched on and off; a current sensor by which a current of the bus bar is detected; and a shielding part.

In this configuration, the current sensor is configured to detect current passing through the bus par by converting, to an electrical signal, a magnetic field generated by the current passing though the bus bar. The switch is configured to generate a magnetic field to switch over connections between the bus bar and the electric load based on the generated magnetic field. The shielding part is arranged between the current sensor and the switch.

In this way, the shielding part is arranged between the current sensor and the switch. Hence, when a distance between the current sensor and the switch becomes shorter by making the body size of the control module, a magnetic field caused at the switch is reduced or suppressed from passing the current sensor. Hence it is possible to prevent the current sensor from having a reduced detection accuracy attributable to the shortened distance between the current sensor and the switch.

Further, the elements described in detailed description of the embodiments are marked with symbols. The symbols such as a numeral and a letter of the alphabet are used in the specification so as to simply indicate the correspondence relationship between each element in the exemplary embodiments, and are not intended to necessarily indicate element itself described in the exemplary embodiments. The symbols used herein are not intended to limit the scope of the claims.

BRIEF DESCRIPTION OF THE DRAWINGS

In the accompanying drawings:

FIG. 13 is a front view of the connecting frame.

DETAILED DESCRIPTION OF THE EMBODIMENTS

Hereinafter, the present disclosure will be described in detail with the accompanying drawings, based upon exemplary embodiments in which the present disclosure is applied to a hybrid vehicle.

First Exemplary Embodiment

A battery pack will now be described in detail with references to FIGS. 1 to 24 according to exemplary embodiments of the present disclosure. Hereinafter, three directions orthogonal to each other will be defined as a lateral direction, a longitudinal direction, and a height direction. The lateral direction in the exemplary embodiments is directed along an advancing direction of a hybrid vehicle. The longitudinal direction is directed along left and right directions thereof. The height direction is directed along a vertical direction thereof.

Further, a plane that is defined by the lateral direction and the longitudinal direction is referred to as a defined plane. A plane that is defined by the lateral direction and the height direction is referred to as a lateral plane. A plane that is defined by the longitudinal direction and the height direction is a longitudinal plane.

(Battery Pack Overview)

Figure 1:
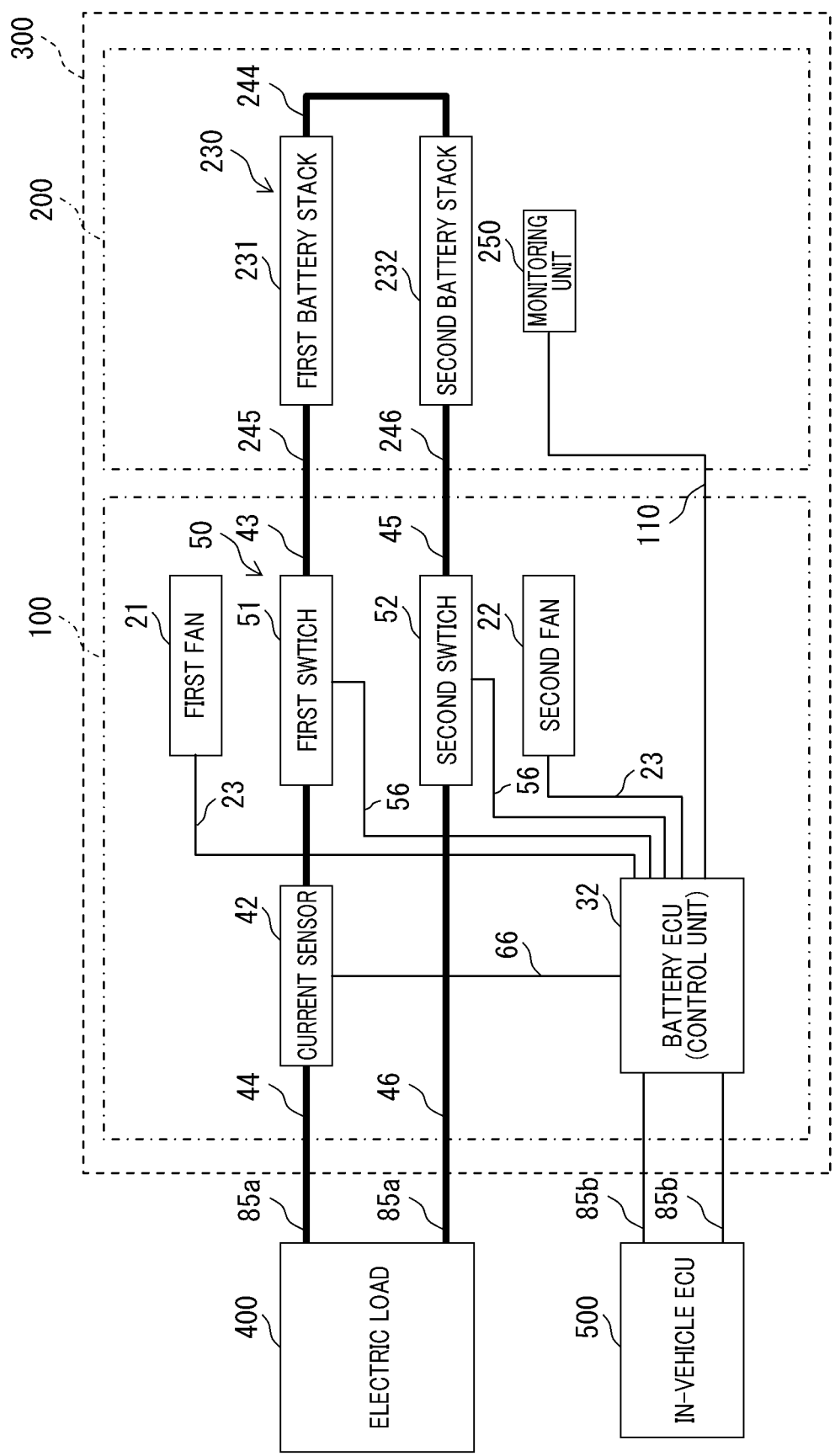
FIG. 1 is a block diagram illustrating a function of a battery pack.
Figure 2:
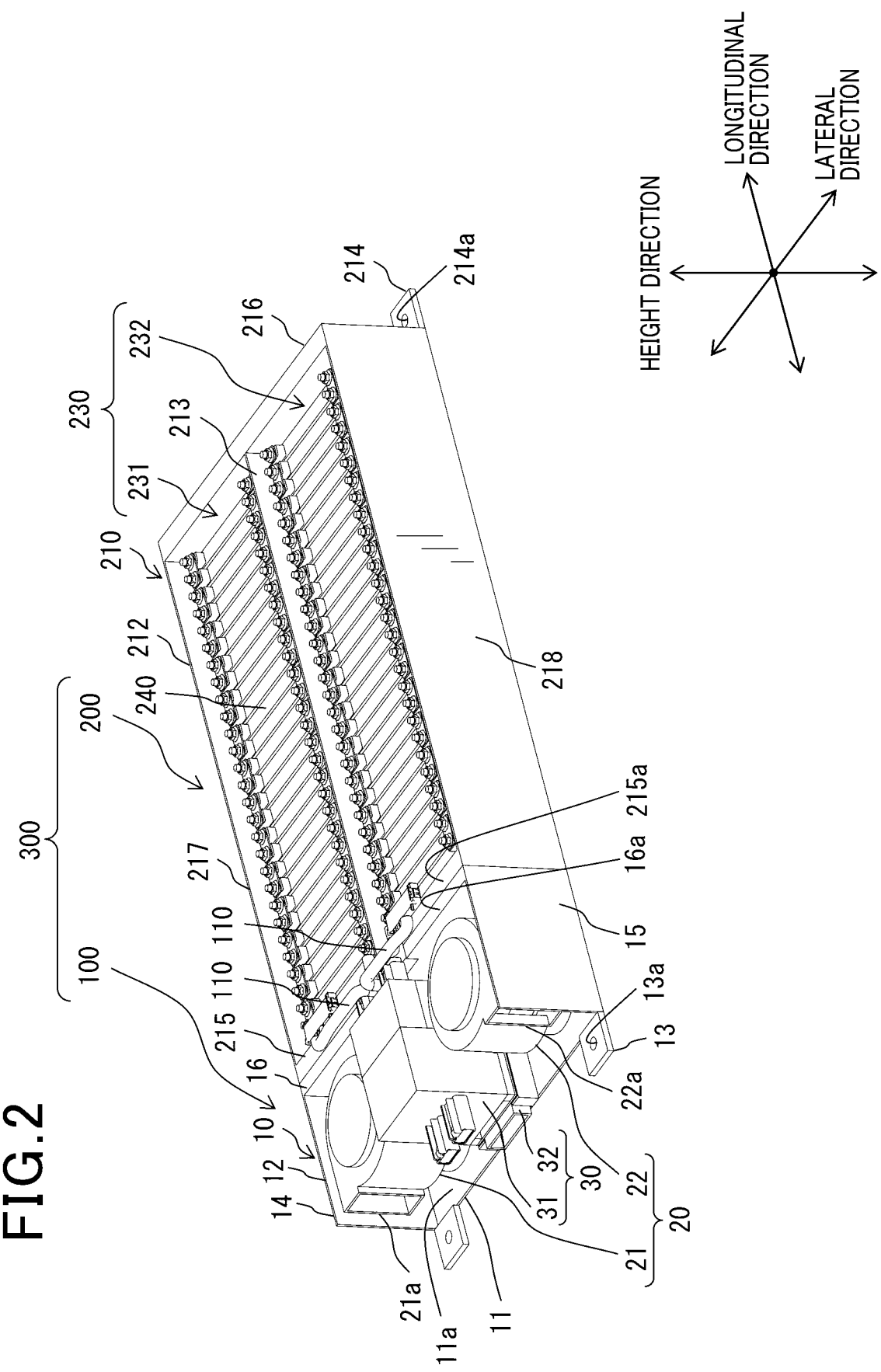
FIG. 2 is a perspective view illustrating the battery pack.
Figure 3:
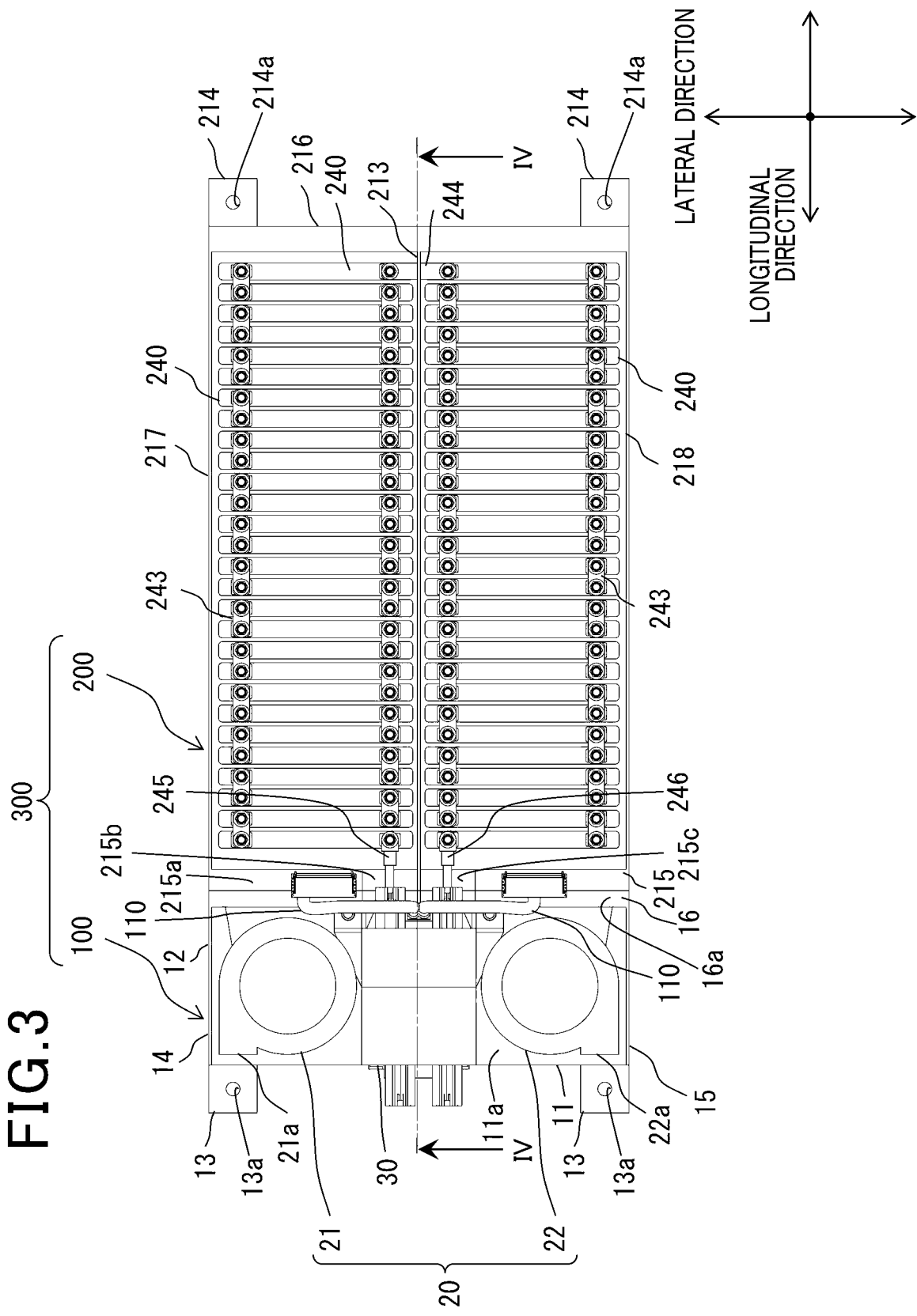
FIG. 3 is a top view illustrating the battery pack.

A battery pack 300 has a function of supplying electric power to an electric load 400 of a hybrid vehicle shown in FIG. 1. The electric load 400 includes a motor generator performing functions as an electric power supply source and a power generation source. For example, when the motor generator is driven, the battery pack 300 is discharged, after which the electric power is supplied to the motor generator.

When the motor generator generates the electric power, the battery pack 300 charges the electric power that is generated by the motor generator. The motor generator corresponds to an electric motor.

The battery pack 300 includes a battery ECU 32. The battery ECU 32 is electrically connected to an ECU (in-vehicle ECU 500) mounted on the hybrid vehicle. A signal between the battery ECU 32 and the in-vehicle ECU 500 is configured to be transmitted and received each other, such that the hybrid vehicle is cooperatively controlled by the battery ECU 32 and the in-vehicle ECU 500.

The battery pack 300 includes a battery stack 230 in which a plurality of battery cells 240 are electrically connected to each other in series. The battery ECU 32 outputs a charge state of the battery stack 230, and the like to the in-vehicle ECU 500. The in-vehicle ECU 500 outputs a command signal to the battery ECU 32 based upon the charge state thereof, a depression amount of the accelerator pedal that is inputted from various sensors mounted on a vehicle, vehicle information such as a throttle valve opening, and the like, an ignition switch, and the like. Accordingly, the battery ECU 32 controls a system main relay 50, which will be described later, based upon the command signal outputted from the in-vehicle ECU 500.

For example, the battery pack 300 is provided in an installation space under a seat of the hybrid vehicle. The installation space is wider under a back seat than under a front seat. The battery back 300 in the exemplary embodiment is provided in the installation space under the back seat.

A length (height) in the height direction of the seat is determined depending on comfortability of sitting of a user, and the like. A length (lateral width) of the lateral direction (advancing/retreating direction) of the seat is also determined depending on the comfortability of the sitting of the user. However, a length (longitudinal width) of the longitudinal direction (right-left direction) of the seat is determined depending on a size of the hybrid vehicle. Accordingly, the installation space in which the battery pack 300 is provided is determined depending on the comfortability of the sitting of the user and the size of the hybrid vehicle.

The comfortability of the sitting of the user is determined according to human engineering, and the like. Accordingly, it is difficult to lengthily set a height of the installation space and a lateral width thereof. Further, the size of the hybrid vehicle is not determined by the user. Therefore, a longitudinal width of the installation space may be lengthily set in comparison with the height thereof and the lateral width thereof.

(Battery Module Overview)

As shown in FIGS. 1 to 5, the battery pack 300 includes a battery module 200 and a control module 100. The control module 100 is arranged side by side with the battery module 200 in the longitudinal direction, and the control module 100 and the battery module 200 are mechanically and electrically connected to each other. Accordingly, the battery module 200 and the control module 100 are arranged in the longitudinal direction in which the longitudinal width may be lengthily set in comparison with the height of the installation space and the lateral width thereof.

The battery module 200 has a function as a power supply source and a charge source. The control module 100 controls an input of electric power of the battery module 200 and an output thereof. Further, the control module 100 also controls cooling of the battery stack 230 of the battery module 200.

The battery module 100 also performs a command of an equalization process of the battery cell 240 with respect to the batter module 200.

As shown in FIGS. 2 to 5, the battery module 200 includes a frame 210 and a battery stack 230. The frame 210 is opened in the height direction and is also formed of a box shape including a bottom. The frame 210 extends in the longitudinal direction. The battery stack 230 is accommodated in the frame 210. The battery stack 230 includes a plurality of the battery cells 240. The plurality of battery cells 240 are arranged in the longitudinal direction. The plurality of battery cells 240 are mechanically and electrically connected to each other in series. The battery cell 240 is a secondary battery and an electromotive voltage thereof is generated by a chemical reaction.

The battery module 200 includes a first battery stack 231 and a second battery stack 232 as the battery stack 230. The first batter stack 231 and the second battery stack 232 are electrically connected to each other in series. Accordingly, an output voltage of the batter module 200 is a total sum of output voltages of the plurality of battery cells 240 that are respectively accommodated in the first battery stack 231 and the second battery stack 232.

As shown in FIG. 1, the battery module 200 includes a monitoring unit 250 that monitors the respective voltages of the plurality of battery cells 240. The monitoring unit 250 (not shown) includes a flexible substrate having flexibility properties, an electronic element mounted on the flexible substrate, and a monitoring IC chip. The electronic element includes a fuse, a Zener diode, and a temperature sensor. The monitoring IC chip includes a switch and a microcomputer.

The monitoring unit 250 is provided at an upper portion of the battery stack 230. In other words, the monitoring unit 250 is provided at the frame 210 via the battery stack 230. The monitoring unit 250 is provided at an upper portion of an upper end surface 240a of the battery cell 240, which will be described later.

A plurality of detection electrodes and a plurality of wiring patterns corresponding to the respective battery cells 240 are provided on the flexible substrate. Electronic elements respectively corresponding to the plurality of wiring patterns are provided on the flexible substrate. The respective plurality of wiring patterns and monitoring IC chips are electrically connected to each other. The monitoring IC chip includes switches respectively corresponding to the plurality of wiring patterns. Charge and discharge of the battery cells 240 that are electrically connected to the corresponding wiring patterns are controlled by opening and closing of the switch.

Figure 4:
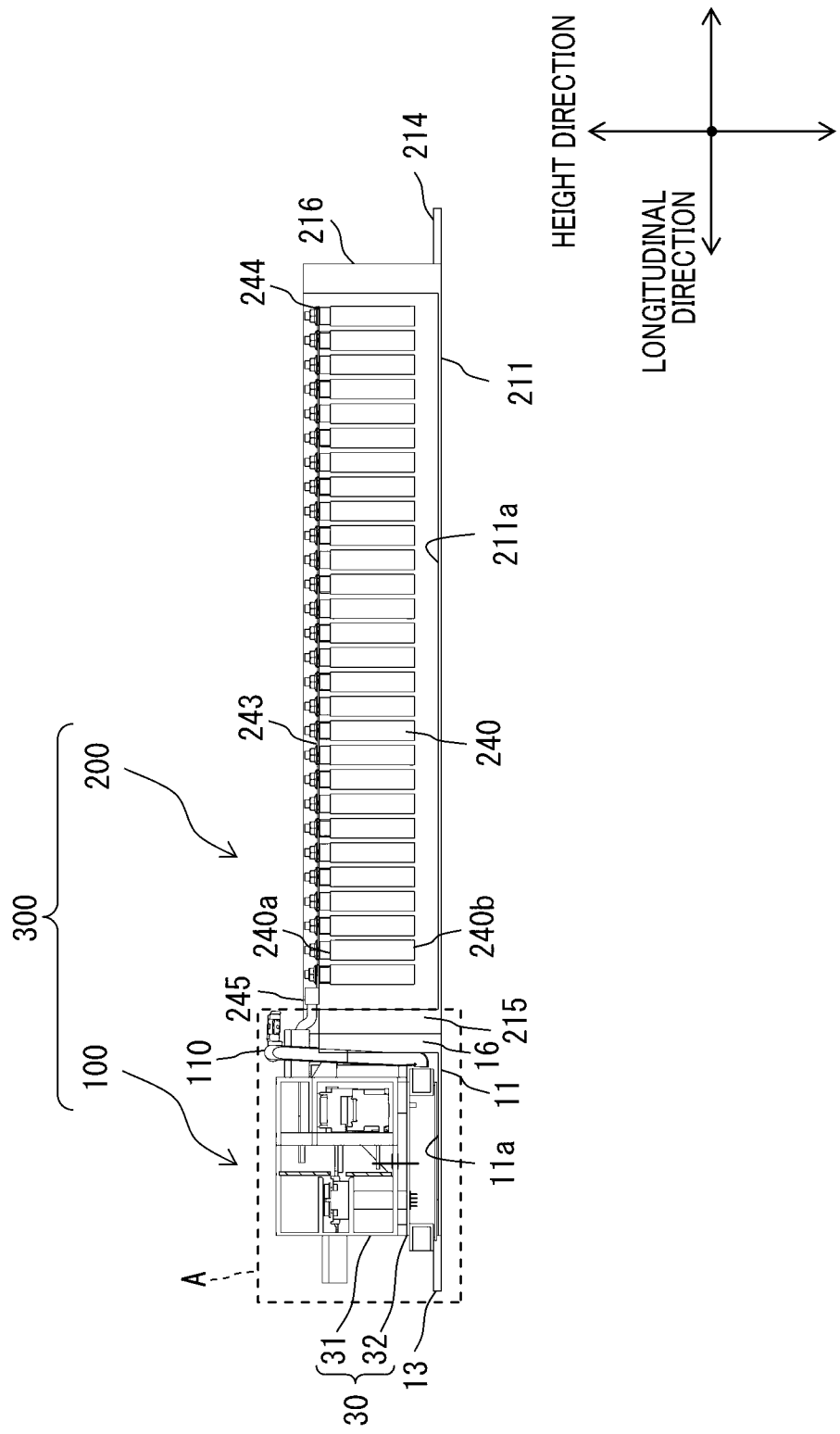
FIG. 4 is a cross-sectional view taken along the line IV-IV of FIG. 3.

Further, the flexible substrate is provided with a connector that is electrically connected to the respective plurality of wiring patterns. The connector is connected to an internal wire 110. The internal wire 110 is connected to the battery ECU 32 of the control module 100. Accordingly, the monitoring unit 250 and the battery ECU 32 are electrically connected to each other via the internal wire 110. The output voltages of the respective battery cells 240 are inputted from the monitoring unit 250 to the battery ECU 32. Further, temperatures of the respective battery cells 240 are inputted from the monitoring unit 250 to the battery ECU 32. As shown in FIG. 4, a connection portion between a connector of the monitoring unit 250 and the internal wire 110 is disposed at an upper portion of the frame 210 in the height direction. The connection portion of the internal wire 110 and the monitoring unit 250 are arranged in the longitudinal direction.

As described above, the battery pack 230 includes the plurality of battery cells 240 connected to each other in series. Functions and characteristics of the plurality of battery cells 240 are different from each other due to variations thereof. Thus, when charge and discharge thereof are repeatedly performed, the respective plurality of battery cells 240 have a different SOC (state of charge). The SOC is an abbreviation of state of charge. The SOC has a correlation with the electromotive voltage of the battery cell 240.

The battery cell 240 should suppress occurrence of over-discharge and over-charge due to its characteristic. In other words, the over-discharge and the over-charge are in states where the SOC is extremely low and high. Specifically, when the SOC (state of charge) of each battery cell 240 is dispersed (that is to say, the SOC of each battery cell 240 is different from each other), each battery cell 240 also has a different degree of the over-discharge of each battery cell 240 and the over-charge thereof. Therefore, it is required to equalize the SOC of the plurality of battery cells 240 with which the battery stack 230 is formed, so as to perform accurate control in such a manner that the SOC of the battery stack 230 is prevented from being over-charged and over-discharged. In other words, the respective SOC (states of charge) of the plurality of battery cells 240 are required to be consistent with the SOC of the battery stack 230 which is a total sum average thereof.

In consideration of the required configuration described above, the monitoring unit 250 detects and monitors the respective output voltages (electromotive voltages) of the plurality of battery cells 240 that have correlations with the SOC. The respective output voltages are inputted to the battery ECU 32 of the control module 100. The battery ECU 32 stores the correlations between the SOC and the electromotive voltages. The battery ECU 32 detects the respective SOC (states of charge) of the plurality of battery cells 240 based upon the inputted output voltages (electromotive voltages) and the stored correlations therebetween. The battery ECU 32 determines the equalization process of the SOC of the plurality of battery cells 240 with which the battery stack 230 is formed based upon the detected SOC thereof. Further, the battery ECU 32 outputs a command of the equalization process thereof to the microcomputer of the monitoring IC chip based upon the above-mentioned determination. The microcomputer controls the switches respectively corresponding to the plurality of battery cells 240 by opening and closing of the switches based upon the command of the equalization process thereof, thereby performing the charge and the discharge. In this way, the equalization process thereof is performed.

Additionally, the temperatures of the respective battery cells 240 are inputted from the monitoring unit 250 to the battery ECU 32. The SOC has a correlation with the temperature. Therefore, the battery ECU 32, strictly speaking, stores the correlations between the SOC, the electromotive voltage, and the temperature. The battery ECU 32 detects the respective SOC (states of charge) of the plurality of battery cells 240 based upon the inputted output voltage (electromotive voltage) and the inputted temperature, and the aforementioned correlations therebetween.

(Battery Module Configuration)

Figure 6:
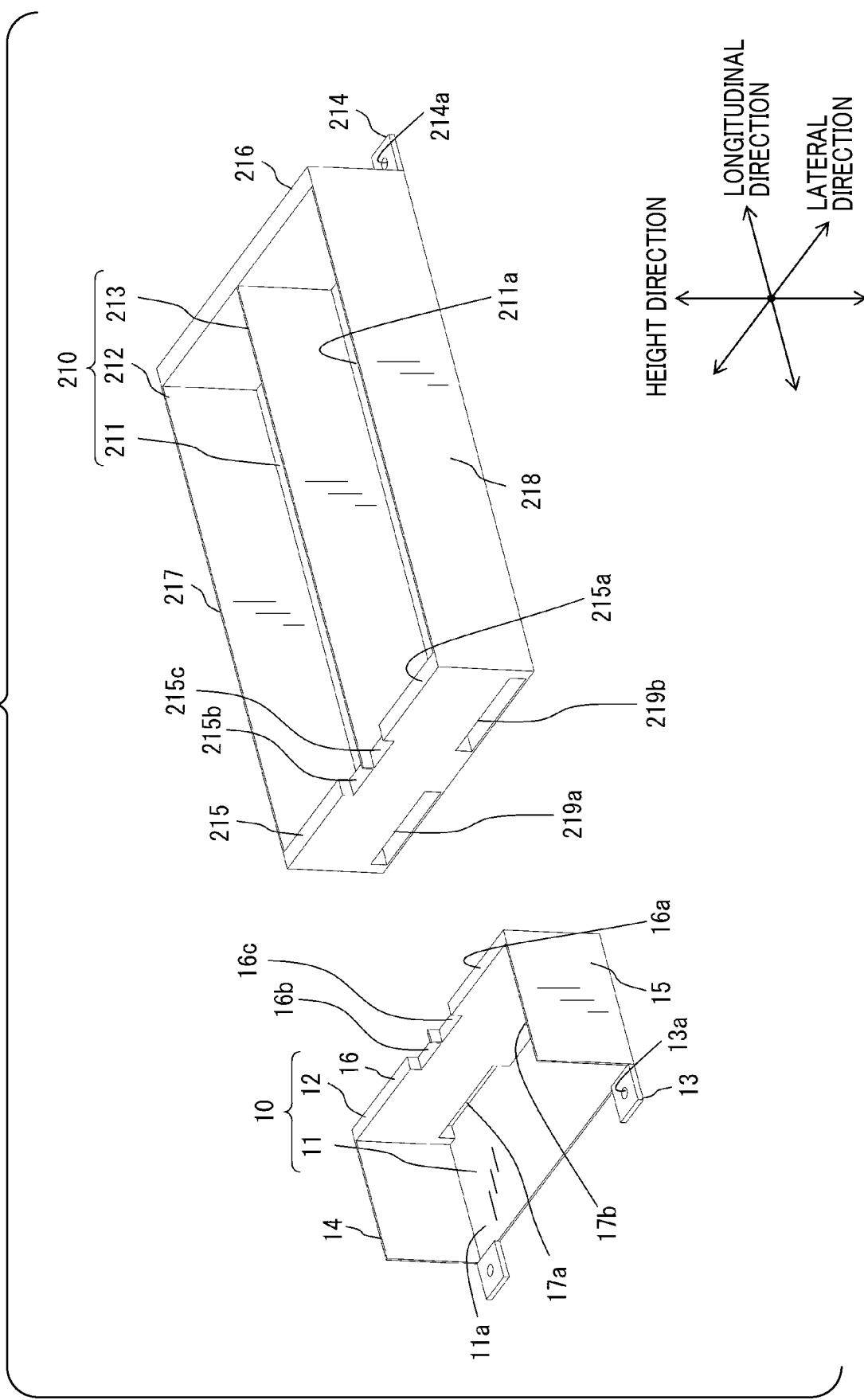
FIG. 6 is an exploded perspective view of a frame and a connecting frame.
Figure 7:
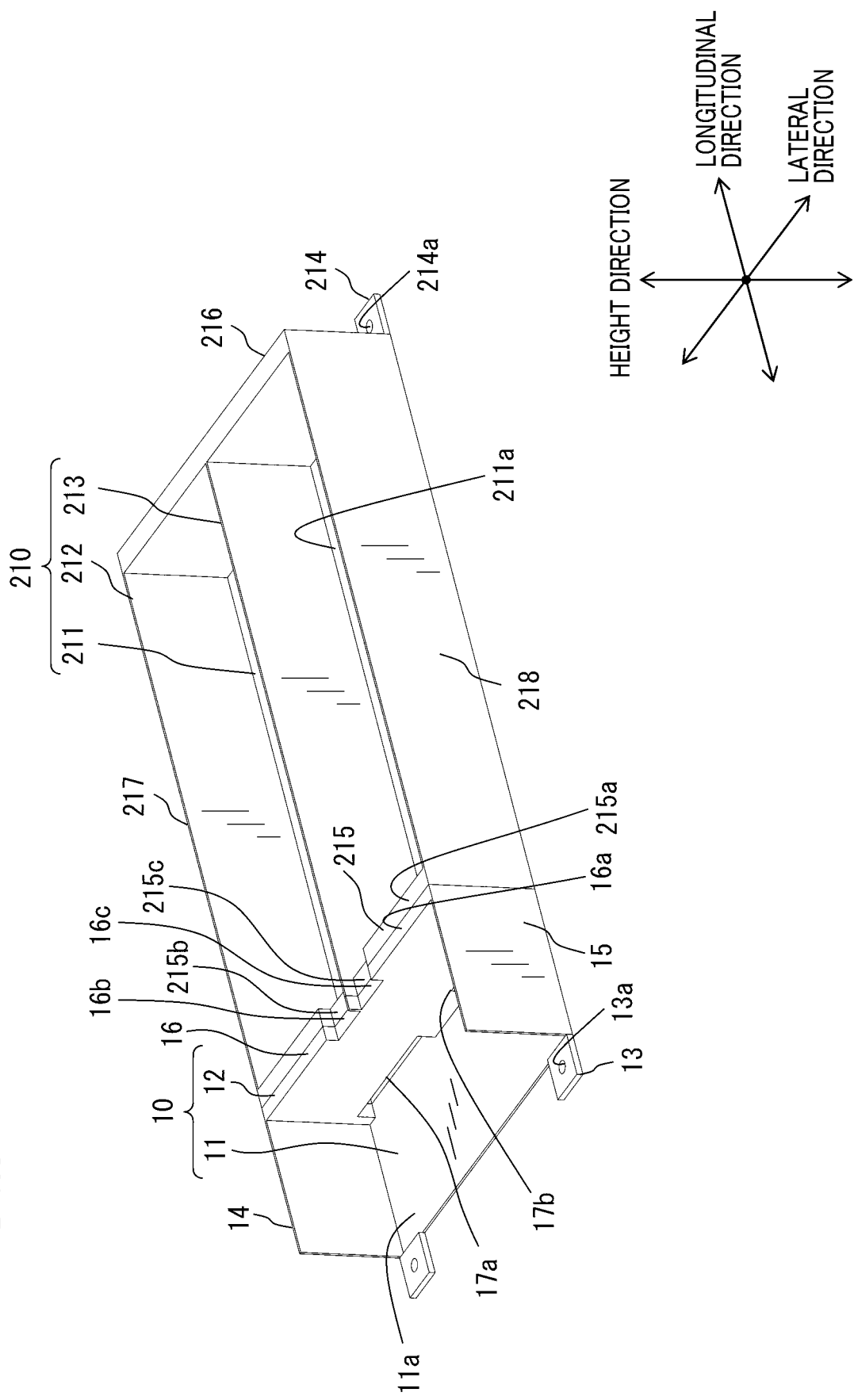
FIG. 7 is a perspective view illustrating a connected state between the frame and the connecting frame.
Figure 8:
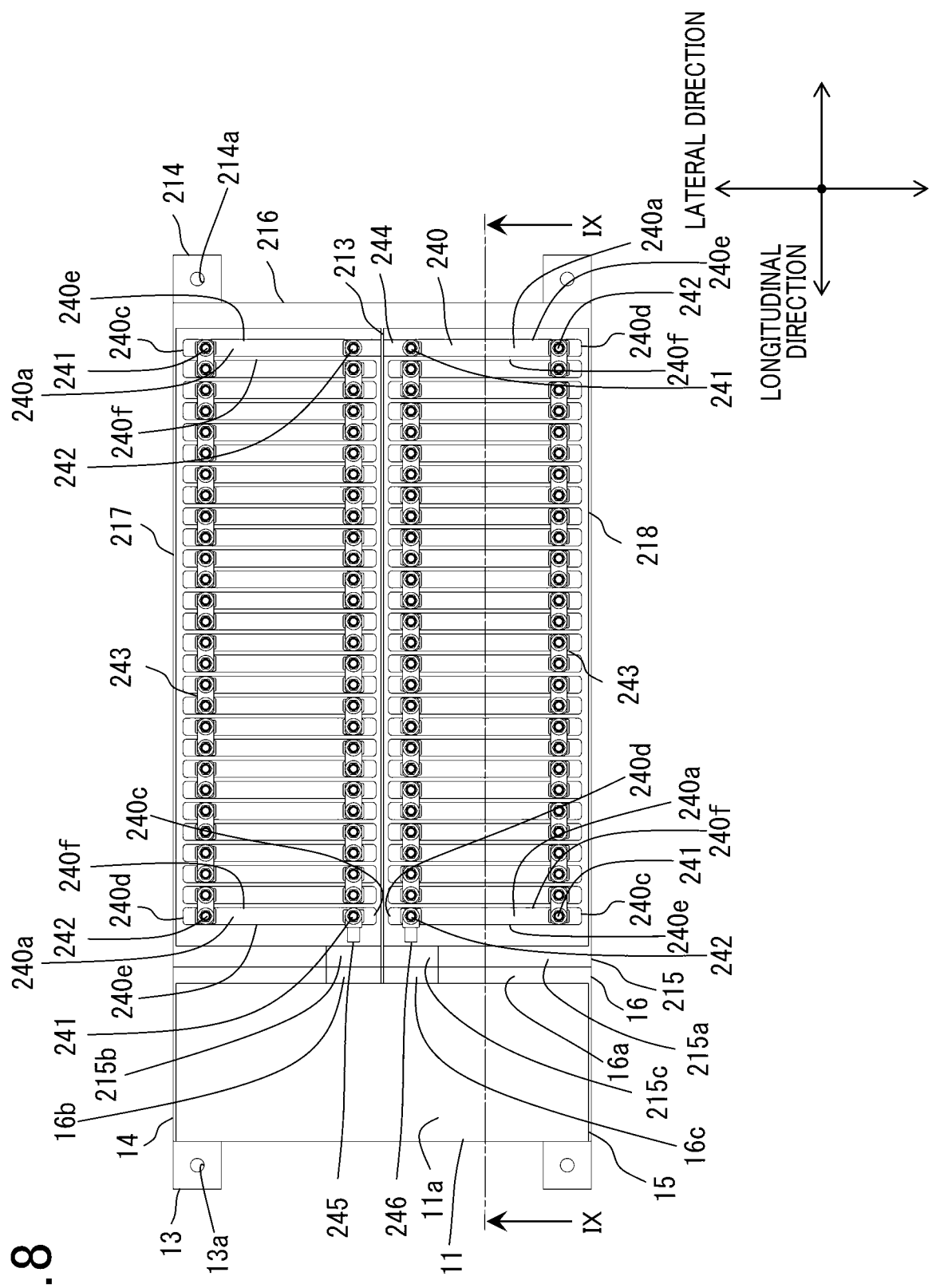
FIG. 8 is a top view illustrating a state in which the battery stack is mounted on the frame that is connected to the connecting frame.
Figure 9:
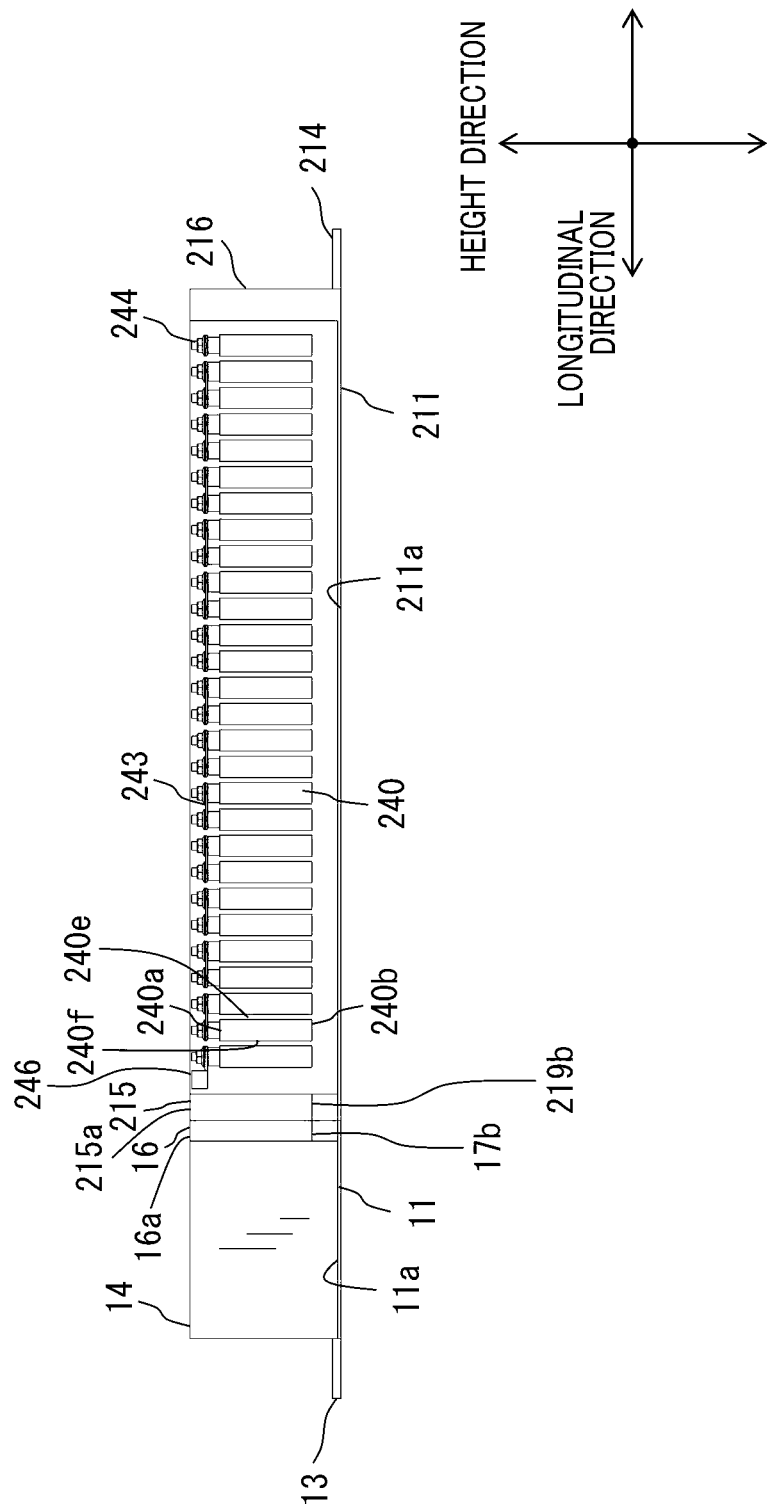
FIG. 9 is a cross-sectional view taken along the line IX-IX of FIG. 8.

Hereinafter, the frame 210 and the battery stack 230 will now be described in detail with references to FIGS. 6 to 9. The frame 210 is made of aluminum. The frame 210 is an aluminum die-cast product. As shown in FIGS. 6 and 7, the frame 210 includes a bottom wall 211, a side wall 212, and a partition wall 213. The bottom wall 211 is formed of a long rectangle in the longitudinal direction on the defined plane. Further, as shown in FIGS. 8 and 9, a rib 214 for bolting the battery module 200 to a body of the hybrid vehicle is formed on the bottom wall 211. In the exemplary embodiment of the present disclosure, the two ribs 214 are formed on the bottom wall 211. The two ribs 214 are separated from the control module 100 of the bottom wall 211, and are formed at edge portions along the lateral direction. The two ribs 214 are arranged in the lateral direction. Bolt holes 214a, through which the bolts are inserted, are formed in the respective ribs 214. Further, the partition wall 213 may be formed separately from the bottom wall 211 and the side wall 212. A material of the partition wall 213 may be different from those of the bottom wall 211 and the side wall 212.

The side wall 212 has a left wall 215, a right wall 216, a front wall 217, and a rear wall 218. The left wall 215 and the right wall 216 are respectively formed of rectangles on the lateral plane. The front wall 217 and the rear wall 218 are respectively formed of long rectangles in the longitudinal direction on the longitudinal plane. The left wall 215 and the right wall 216 are separated from each other and arranged in the longitudinal direction, and are opposite to each other. The front wall 217 and the rear wall 218 are separated from each other and arranged in the lateral direction, and are opposite to each other. Further, the left wall 215, the front wall 217, the right wall 216, and the rear wall 218 are arranged in a circumferential direction order around the height direction, and are connected to each other. Additionally, the left wall 215, the front wall 217, the right wall 216, and the rear wall 218 are respectively connected to edge portions on a bottom surface 211a of the bottom wall 211. Accordingly, a storage space surrounded by the side wall 212 is partitioned at an upper portion of the bottom surface 211a.

Additionally, the battery module 200 includes a lid part (not shown). An opening part of the frame 210 is blocked and closed by the lid part. Meanwhile, the opening part, through which air flows in and out, is formed at the lid part and a space between the lid part and the frame 210, or the frame 210. The opening part in the exemplary embodiment is formed at a side of the right wall 216.

The partition wall 213 is provided in the storage space. The partition wall 213 forms a long rectangle in the longitudinal direction on the longitudinal plane. The storage space is divided into two spaces by the partition wall 213 in the lateral direction. A space that is partitioned by the left wall 215, the front wall 217, the right wall 216, and the partition wall 213 is herein referred to as a first storage space. A space that is partitioned by the left wall 215, the rear wall 218, the right wall 216, and the partition wall 213 is herein referred to as a second storage space. The first battery stack 231 is provided in the first storage space. The second battery stack 232 is provided in the second storage space.

The first battery stack 231 and the second battery stack 232 respectively include the plurality of battery cells 240. The battery cell 240 is formed of a quadrangular pillar shape. Therefore, the battery cell 240 has six surfaces. The battery cell 240 has an upper end surface 240a and a lower end surface 240b facing in the height direction. The battery cell 240 has a first side surface 240c and a second side surface 240d facing in the lateral direction. The battery cell 240 includes a first principal surface 240e and a second principal surface 240f facing in the longitudinal direction. The first principal surface 240e and the second principal surface 240f have larger areas than other four surfaces among the six surfaces.

The battery cell 240 is the secondary battery. More specifically, the battery cell 240 is a lithium-ion battery. The lithium-ion battery generates the electromotive voltage by the chemical reaction. As described above, the electromotive voltage is generated by the chemical reaction, such that a current flows through the battery cell 240 and thus consequently the battery cell 240 generates heat. As described above, the first principal surface 240e of the battery cell 240 and the second principal surface 240f thereof have larger areas than other four surfaces. Therefore, the first principal surface 240e of the battery cell 240 and the second principal surface 240f thereof are easy to expand, and thus consequently the battery cell 240 expands in the longitudinal direction. That is, the battery cell 240 expands in an arrangement direction of the plurality of battery cells 240.

The battery stack 230 has a restraining tool (not shown). The plurality of battery cells 240 are mechanically connected to each other in series in the longitudinal direction by the restraining tool. Further, an increase in a size of the battery stack 230 due to respective expansions of the plurality of battery cells 240 is suppressed by the restraining tool. Further, a gap is formed between neighboring battery cells 240. Air flows through the gap, such that heat radiations of the respective battery cells 240 are promoted.

As described later, a ventilation space is formed at a lower portion of the battery stack 230. Air in the storage space flows from the upper portion of the battery stack 230 to the ventilation space disposed at the lower portion of the battery stack 230 through the gap. That is, the air of a side of the upper end surface 240a of the battery cell 240 flows into a side of the lower end surface 240b of the battery cell 240 through the gap.

A positive electrode terminal 241 and a negative electrode terminal 242 are formed on the upper end surface 240a of the battery cell 240. The positive electrode terminal 241 and the negative electrode terminal 242 are arranged in the lateral direction. More specifically, the positive electrode terminal 241 is disposed on the first side surface 240c, and the negative electrode terminal 242 is disposed on the second side surface 240d. The positive electrode terminal 241 and the negative electrode terminal 242 correspond to an electrode.

Hereinafter, arrangement of the battery cells 240 of the first battery stack 231 and the second battery stack 232 will now be described in detail. Here, numbers are respectively provided to the plurality of battery cells 240, all of which are arranged in the longitudinal direction, and a larger number is provided thereto as each of the battery cells 240 is moved in a direction from the left wall 215 to the right wall 216.

As shown in FIG. 8, the first principal surface 240e of a first numbered battery cell 240 that is disposed at a leftmost side of the left wall 215 and the left wall 215 are opposite to each other in the longitudinal direction, among the respective battery cells 240 with which the first battery stack 213 and the second stack 232 are respectively formed. The first side surface 240c of the first numbered battery cell 240 of the first battery stack 231 is disposed at a side of the partition wall 213, and the second side surface 240d is disposed at a side of the front wall 217. Meanwhile, the first side surface 240c of the first numbered battery cell 240 of the second battery stack 232 is disposed at a side of the rear wall 218, and the second side surface 240d is disposed at the side of the partition wall 213.

Therefore, the positive electrode terminal 241 of the first numbered battery cell 240 of the first battery stack 231 is disposed at the side of the partition wall 213, and the negative electrode terminal 242 thereof is disposed at the side of the front wall 217. The negative electrode terminal 242 of the first numbered battery cell 240 of the second battery stack 232 is disposed at the side of the partition wall 213, and the positive electrode terminal 241 thereof is disposed at the side of the rear wall 218.

The second principal surface 240f of a second numbered battery cell 240 that is adjacent to the first numbered battery cell 240 and arranged in the longitudinal direction is opposite to the second principal surface 240f of the first numbered battery 240 in the longitudinal direction. Therefore, the negative electrode terminal 242 of the first numbered battery cell 240 and the positive electrode terminal 241 of the second numbered battery cell 240 are arranged in the longitudinal direction. Further, the positive electrode terminal 241 of the first numbered battery cell 240 and the negative electrode terminal 242 of the second numbered battery cell 240 are arranged in the longitudinal direction.

Hereinafter, as described above, the two battery cells 240, which are adjacent to each other, are opposite to each other on the second principal surfaces 240f (first principal surfaces 242e). Accordingly, the positive electrode terminal 241 and the negative electrode terminal 242 of the two battery cells 240, which are adjacent to each other, are arranged in the longitudinal direction. As a result, the positive electrode terminal 241 and the negative electrode terminal 242 are alternately arranged in the longitudinal direction in each of the first battery stack 231 and the second battery stack 232. The positive electrode terminal 241 and the negative electrode terminal 242, which are adjacent to each other and arranged in the longitudinal direction, are electrically connected to each other via a first series terminal 243 extending in the longitudinal direction. The first series terminal 243 electrically connects only one positive electrode terminal 241 and one negative electrode terminal 242. Accordingly, the plurality of battery cells 240, with which the first battery stack 231 is formed, are electrically connected to each other in series. The plurality of battery cells 240, with which the second battery stack 232 is formed, are electrically connected to each other in series.

Hereinafter, an electrical connection relation between the first battery stack 231 and the second battery stack 232 is in a reverse order. That is, in the case of the first battery stack 231, the negative electrode terminal 242 of the first numbered battery cell 240 and the positive electrode terminal 241 of the second numbered battery cell 240 are electrically connected to each other via the first series terminal 243. On the other hand, in the case of the second battery stack 232, the positive electrode terminal 241 of the first numbered battery cell 240 and the negative electrode terminal 242 of the second numbered battery cell 240 are electrically connected to each other via the first series terminal 243. Hereinafter, an electrical connection relation between the battery cells 240 after the second numbered battery cell 240 is also opposite to each other in the first battery stack 231 and the second battery stack 232.

The first battery stack 231 and the second battery stack 232 respectively include the same number of the battery cells 240. Additionally, the first battery stack 231 and the second battery stack 232 respectively include an even number of the battery cells 240.

Accordingly, the second principal surface 240f of a last numbered battery cell 240 that stays away from the left wall 215 of the leftmost side of the first battery stack 231 and that is disposed at the side of the right wall 216 is opposite to the second principal surface 240f of a second last numbered battery cell 240 in the longitudinal direction, which is the same as the above-mentioned arrangement between the second principal surface 240f of the first numbered battery cell 240 and the second numbered battery cell 240. Thus, the first principal surface 240e of the last numbered battery cell 240 is opposite to the right wall 216 in the longitudinal direction, and the negative electrode terminal 242 of the last numbered battery cell 240 is disposed at the side of the partition wall 213 of the right wall 216. That is, the negative electrode terminal 242 of the last numbered battery cell 240 is disposed at a central side of the right wall 216.

In the same manner, the second principal surface 240f of a last numbered battery cell 240 that stays away from the left wall 215 of the leftmost side of the second battery stack 232 and that is disposed at the side of the right wall 216 is opposite to the second principal surface 240f of a second last numbered battery cell 240 in the longitudinal direction. Thus, the first principal surface 240e of the last numbered battery cell 240 is opposite to the right wall 216 in the longitudinal direction, and the positive electrode terminal 241 of the last numbered battery cell 240 is disposed at the side of the partition wall 213 of the right wall 216. That is, the positive electrode terminal 241 of the last numbered battery cell 240 is disposed at the central side of the right wall 216.

As described above, the negative electrode terminal 242 of the last numbered battery cell 240 of the first battery stack 231 and the positive electrode terminal 241 of the last numbered battery cell 240 of the second battery stack 232 are arranged in the lateral direction with the partition wall 213 disposed therebetween. The negative electrode terminal 242 of the last numbered battery cell 240 of the first battery stack 231 and the positive electrode terminal 241 of the last numbered battery cell 240 of the second battery stack 232 are electrically connected to each other via a second series terminal 244 extending in the lateral direction across the partition wall 213. Accordingly, the first battery stack 231 and the second battery stack 232 are electrically connected to each other in series. Further, a groove, through which the second series terminal 244 pass, may be formed at the partition wall 213.

As described above, the positive electrode terminal 241 of the first numbered battery cell 240 of the first battery stack 231 is disposed at the side of the partition wall 213, and the negative electrode terminal 242 of the first numbered battery cell 240 of the second battery stack 232 is disposed at the side of the partition wall 213. Accordingly, the positive electrode terminal 241 of the first numbered battery cell 240 of the first battery stack 231 and the negative electrode terminal 242 of the first numbered battery cell 240 of the second battery stack 232 are arranged in the lateral direction with the partition wall 213 disposed therebetween. More specifically, the positive electrode terminal 241 of the first numbered battery cell 240 of the first battery stack 231 and the negative electrode terminal 242 of the first numbered battery cell 240 of the second battery stack 232 are respectively disposed at a central side of the left wall 215. A positive electrode input/output terminal 245 is connected to the positive electrode terminal 241 disposed at the central side of the left wall 215. Additionally, a negative electrode input/output terminal 246 is connected to the negative electrode terminal 242 disposed at the central side of the left wall 215.

The positive electrode input/output terminal 245 and the negative electrode input/output terminal 246 are electrically and mechanically connected to the control module 100. Accordingly, the output voltage of the battery module 200 is outputted to the electric load 400 via the control module 100. On the other hand, the electric power generated by the motor generator of the electric load 400 is provided to the battery module 200 via the control module 100.

Figure 10:
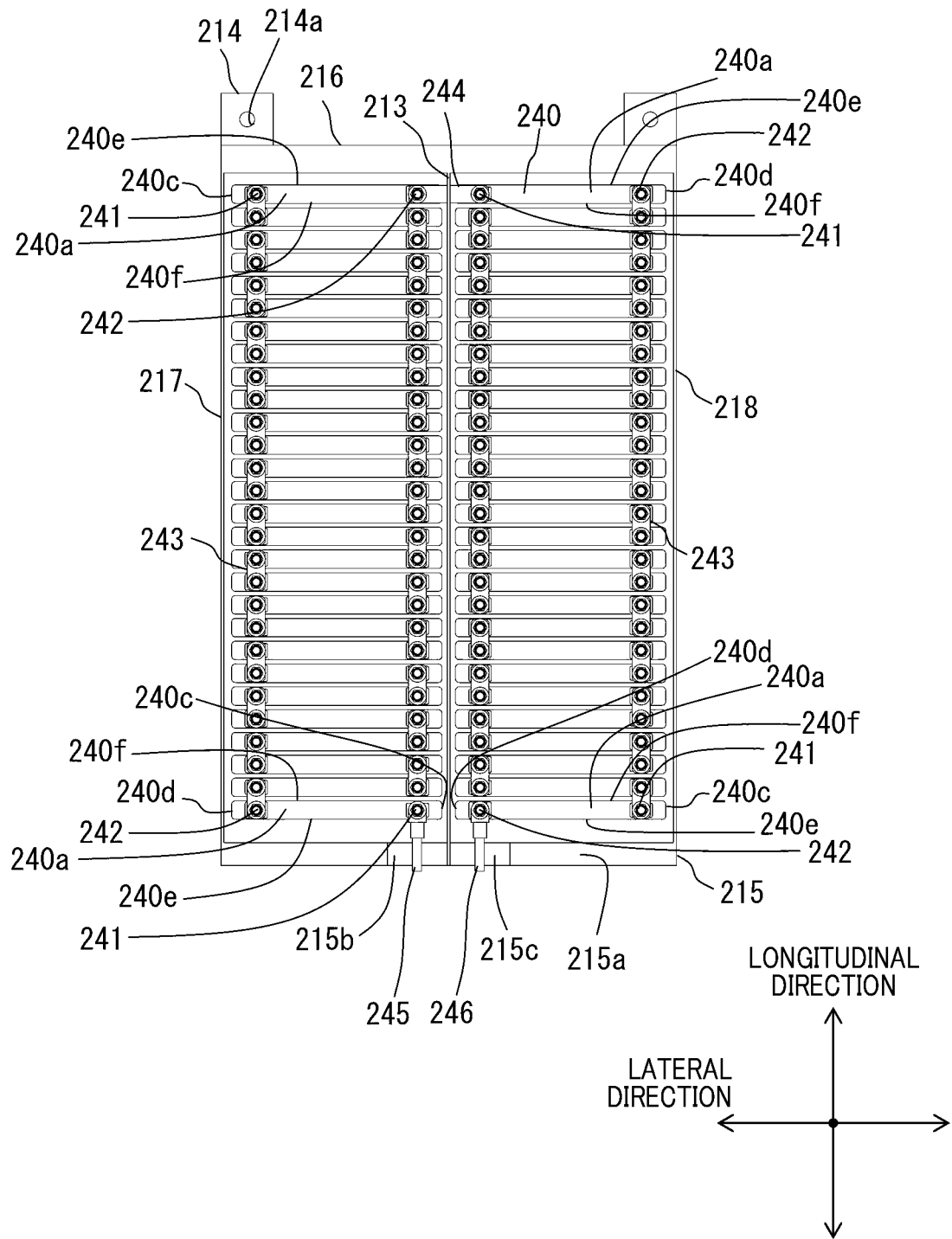
FIG. 10 is a top view of a battery module.

Further, as shown in FIG. 8, all of the positive electrode input/output terminal 245 and the negative electrode input/output terminal 246 may be accommodated in a storage space of the frame 210. Meanwhile, as shown in FIG. 10, respective portions of the positive electrode input/output terminal 245 and the negative electrode input/output terminal 246 may be disposed at the outside of the storage space of the frame 210.

One end of the positive electrode input/output terminal 245 is fixed to the positive electrode terminal 241 of the first numbered battery cell 240 of the first battery stack 231 by a bolt. In the same manner, one end of the negative electrode input/output terminal 246 is fixed to the negative electrode terminal 242 of the first numbered battery cell 240 of the second battery stack 232 by a bolt. The other end of the positive electrode input/output terminal 245 and the other end of the negative electrode input/output terminal 246, which are shown in FIG. 8, are respectively formed of cylindrical shapes that are opened in the longitudinal direction. Inner wall surfaces, with which hollow portions of the respective other ends of the positive electrode input/output terminal 245 and the negative electrode input/output terminal 246 are formed, are electrically connected to a bus bar 40, which will be described later, of the control module 100. Alternatively, outer wall surfaces of the respective other ends of the positive electrode input/output terminal 245 and the negative electrode input/output terminal 246 are electrically connected to the bus bar 40. As shown in FIG. 10, the respective other ends of the positive electrode input/output terminal 245 and the negative electrode input/output terminal 246 are formed of a pillar shape extending in the longitudinal direction. The outer wall surfaces of the respective other ends of the positive electrode input/output terminal 245 and the negative electrode input/output terminal 246 are electrically connected to the bus bar 40. With respect to the positive electrode input/output terminal 245 and the negative electrode input/output terminal 246, shapes of the respective other ends, which are electrically connected to the bus bar 40, may be a female-type of a concave shape or a male-type of a convex shape.

As shown in FIGS. 5 to 8, a first notch 215*b*, by which a positive electrode bus bar 41 of the control module 100, which will be described later, and the positive electrode input/output terminal 245 are electrically connected to each other at a height position of the upper end surface 240*a* of the battery cell 240, is formed on an upper surface 215*a* of the left wall 215. Further, a second notch 215*c*, by which a negative electrode bus bar 42 of the control module 100, which will be described later, and the negative electrode input/output terminal 246 are electrically connected to each other, is formed on the upper surface 215*a* thereof.

Further, a partition is provided between the first notch 215*b* and the second notch 215*c* in the exemplary embodiment of the present disclosure. Accordingly, a first storage space and a second storage space are separated in the first notch 215*b* and the second notch 215*c*. Therefore, when the first notch 215*b* and the second notch 215*c* are not blocked and closed, wind flowing inside the first storage space and wind flowing inside the second storage space are suppressed from being mixed in the first notch 215*b* and the second notch 215*c*. Additionally, the partition may not be provided between the first notch 215*b* and the second notch 215*c*, such that the first notch 215*b* and the second notch 215*c* are formed to be continuously connected to each other.

At least one of the respective portions of the positive electrode bus bar 41 and the negative electrode input/output terminal 245 is provided at the first notch 215*b*. At least one of the respective portions of the negative electrode bus bar 42 and the negative electrode input/output terminal 246 is provided at the second notch 215*c*. As shown in FIG. 8, when all of the positive electrode input/output terminals 245 and the negative electrode input/output terminals 246 are accommodated in the storage space of the frame 210, a portion of the positive electrode bus bar 41 is provided at the first notch 215*b*. Further, a portion of the negative electrode bus bar 42 is provided at the second notch 215*c*. As shown in FIG. 10, when the respective portions of the positive electrode input/output terminal 245 and the negative electrode input/output terminal 246 are disposed at the outside of the storage space of the frame 210, the respective portions of the positive electrode bus bar 41 and the negative electrode input/output terminal 245 are provided at the first notch 215*b*. Further, the respective portions of the negative electrode bus bar 42 and the negative electrode input/output terminal 246 are provided at the second notch 215*c*. Meanwhile, based upon the configuration shown in FIG. 10, the portion of the positive electrode input/output terminal 245 may be provided at the first notch 215*b*, and the portion of the negative electrode input/output terminal 246 may be provided at the second notch 215*c*.

Additionally, a portion of the internal wire 110 that connects an internal connector 81 of the battery ECU 32, which will be described later, and the connector of the monitoring unit 250 may be respectively provided in the first notch 215*b* and the second notch 215*c* in such a manner that the portion of the internal wire 110 contacts a wall surface by which the first notch 215*b* and the second notch 215*c* are divided. Further, separately from the first notch 215*b* and the second notch 215*c*, a through-hole and a notch exclusively provided for the internal wire 110 may be formed on the left wall 215. Accordingly, positioning of the internal wire 110 and vibration thereof are suppressed. As a result, it is advantageously possible to suppress electrical connection reliability between the battery ECU 32 and the monitoring unit 250 from deteriorating.

The bottom wall 211 is provided with a support part (not shown) supporting the battery stack 230 on the bottom wall 211. The support part extends in the longitudinal direction. With respect to the support part, a mounting surface, on which the battery stack 230 is mounted, is more closely disposed at a side of the opening part of the frame 210 than the bottom surface 211*a* in the height direction. Therefore, as shown in FIG. 9, a space in accordance with a height of the support part is provided between the lower end surface 240*b* of the battery cell 240 with which the battery stack 230 is formed, and the bottom surface 211*a* of the bottom wall 211. The support part and the battery cell 240 partly contact each other. Accordingly, the space is divided by the support part, the lower end surface 240*b* of the battery cell 240, the partition wall 213, and the side wall 212. Mainly, wind flows through the space. Hereinafter, the space is referred to as a ventilation space.

Two ventilation spaces are provided in the storage space. One of the two ventilation spaces is disposed in the first storage space, and a portion thereof is formed by the battery cell 240 of the first battery stack 231. The other of the two ventilation spaces is disposed in the second storage space, and a portion thereof is formed by the battery second stack 232. Hereinafter, a ventilation space corresponding to the first battery stack 232 is referred to as a first ventilation space. A ventilation space corresponding to the second battery stack 232 is referred to as a second ventilation space.

A height of a mounting surface of the support part may be defined or not be defined with respect to the longitudinal direction. For example, the height of the mounting surface may be gradually lowered towards a direction from the left wall 215 to the right wall 216. In this case, a separation distance between the respective lower end surfaces 240b of the plurality of battery cells 240 and the respective bottom surfaces 211a thereof gradually becomes short towards the direction from the left wall 215 to the right wall 216. Accordingly, an area (flow area) orthogonal to the first ventilation space and the second ventilation space in the longitudinal direction gradually become narrow towards the direction from the left wall 215 to the right wall 216. In other words, the area (flow area) orthogonal to the first ventilation space and the second ventilation space in the longitudinal direction gradually become wide towards the direction from the right wall 216 to the left wall 215. Accordingly, air resistance that flows in the longitudinal direction in the first ventilation space and the second ventilation space gradually becomes lowered towards the direction from the right wall 216 to the left wall 215. Air that flows into the first ventilation space and the second ventilation space from the opening part formed at the side of the right wall 216 is easy to flow in the direction from the right wall 216 to the left wall 215.

Figure 5:
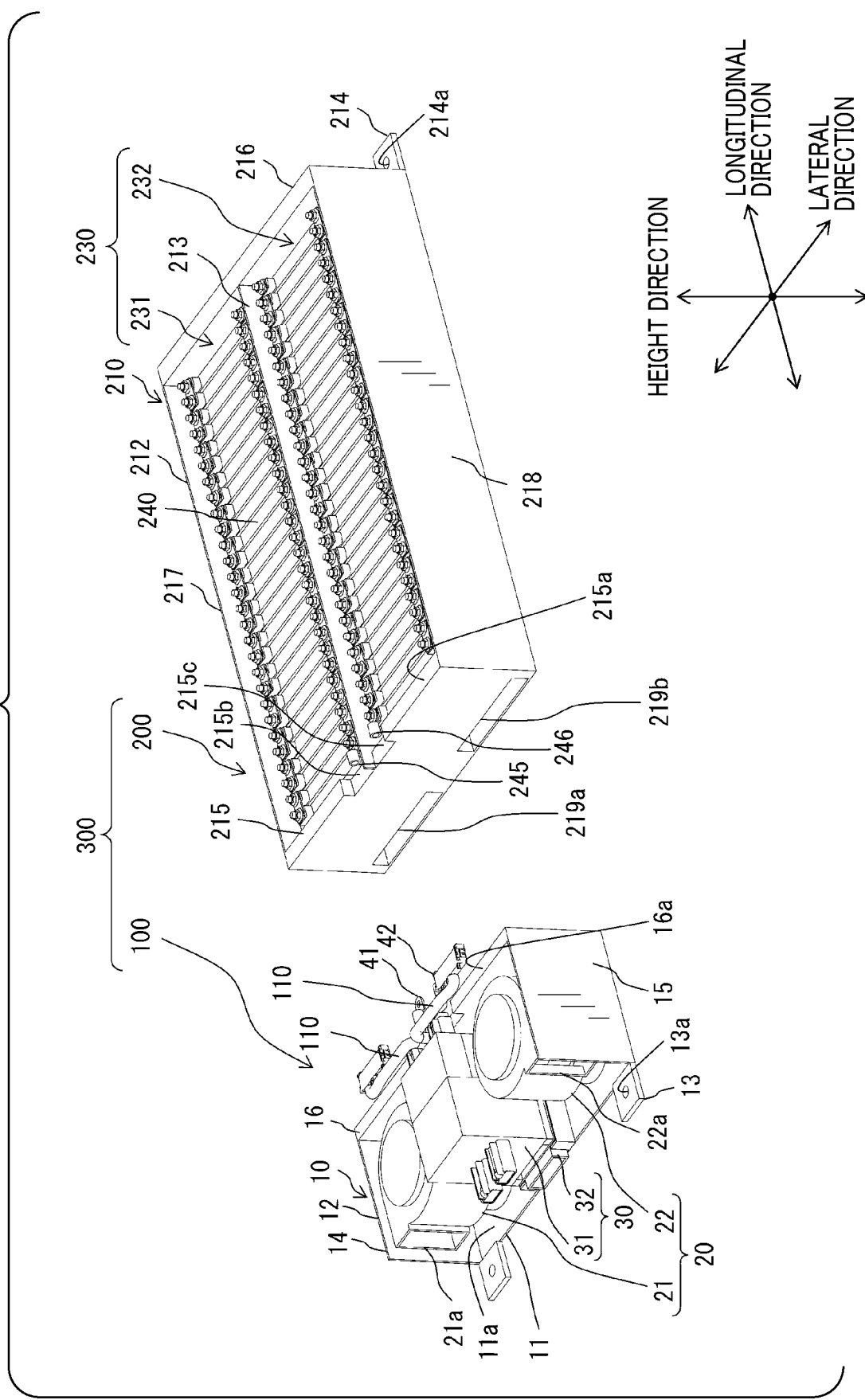
FIG. 5 is an exploded perspective view of the battery pack.

As shown in FIGS. 5, 6, and 9, a first ventilation hole 219a communicating with the first ventilation space is formed on the left wall 215. Further, a second ventilation hole 219b communicating with the second ventilation space is formed on the left wall 215. The first ventilation hole 219a and second ventilation hole 219b are respectively formed at a lower end part of the bottom wall 211 of the left wall 215. Accordingly, the first ventilation hole 219a and the second ventilation hole 219b are respectively separated from the first notch 215b and the second notch 215c. Additionally, the first ventilation hole 219a and the second ventilation hole 219b are separated and arranged in the lateral direction. Respective portions of the first notch 215b and the second notch 215c are disposed at an upper portion between the first ventilation hole 219a and the second ventilation hole 219b. Further, all portions of the first notch 215b and the second notch 215c may be disposed at the upper portion between the first ventilation hole 219a and the second ventilation hole 219b. The first ventilation hole 219a and the second ventilation hole 219b correspond to battery-side ventilation holes.

(Control Module Overview)

Figure 11:
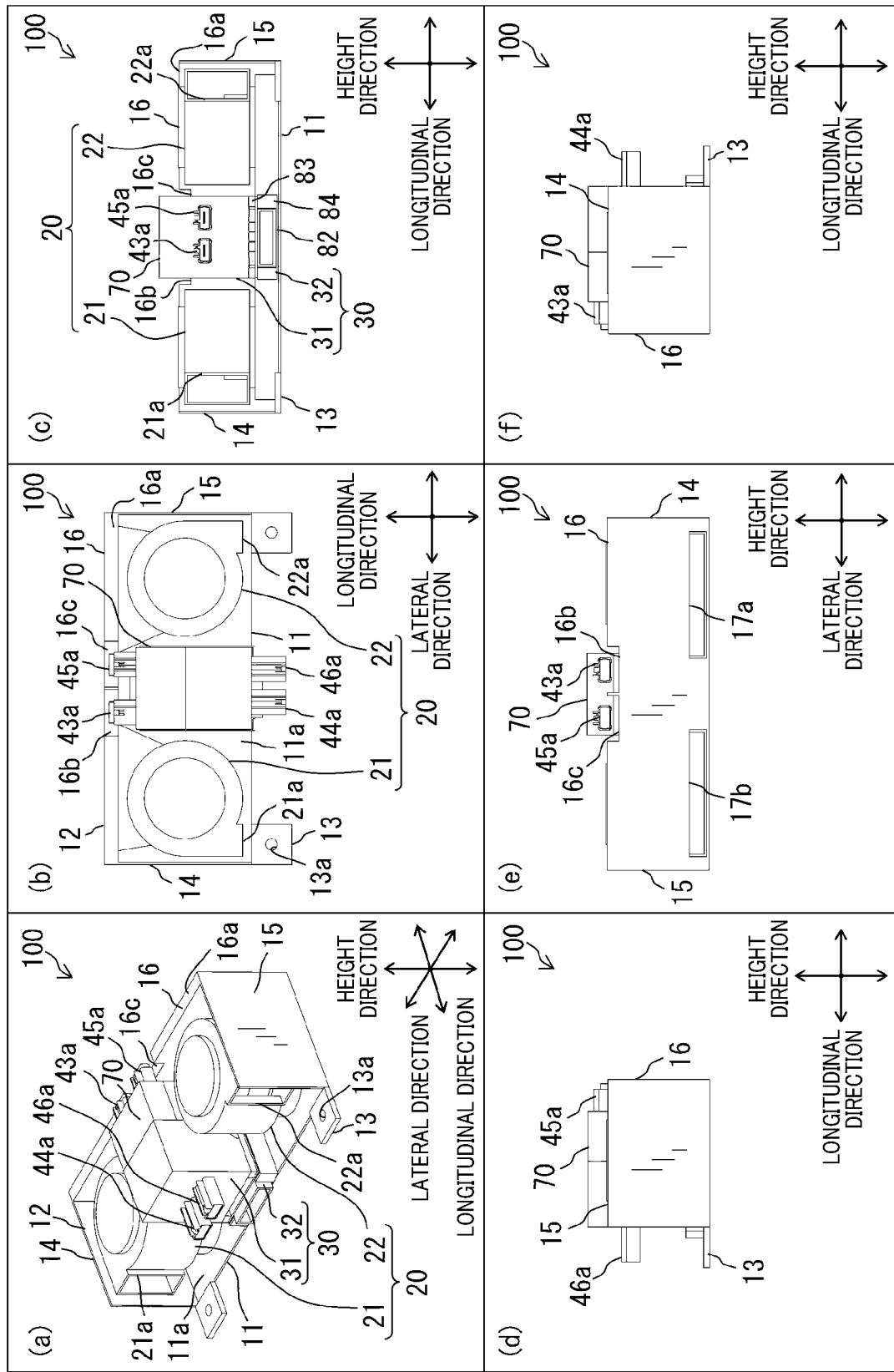
FIG. 11 shows, in its parts (a) to (f), drawings illustrating an outer shape of a control module.

Hereinafter, the control module 100 will now be described. As shown in FIG. 11, the control module 100 includes a connecting frame 10, a fan 20, and a control unit 30. The connecting frame 10 is connected to the frame 210. The fan 20 and the control unit 30 are provided in the connecting frame 10. The fan guides wind into the first ventilation space and the second ventilation space. Accordingly, the fan 20 cools the respective plurality of batter cells 240. The control unit 30 controls an electrical connection between the battery module 200 and the electric load 400. The control unit 30 controls driving of the fan 20. Further, the control unit 30 instructs the monitoring unit 250 to perform the equalization process with respect to the plurality of battery cells 240 of the battery module 200.

FIG. 11, in its part (a), illustrates a perspective view of the control module 100. FIG. 11, in its part (b), illustrates a top view of the control module 100. FIG. 11, in its part (c), illustrates a front view of the control module 100. FIG. 11, in its part (d), illustrates a left lateral view of the control module 100. FIG. 11, in its part (e), illustrates a back view of the control module 100. FIG. 11, in its part (f), illustrates a right lateral view of the control module 100.

Figure 12:
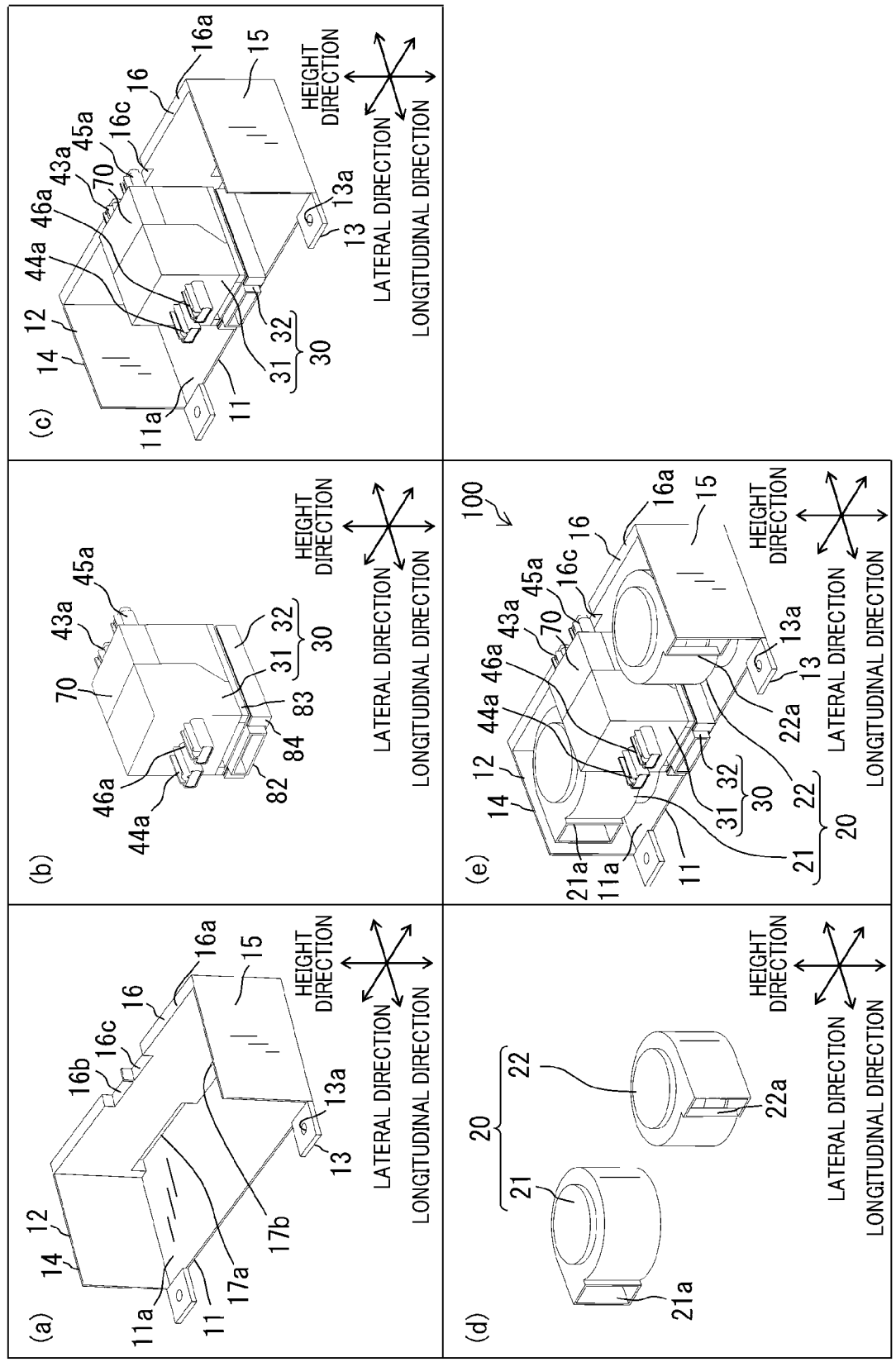
FIG. 12 shows, in its parts (a) to (e), drawings illustrating an assembly process of the control module.

As shown in parts (a) to (e) of FIG. 12, the control module 100 is assembled. That is, as shown in the parts (a) and (b) of FIG. 12, the connecting frame 10 and the control unit 30 are first prepared. As shown in the part (c) of FIG. 12, the control unit 30 is provided in the connecting frame 10. More specifically, the control unit 30 is provided at a center of a mounting wall 11 of the connecting frame 10. After that, the control unit 30 and the battery module 200 are electrically connected to each other.

Next, as shown in the part (d) of FIG. 12, a first fan 21 and a second fan 22 are prepared. As shown in the part (e) of FIG. 12, the first fan 21 and the second fan 22 are provided in the connecting frame 10. More specifically, the first fan 21 is provided between a front lateral wall 14, which will be described later, and the control unit 30 on a mounting wall 11. The second fan 22 is provided between a rear lateral wall 15 and the control unit 30 on the mounting wall 11. Finally, the respective first fan 21 and second fan 22 are electrically connected to the control unit 30 by means of a wire 23 shown in FIG. 1. In this way, the control unit 30 is assembled. Further, alternately, the first fan 21 and the second fan 22 are first provided on the mounting wall 11, after which the control unit 30 may be provided between the first fan 21 and the second fan 22 on the mounting wall 11. Hereinafter, component elements will now be individually described in detail.

(Configuration of Control Module)

The connecting frame 10 is made of aluminum. The connecting frame 10 is produced by aluminum die-cast. As shown in FIGS. 6 and 7, the connecting frame 10 has the mounting wall 11 and a surrounding wall 12. The mounting wall 11 forms a long rectangle in the lateral direction on the defined plane. Also, as shown in FIGS. 2 to 9 and 11a, a rib 13 for bolting the battery module 200 to the body of the hybrid vehicle is formed is formed on the mounting wall 11. In the exemplary embodiment, the two ribs 13 are formed on the mounting wall 11. The two ribs 13 are separated from the battery module 200 of the mounting wall 11 and formed in edge portions along the lateral direction. The two ribs 13 are arranged in the lateral direction. The respective ribs 13 are provided with bolt holes 13a through which the bolts pass. The connecting frame 10 corresponds to a mounting part.

The surrounding wall 21 includes the front lateral wall 14, the rear lateral wall 15, and a connecting wall 16. The front lateral wall 14 and the rear lateral wall 15 are respectively formed of long rectangles in the longitudinal direction on the longitudinal plane. The front lateral 14 and the rear lateral wall 15 are separated from each other and arranged in the lateral direction and are opposite to each other. The connecting wall 16 is formed of a long rectangle in the lateral direction on the lateral plane. The connecting wall 16 is disposed at a side of the battery module 200 on the mounting wall 11. The connecting wall 16 is disposed between the front lateral wall 14 and the rear lateral wall 15, and connect the front lateral wall 14 and the rear lateral wall 15. The front lateral wall 14, the connecting wall 16, and the rear lateral wall 15 are circumferentially arranged in order, and connected to each other therebetween. The front lateral wall 14, the connecting wall 16, and the rear lateral wall 15 are respectively connected at edge portions of a bottom surface 11a of the mounting wall 11.

As shown in FIG. 7, the connecting wall 16 and the left wall 215 are arranged in the longitudinal direction. Respective outer surfaces of the connecting wall 16 and the left wall 215 facing in the lateral direction contact each other. The connecting wall 16 and the left wall 215 are mechanically connected to each other.

The connecting wall 16 is formed in accordance with a shape of the left wall 215. As shown in FIG. 6, the first notch 215b, the second notch 215c, the first ventilation hole 219a, and the second ventilation hole 219b are formed on the left wall 215. Meanwhile, as shown in FIG. 13, a third notch 16b, a fourth notch 16c, a third ventilation hole 17a, and a fourth ventilation hole 17b are formed on the connecting wall 16. Further, if an excessive influence is not exerted with respect to cooling of the battery stack 230, positions of the height directions of the four notches and positions of the lateral directions thereof are not limited particularly.

The third notch 16b and the fourth notch 16c are formed on an upper surface 16a of the connecting wall 16. As shown in FIGS. 6 and 7, the third notch 16b and the first notch 215b are arranged in the longitudinal direction. The fourth notch 16c and the second notch 215c are arranged in the longitudinal direction. Accordingly, at least one of the respective portions of the positive electrode bus bar 41 and the positive electrode input/output terminal 245 is provided at the third notch 16b. Additionally, at least one of the respective portions of the negative electrode bus bar 42 and the negative electrode input/output terminal 246 is provided at the fourth notch 16c.

In this exemplary embodiment, there exists a partition between the third notch 16b and the fourth notch 16c. Thus, when the third notch 16b and the fourth notch 16c are not blocked and closed, the wind flowing inside the first storage space and the wind flowing inside the second storage space are suppressed from being mixed in the third notch 16b and the fourth notch 16c. However, the partition may not be formed between the third notch 16b and the fourth notch 16c, such that the third notch 16b and the fourth notch 16c are formed to be continuously connected to each other.

Further, a portion of the internal wire 110 may be respectively provided in the third notch 16b and the fourth notch 16c in such a manner that the portion of the internal wire 110 contacts a wall surface by which the third notch 16b and the fourth notch 16c are divided. Further, separately from the third notch 16b and the fourth notch 16c, a through-hole and a notch exclusively provided for the internal wire 110 may be formed on the connecting wall 16. Accordingly, positioning of the internal wire 110 and vibration thereof are suppressed. As a result, it is advantageously possible to suppress electrical connection reliability between the battery ECU 32 and the monitoring unit 250 from deteriorating.

The third ventilation hole 17a and the fourth ventilation hole 17b are formed at a lower end part of the mounting wall 11 of the connecting wall 16. The third ventilation hole 17a and the first ventilation hole 219a are arranged in the longitudinal direction. Accordingly, the third ventilation hole 17a and the first ventilation hole 219a are communicated with each other. Thus, the third ventilation hole 17a and the first ventilation space are communicated with each other via the first ventilation hole 219a. In the same manner, the fourth ventilation hole 17b and the second ventilation 219b are arranged in the longitudinal direction. Accordingly, the fourth ventilation hole 17b and the second ventilation hole 219b are communicated with each other. Thus, the fourth ventilation hole 17b and the second ventilation space are communicated with each other via the second ventilation hole 219b. Communication between the fourth ventilation hole 17b and the second ventilation space via the second ventilation hole 219b is shown in FIG. 9. The third ventilation hole 17a and the fourth ventilation hole 17b correspond to control-side ventilation holes.

As shown in FIG. 13, the third ventilation hole 17a and the fourth ventilation hole 17b are respectively separated from the third notch 16b and the fourth notch 16c in the height direction. Further, respective portions of the third notch 16b and the fourth notch 16c are disposed at an upper portion between the first ventilation hole 219a and the second ventilation hole 219b in the lateral direction. Additionally, as shown in FIG. 13 with broken lines, the control unit 30 is disposed between the third ventilation hole 17a and the fourth ventilation hole 17b in the lateral direction. The control unit 30 is respectively arranged with the third notch 16b and the fourth notch 16c contributing to an electrical connection to the battery module 200 in the longitudinal direction.

The fan includes the first fan 21 corresponding to the first battery stack 231 and the second fan 21 corresponding to the second battery stack 232. As shown in FIG. 11, the first fan 21 corresponding to the first battery stack 231 are provided on the mounting wall 11. The first fan 21 is arranged with the first battery stack 231 via the mounting wall 11 in the longitudinal direction. The second fan 22 is arranged with the second battery stack 232 via the mounting wall 11 in the longitudinal direction.

The first fan 21 and the second fan 22 are separated from each other and arranged in the lateral direction. The first fan 21 is disposed at a side of the front lateral wall 14. The second fan 22 is disposed at a side of the rear lateral wall 15. The control unit 30 is disposed between the first fan 21 and the second fan 22.

The first fan 21 and the second fan 22 respectively include a suction inlet for sucking wind. When the first fan 21 is provided in the connecting frame 10, the suction inlet of the first fan 21 is connected to the third ventilation hole 17a of the connecting wall 16. In the same manner, when the second fan 22 is provided in the connecting frame 10, the suction inlet of the second fan 22 is connected to the fourth ventilation hole 17b of the connecting wall 16.

The first fan 21 includes a first sweep-out outlet 21a for discharging the wind. The first sweep-out outlet 21a is opened to a side that is opposite to the connecting wall 16 in the longitudinal direction. Further, the first sweep-out outlet 21a is more separated from the mounting wall 11 than the suction inlet in the height direction.

In the same manner, the second fan 22 includes a second sweep-out outlet 22a for discharging wind. The second sweep-out outlet 22a is opened to a side that is opposite to the connecting wall 16 in the longitudinal direction. Further, the second sweep-out outlet 22a is more separated from the mounting wall 11 than the suction inlet in the height direction.

According to the configuration described above, when the first fan 21 starts spinning and sucking air, wind flows in a direction from the right wall 216 to the left wall 215 in the first ventilation space. At this time, the wind also flows in a direction of the first ventilation space in the height direction in gaps between neighboring battery cells 240. The wind is sucked into the first fan 21 via the first ventilation hole 219a and the third ventilation hole 17a. The first fan 21 discharges the sucked wind in a direction far away from the first sweep-out outlet 21a and the battery module 200. Accordingly, the first battery stack 231 is cooled.

In the same manner, when the second fan 22 starts spinning and sucking air, wind flows in a direction from the right wall 216 to the left wall 215 in the second ventilation space. At this time, the wind also flows in a direction of the second ventilation space in the height direction in gaps between neighboring battery cells 240. The wind is sucked into the second fan 22 via the second ventilation hole 219*b* and the fourth ventilation hole 17*b*. The second fan 22 discharges the sucked wind in a direction far away from the second sweep-out outlet 22*a* and the battery module 200. Accordingly, the second battery stack 231 is cooled.

Additionally, as shown in FIGS. 11(*a*) and 11(*b*), the first sweep-out outlet 21*a* and the second sweep-out outlet 22*a* are arranged in the lateral direction. The first sweep-out outlet 21*a* is disposed at the side of the front lateral wall 14, and is arranged with one of the two ribs 13 in the longitudinal direction. The second sweep-out outlet 22*a* is disposed at the side of the rear lateral wall 15, and is arranged with the other of the two ribs 13 in the longitudinal direction. As described above, the first sweep-out outlet 21*a* and the second sweep-out outlet 22*a* are disposed away from the control unit 30 as far as possible in the lateral direction. Therefore, it is advantageously possible to suppress air that is discharged from the first sweep-out outlet 21*a* and the second sweep-out outlet 22*a* from raising a temperature of the control unit 30.

Further, as shown the part (c) of FIG. 11, the first sweep-out outlet 21*a* and the second sweep-out outlet 22*a* are arranged with an element unit 31 of the control unit 30, which will be described later, in the lateral direction. The first sweep-out outlet 21*a* and the second sweep-out outlet 22*a* are disposed away from the battery ECU 32 of the control unit 30, which will be described later, in the height direction. The battery ECU 32 is arranged with a portion at which the respective inlets of the first fan 21 and the second fan 22 are provided in the lateral direction. Therefore, it is advantageously possible to suppress the air that is discharged from the first sweep-out outlet 21*a* and the second sweep-out outlet 22*a* from interfering with the battery ECU 32.

(Control Unit Overview)

Figure 14:
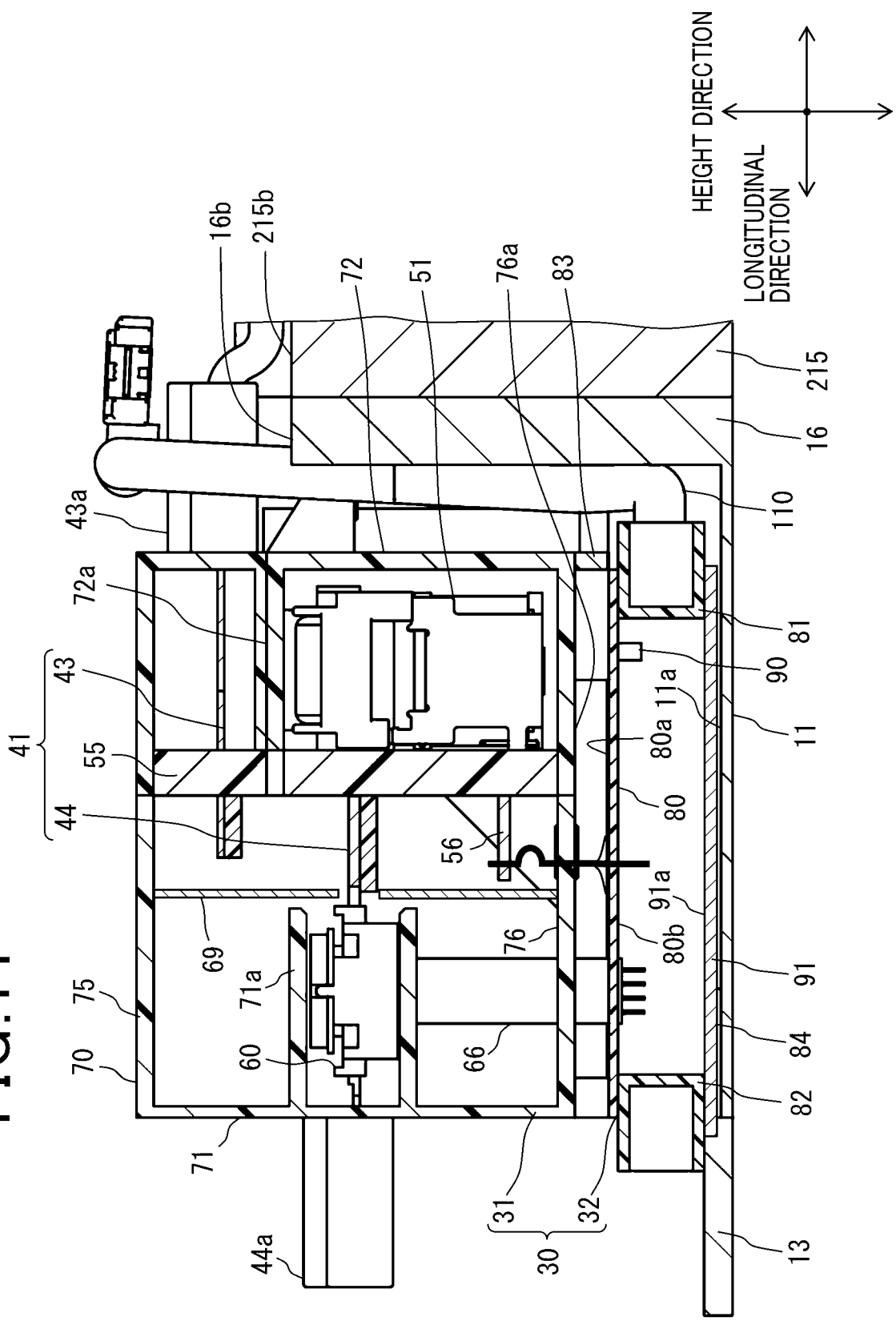
FIG. 14 is an enlarged cross-sectional view of a region "A" surrounded by broken lines shown in FIG. 4.

Hereinafter, the control unit 30 will now be described in detail. As shown in FIGS. 11 and 12, the control unit 30 includes the element unit 31 and the battery ECU 32. As shown in FIG. 14, the element unit 31 includes the bus bar 40, the system main relay 50, a current sensor 60, case 70, and a case 70. The ECU 32 includes a control substrate 80, an internal connector 81, an external connector 82, a spacer 83, and a control cover 84. The battery ECU 32 corresponds to a control unit.

A portion of the bus bar 40, the system main relay 50, the current sensor 60, and the shielding part 69 (which corresponds to a first shielding part) are accommodated in the case 70. The control substrate 80, the internal connector 81, and the external connector 82 are assembled via the spacer 83 in the case 70, and the control cover 84 is assembled to the case 70.

(Element Unit Configuration)

Figure 15:
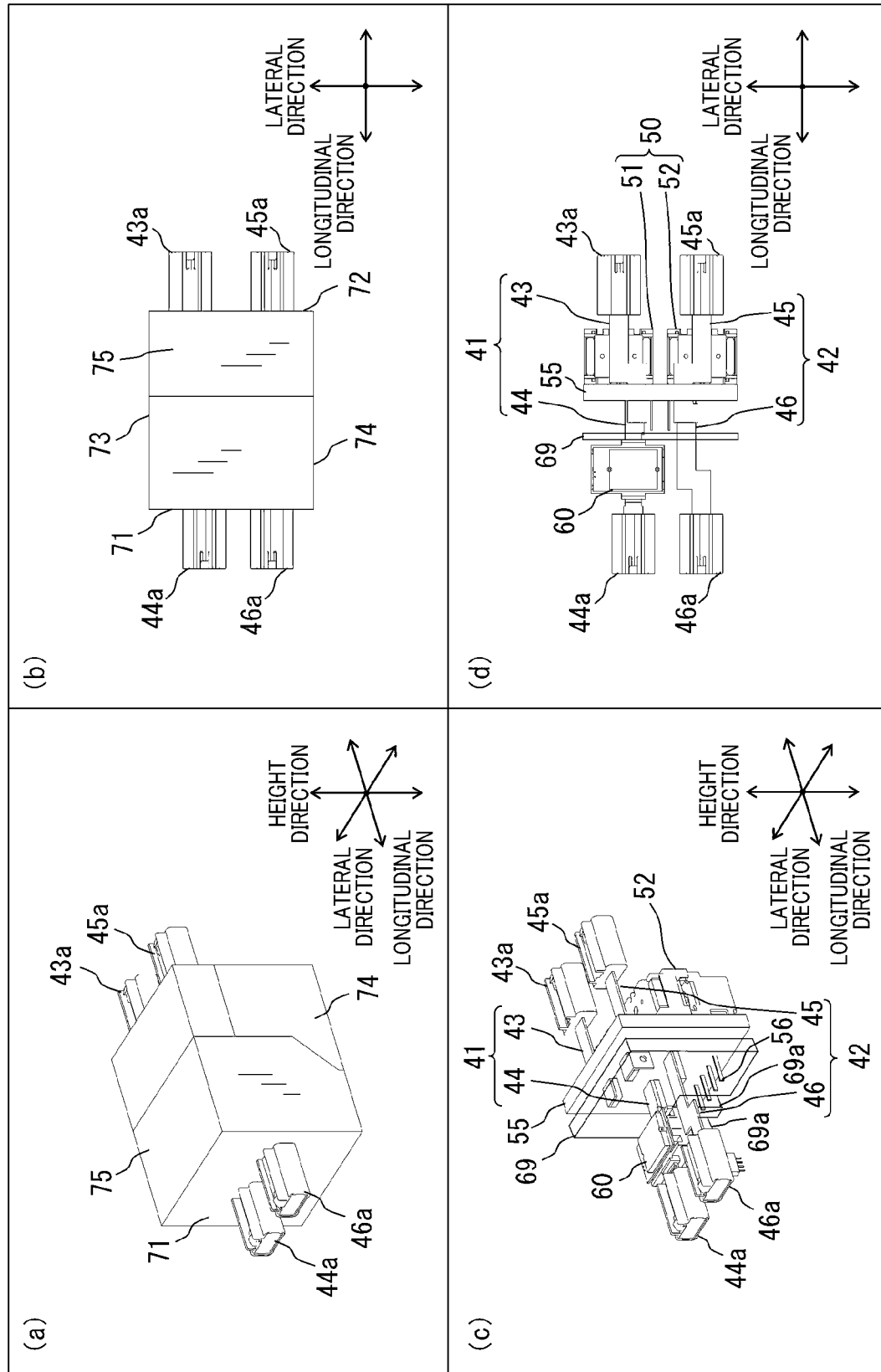
FIG. 15 shows, in its parts (a) to (d), drawings illustrating an element unit.
Figure 16:
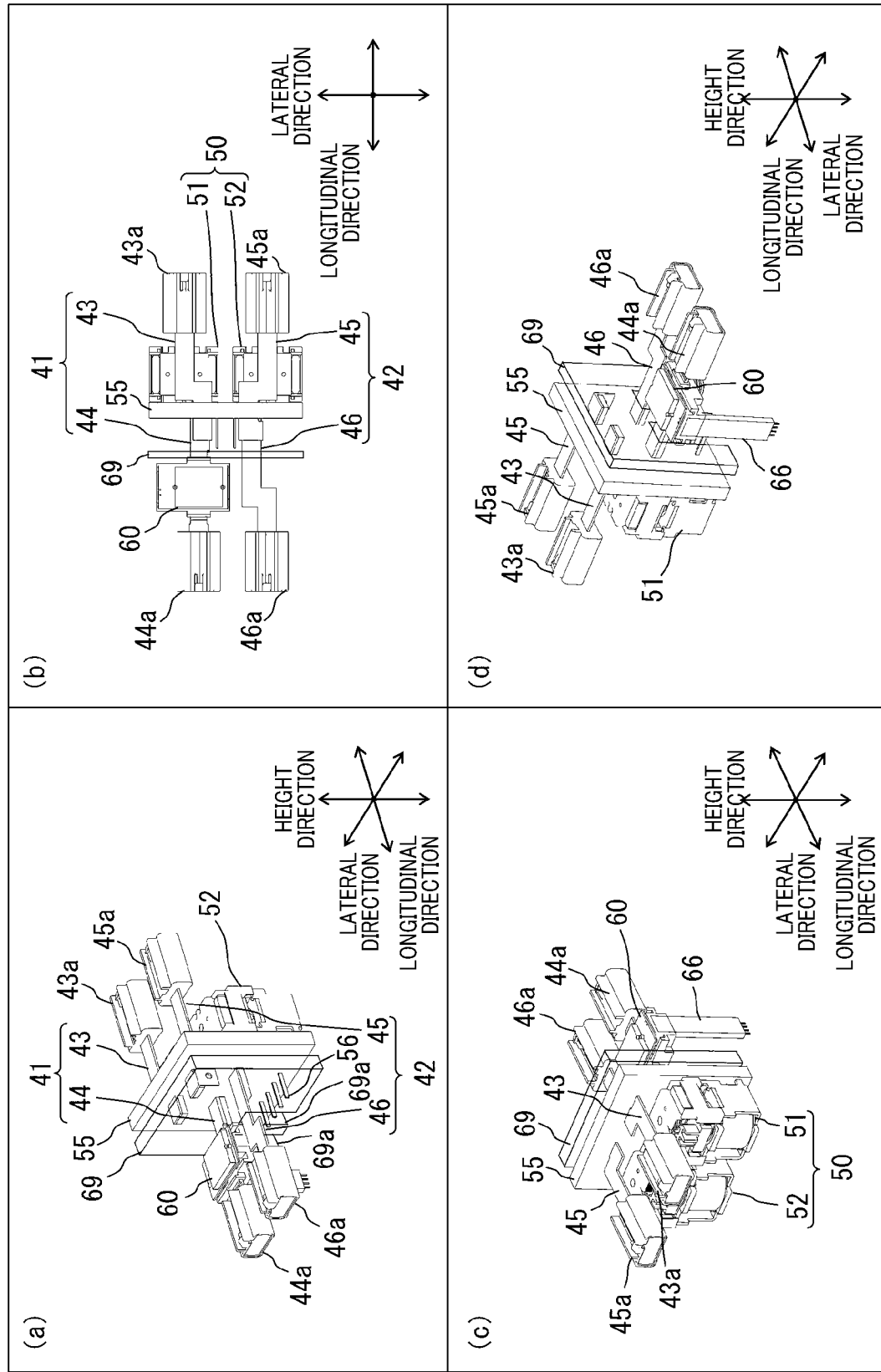
FIG. 16 shows, in its parts (a) to (d), drawings illustrating the element unit.

As shown in FIGS. 15 and 16, the bus bar 40 includes the positive electrode bus bar 41 and the negative electrode bus bar 42. The positive electrode bus bar 41 includes an internal positive electrode bus bar 43 and an external positive electrode external bus bar 44. The negative electrode bus bar 42 includes an internal negative electrode bus bar 45 and an external negative electrode bus bar 46. The internal positive electrode bus bar 43 is connected to the positive electrode input/output terminal 245 of the battery module 200. The internal negative electrode bus bar 45 is connected to the negative electrode input/output terminal 246 of the battery module 200. The external positive electrode bus bar 44 and the external negative electrode bus bar 46 are respectively connected to the electric load 400. Further, parts (c) and (d) of FIG. 15 are the same as parts (a) and (b) of FIG. 16 so as to show an external structure and an internal structure in FIG. 15 and also to show details of the internal structure in FIG. 16.

As shown in FIG. 16, the internal positive electrode bus bar 43 and the internal negative electrode bus bar 45 respectively extend in the longitudinal direction. The internal positive electrode bus bar 43 and the internal negative electrode bus bar 45 are arranged in the lateral direction. The respective internal positive electrode bus bar 43 and the internal negative electrode bus bar 45 are more separated from the mounting wall 11 than the external positive electrode bus bar 44 and the external negative electrode bus bar 46 in the height direction. That is, the internal positive electrode bus bar 43 and the internal negative electrode bus bar 45 are respectively disposed at the side of the upper end surface 240*a* of the battery cell 240 in the height direction, higher than the external positive electrode bus bar 44 and the external negative electrode bus bar 46.

An end part (one end) of the internal positive electrode bus bar 43 facing the side of the battery module 200 is provided on the third notch 16*b*. An end part (one end) of the internal negative electrode bus bar 45 facing the side of the battery module 200 is provided on the fourth notch 16*c*. The positive electrode input/output terminal 245 is connected to the one end of the internal positive electrode bus bar 43. The negative electrode input/output terminal 246 is connected to the one end of the internal negative electrode bus bar 45.

An internal positive electrode housing 43*a* for being connected to the positive electrode input/output terminal 245 is provided at the one end of the internal positive electrode bus bar 43. An internal negative electrode housing 45*a* for being connected to the negative electrode input/output terminal 246 is provided at the one end of the internal negative electrode bus bar 45.

The internal positive electrode housing 43*a* and the internal negative electrode housing 45*a* are respectively opened to the side of the battery module 200 in the longitudinal direction, and has a cylindrical shape having a bottom on an opposite side thereof. Holes are respectively provided at the bottom of the internal positive electrode housing 43*a* and the internal negative electrode housing 45*a*. The one end of the internal positive electrode bus bar 43 is inserted into the hole at the bottom of the internal positive electrode housing 43*a*. Accordingly, the one end of the internal positive electrode bus bar 43 is surrounded by the internal positive electrode housing 43*a*. The positive electrode input/output terminal 245 is inserted into a hollow portion of the internal positive electrode housing 43*a*. Accordingly, the internal positive electrode bus bar 43 and the positive electrode input/output terminal 245 are electrically connected to each other in the hollow portion of the internal positive electrode housing 43*a*.

In the same manner, the one end of the internal negative electrode bus bar 45 is inserted into the hole at the bottom of the internal negative electrode housing 45*a*. Accordingly, the one end of the internal negative electrode bus bar 45 is surrounded by the internal negative electrode housing 45*a*. The negative electrode input/output terminal 246 is inserted into a hollow portion of the internal negative electrode housing 45*a*. Accordingly, the internal negative electrode bus bar 45 and the negative electrode input/output terminal 246 are electrically connected to each other in the hollow portion of the internal negative electrode housing 45*a*.

As shown in FIG. 16, the external positive electrode bus bar 44 and the external negative electrode bus bar 46 respectively extend in the longitudinal direction. The external positive electrode bus bar 44 and the external negative electrode bus bar 46 are arranged in the lateral direction. The external positive electrode bus bar 44 and the external negative electrode bus bar 46 are respectively disposed at a side of the mounting wall 11 in the height direction, lower than the internal positive electrode bus bar 43 and the internal negative electrode bus bar 45. That is, the external positive electrode bus bar 44 and the external negative electrode bus bar 46 are respectively disposed at the side of the lower end surface 240b of the battery cell 240 in the height direction, lower than the internal positive electrode bus bar 43 and the internal negative electrode bus bar 45.

An end part (one end) of the external positive electrode bus bar 44 facing the side of the batter module 200, and the one end of the internal positive electrode bus bar 43 and the other end thereof, which is an opposite side of the one end thereof, are separated from each other in the height direction. An electrical connection between the one end of the external positive electrode bus bar 44 and the other end of the internal positive electrode bus bar 43 is controlled by the system main relay 50. The one end of the external positive electrode bus bar 44 and the other end thereof are electrically connected to the electric load 400.

In the same manner, an end part (one end) of the external negative electrode bus bar 46 facing the side of the batter module 200, and the one end of the internal negative electrode bus bar 45 and the other end thereof, which is an opposite side of the one end thereof, are separated from each other in the height direction. An electrical connection between the one end of the external negative electrode bus bar 46 and the other end of the internal negative electrode bus bar 45 is controlled by the system main relay 50. The one end of the external negative electrode bus bar 46 and the other end thereof are electrically connected to the electric load 400.

An external positive electrode housing 44a for being connected to a first wire harness 85a shown in FIG. 1 is provided at the other end of the external positive electrode bus bar 44. An external negative electrode housing 46a for being connected to the first wire harness 85a is provided at the other end of the external negative electrode bus bar 46.

The external positive electrode housing 44a and the external negative electrode housing 46a respectively include bottoms at the side of the battery module 200 in the longitudinal direction, and cylindrical shapes that are opened to opposite sides thereof. The external positive electrode housing 44a and the external negative electrode housing 46a respectively are provided with holes at the bottoms. The other end of the external positive electrode bus bar 44 is inserted into the hole at the bottom of the external positive electrode housing 44a. Accordingly, the other end of the external positive electrode bus bar 44 is surrounded by the external positive electrode housing 44a. The first wire harness 85a is inserted into a hollow portion of the external positive electrode housing 44a. Accordingly, the external positive electrode bus bar 44 and the first wire harness 85a are electrically connected to each other in the hollow portion of the external positive electrode housing 44a. The external positive electrode bus bar 44 and the electric load 400 are electrically connected to each other via the first wire harness 85a.

In the same manner, the other end of the external negative electrode bus bar 46 is inserted into the hole at the bottom of the external negative electrode housing 46a. Accordingly, the other end of the external negative electrode bus bar 46 is surrounded by the external negative electrode housing 46a. The first wire harness 85a is inserted into a hollow portion of the external negative electrode housing 46a. Accordingly, the external negative electrode bus bar 46 and the first wire harness 85a are electrically connected to each other in the hollow portion of the external negative electrode housing 46a. The external negative electrode bus bar 46 and the electric load 400 are electrically connected to each other via the first wire harness 85a.

The system main relay 50 includes a first switch 51 and a second switch 52. The first switch 51 and the second switch 52 respectively generate magnetic fields by electrical conduction, thereby controlling respective electrical connections between the positive electrode bus bar 41 and the negative electrode bus bar 42. The first switch 51 and the second switch 52 become open states during a non-conducting state, such that the positive electrode bus bar 41 and the negative electrode bus bar 42 cut off respective electrical connections. As a result, the external positive electrode bus bar 44 and the internal positive electrode bus bar 43 become disconnected to each other by the first switch 51. The external negative electrode bus bar 46 and the internal negative electrode bus bar 45 become disconnected to each other by the second switch 52. In other words, the electric load 400 and the internal positive electrode bus bar 43 become disconnected to each other by the first switch 51. The electrode 400 and the internal negative electrode bus bar 45 become disconnected to each other by the second switch 52.

Each of the first switch 51 and the second switch 52 has the same configuration. Hereinafter, the first switch 51 will now be described with reference to FIG. 17. Detailed descriptions of the second switch 52 will be omitted.

Figure 17:
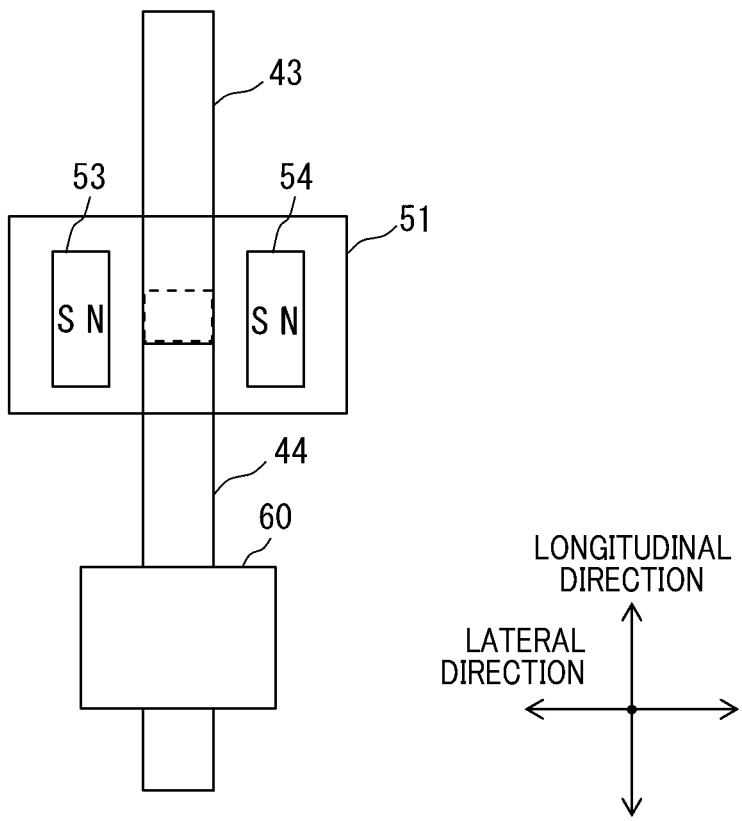
FIG. 17 is a schematic drawing illustrating a first switch.

The first switch 51 includes a first permanent magnet 53 and a second permanent magnet 54, shown in FIG. 17. Further, the first switch 51 and the second switch 52 include a holding part 55 in common, shown in FIGS. 15 and 16. Additionally, the first switch 51 includes a valve element (not shown), a connection electrode (not shown), a spring (not shown), an electromagnetic part (not shown), and a housing case (not shown). The first permanent magnet 53, the second permanent magnet 54, the valve element, the connection electrode, the spring, the electromagnetic part are accommodated in the housing case.

The connection electrode is provided in the valve element. The connection electrode is disposed between the other end of the internal positive electrode bus bar 43 and the one end of the external positive electrode bus bar 44 in the height direction. As the valve element moves, the connection electrode moves in the height direction. Accordingly, a separation distance between the connection electrode and the internal positive electrode bus bar 43, and the connection electrode and the external positive electrode bus bar 44 in the height direction changes depending on a movement of the valve element. The internal positive electrode bus bar 43 and the external positive electrode bus bar 44 are electrically connected to each other in such a manner that the connection electrode and the internal positive electrode bus bar 43 contact each other, and the connection electrode and the external positive electrode bus bar 44 contact each other.

In the case of the second switch 52, the connection electrode is disposed between the other end of the internal negative electrode bus bar 45 and the one end of the external negative electrode bus bar 46. Accordingly, the internal negative electrode bus bar 45 and the external negative electrode bus bar 46 are electrically connected to each other in such a manner that the connection electrode and the internal negative electrode bus bar 45 contact each other, and the connection electrode and the external negative electrode bus bar 46 contact each other.

The spring provides a biasing force (that is to say an urging force) in a direction, in which the connection electrode provided in the valve element and the internal positive electrode bus bar 43, and the connection electrode and the external positive electrode bus bar 44 move away each other in the height direction, to the valve element.

The electromagnetic part includes a solenoid coil, a yoke, and a movable core. The solenoid coil and an end part of the valve element are surrounded by the yoke. The movable core is attached to the valve element.

The solenoid coil is electrically connected to the battery ECU 32 via a switch connection terminal 56. The switch connection terminal 56 is connected to the battery ECU 32 with solder. When a current is supplied from the battery ECU 32 to the solenoid coil, the solenoid coil generates a magnetic field. The magnetic field forms a magnetic circuit passing through the yoke and the movable core. Accordingly, a magnetic force is generated in the movable core. The valve element moves against the biasing force of the spring by the magnetic force generated in the movable core. As a result, the connection electrode provided in the valve element and the internal positive electrode bus bar 43, and the connection electrode and the external positive electrode bus bar 44 mutually approach each other, thereby contacting each other. Accordingly, the connection electrode and the internal positive electrode bus bar 43, and the connection electrode and the external positive electrode bus bar 44 are electrically connected to each other. Therefore, the internal positive electrode bus bar 43 and the external positive electrode bus bar 44 are electrically connected to each other. In the case of the second switch 52, the internal negative electrode bus bar 45 and the external negative electrode bus bar 46 are electrically connected to each other.

Though unlikely, for example, a configuration in which the connection electrode provided in the valve element is always connected to the external positive electrode bus bar 44 may be adopted. In this case, a separation distance between the connection electrode and the internal positive electrode bus bar 43 changes depending on the movement of the valve element. The internal positive electrode bus bar 43 and the external positive electrode bus bar 44 are electrically connected to each other in such a manner that the connection electrode and the internal positive electrode bus bar 43 are connected to each other. In the case of the second switch 52, the internal negative electrode bus bar 45 and the external negative electrode bus bar 46 are electrically connected to each other in such a manner that the connection electrode and the internal negative electrode bus bar 45 are connected to each other.

The spring provides the biasing force in the direction, in which the connection electrode provided in the valve element and the internal positive electrode bus bar 43 move away each other, to the valve element. The valve element moves against the biasing force of the spring by magnetic force generated in the movable core by a current flow through the solenoid coil. As a result, the connection electrode provided in the valve element and the internal positive electrode bus bar 43 approach each other, thereby contacting each other. Accordingly, the connection electrode and the internal positive electrode bus bar 43 are electrically connected to each other. As a result, the internal positive electrode bus bar 43 and the external positive electrode bus bar 44 are electrically connected to each other. In the case of the second switch 52, the internal negative electrode bus bar 45 and the external negative electrode bus bar 46 are electrically connected to each other.

The first permanent magnet 53 and the second permanent magnet 54 are respectively connected to each other in such a manner that a N-pole thereof and a S-pole thereof are magnetized in the lateral direction. The first permanent magnet 53 and the second permanent magnet 54 have the same separation distance from the mounting wall 11 in the height direction. In other words, the first permanent magnet 53 and the second permanent magnet 54 have the same separation distance from the control substrate 80 in the height direction.

The first permanent magnet 53 and the second permanent magnet 54 are arranged in the lateral direction. The N-pole of the first permanent magnet 53 and the S-pole of the second permanent magnet 54 are opposite to each other in the lateral direction. Accordingly, a magnetic field along the defined plane is mainly formed at a height position of the first permanent magnet 53 and the second permanent magnet 54. The connection electrode, the other end of the internal positive electrode bus bar 43, and the one end of the external positive electrode bus bar 44 are disposed between the N-pole of the first permanent magnet 53 and the S-pole of the second permanent magnet 54. As shown in FIG. 17 with broken lines, the other end of the internal positive electrode bus bar 43 and the one end of the external positive electrode bus bar 44 are overlapped with each other in the height direction. In the case of the second switch 52, the connection electrode, the other end of the internal negative electrode bus bar 45, and the one end of the external negative electrode bus bar 46 are disposed between the N-pole of the first permanent magnet 53 and the S-pole of the second permanent magnet 54.

When the connection electrode respectively contacts the internal positive electrode bus bar 43 and the external positive electrode bus bar 44, currents respectively flow through the connection electrode and the internal positive electrode bus bar 43, and the connection electrode and the external positive electrode bus bar 44. In the aforementioned state, when the connection electrode is moved in the height direction such that the contact between the internal positive electrode bus bar 43 and the external positive electrode bus bar 44 is disconnected, discharge currents respectively flow through the connection electrode and the internal positive electrode bus bar 43, and the connection electrode and the external positive electrode bus bar 44.

A magnitude of the discharge current flowing through the connection electrode and the internal positive electrode bus bar 43 depends on a separation distance between the connection electrode and the internal positive electrode bus bar 43. A magnitude of the discharge current flowing through the connection electrode and the external positive electrode bus bar 44 depends on a separation distance between the connection electrode and the external positive electrode bus bar 44. Therefore, when the separation distance between the connection electrode and the positive electrode bus bar 43 is long, the discharge current becomes low. In contrast, when the separation distance between the connection electrode and the positive electrode bus bar 43 is short, the discharge current becomes high. A generation time of electromagnetic noise occurring when the discharge current is generated becomes long.

As described above, the connection electrode, the internal positive electrode bus bar 43 and the external positive electrode bus bar 44 are disposed between the N-pole of the first permanent magnet 53 and the S-pole of the second permanent magnet 54. Accordingly, the magnetic field along the defined plane passes through the connection electrode, the internal positive electrode bus bar 43, and the external positive electrode bus bar 44. The magnetic fields that are respectively generated by the first permanent magnet 53 and the second permanent magnet 54 are stronger than the magnetic field formed by the solenoid coil. Accordingly, when the discharge current flows through the connection electrode and the internal positive electrode bus bar 43, and the connection electrode and the external positive electrode bus bar 44 due to the movement of the connection electrode in the height direction, a flow of the discharge current is bent in a direction along the defined plane by the magnetic fields of the first permanent magnet 53 and the second permanent magnet 54. Therefore, a flow path between the connection electrode and the internal positive electrode bus bar 43 becomes longer than the separation distance between the connection electrode and the internal positive electrode bus bar 43 in the height direction. A flow path between the connection electrode and the external positive electrode bus bar 44 becomes longer than the separation distance between the connection electrode and the external positive electrode bus bar 44 in the height direction. As a result, resistance in the flow path increases and the discharge current becomes small, such that generation of electromagnetic noise is advantageously suppressed.

As described above, the first switch 51 and the second switch 52 have the holding part 55 in common. The holding part 55 determines positions of the bus bar 40 and the system main relay 50. The holding part 55 is made of a resin material. A shape of the holding part 55 is a rectangle in the lateral plane. The holding part 55 is disposed between the valve element, the connection electrode, the spring, the electromagnetic part, the first permanent magnet 53, and the second permanent magnet 54, and the current sensor 60 in the longitudinal direction. That is, the current sensor 60 is only disposed at an opposite side. The holding part 55 divides an internal space of the case 70 into two spaces. The valve element, the connection electrode, the spring, the first permanent magnet 53, and the second permanent magnet 54 are disposed in one of the two spaces. The current sensor 60 is disposed in the other of the two space. The holding part 55 is fixed to the case 70 by a screw, and the like.

A hole for the bus bar 40 and a hole for the solenoid coil are provided in the holding part 55. The holes are provided in the longitudinal direction. The holding part 55 is provided with internal insertion holes, into which the other ends of the internal positive electrode bus bar 43 and the internal negative bus bar 45 are pressed and inserted, and external insertion holes, into which the one ends of the external positive electrode bus bar 44 and the external negative electrode bus bar 46 are pressed and inserted, as the holes provided for the bus bar 40. The internal insertion holes are more separated from the mounting wall 11 than the external insertion holes in the height direction. The other ends of the internal positive electrode bus bar 43 and the internal negative electrode bus bar 45 are pressed and inserted into the internal insertion holes. The one ends of the external positive electrode bus bar 44 and the external negative electrode bus bar 46 are pressed and inserted into the external insertion holes. Accordingly, relative positions of the internal positive electrode bus bar 43 and the internal negative electrode bus bar 45, and the external positive electrode bus bar 44 and the external negative electrode bus bar 46 are determined by the internal and external insertion holes.

The holding part 55 is provided with a first insertion hole, into which a switch connection terminal 56 that is connected to a solenoid coil of the first switch 51 is pressed and inserted, as a hole for the solenoid coil. Further, the holding part 55 is provided with a second insertion hole, into which the switch connection terminal 56 that is connected to a solenoid coil of the second switch 52 is pressed and inserted. The switch connection terminal 56 is pressed and inserted into the first insertion hole and the second insertion hole. Accordingly, relative positions of the bus bar 40 and the system main relay 50 are determined by the first and second insertion holes. Additionally, as described above, the bus bar 40 and the switch connection terminal 56 may be pressed and inserted into the holding part 55, alternatively, the bus bar 40 and the switch connection terminal 56 may be insert molded into the hole of the holding part 55.

Figure 18:
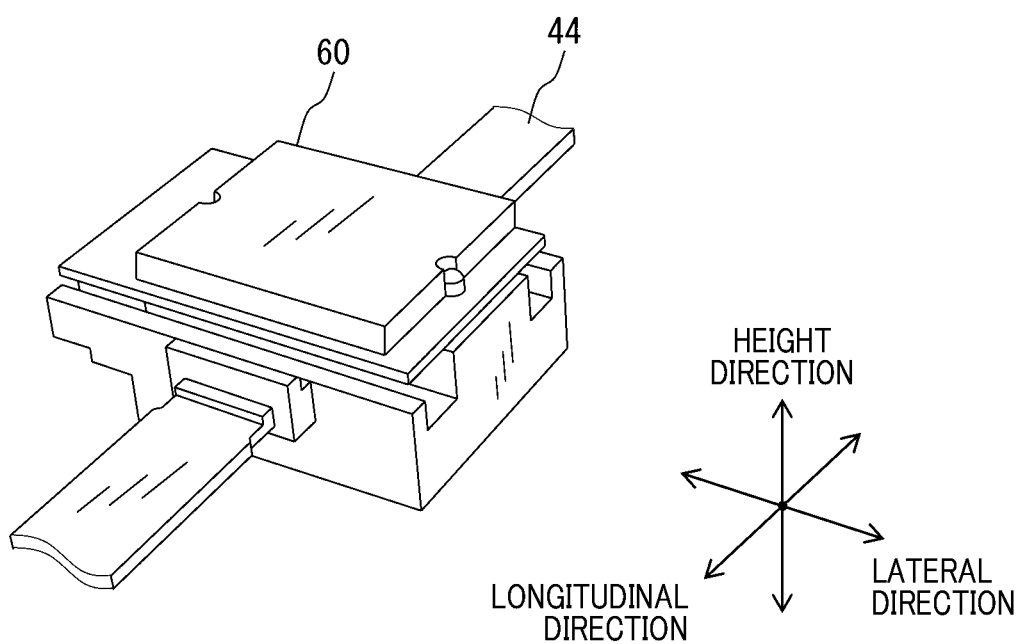
FIG. 18 is a perspective view illustrating a mounted state between a current sensor and an external positive electrode bus bar.

The current sensor 60 detects a current flowing through the bus bar 40. As shown in FIG. 18, the current sensor 60 is provided in the external positive electrode bus bar 44. The current sensor 60 detects a current (current to be detected) flowing through the external positive electrode bus bar 44. A separation distance between the current sensor 60 and the mounting wall 11 in the height direction is equally provided to the first permanent magnet 53 and the second permanent magnet 54, that is to say, the separation distance therebetween is the same as a separation distance between the first permanent magnet 53 and the mounting wall 11, and a separation distance between the second permanent magnet 54 and the mounting wall 11. In other words, a separation distance between the current sensor 60 and the control substrate 80 in the height direction is equally provided to the first permanent magnet 53 and the second permanent magnet 54, that is to say, the separation distance therebetween is the same as a separation distance between the first permanent magnet 53 and the control substrate 80, and a separation distance between the second permanent magnet 54 and the control substrate 80. Therefore, the current sensor 60 is respectively arranged with the first permanent magnet 53 and the second permanent magnet 54 on the defined plane. In other words, at least a portion of the current sensor 60 is opposite to at least portions of the first permanent magnet 53 and the second permanent magnet 54 on the defined plane.

Figure 19:
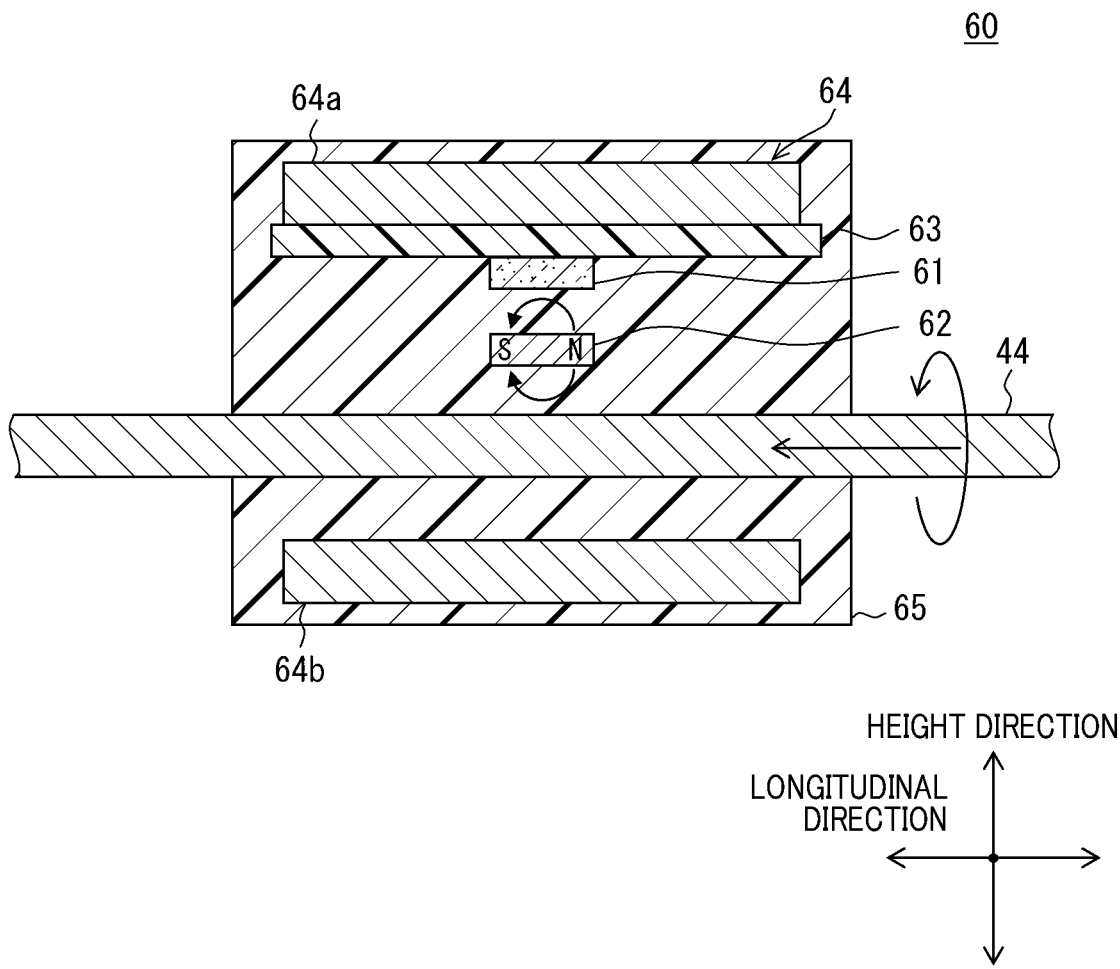
FIG. 19 is a cross-sectional view illustrating the current sensor.

As shown in FIG. 19, the current sensor 60 includes a magnetoelectric conversion element 61, a bias magnet 62, a wiring substrate 63, a magnetic shield 64 (which corresponds to a second shielding part), and a fixing part 65. The magnetoelectric conversion element 61 is mounted on the wiring substrate 63. The magnetic shield 64 includes a first shield 64a and a second shield 64b. The first shield 64a and the second shield 64b are separated from each other and arranged in the height direction.

The external positive electrode bus bar 44 passes between the first shield 64a and the second shield 64b. Further, the wiring substrate 63, on which the magnetoelectric conversion element 61 is mounted, is provided between the first shield 64a and the second shield 64b. The bias magnet 62 is provided between the first shield 64a and the second shield 64b in a state of being opposite to the magnetoelectric conversion element 61 in the height direction. The fixing part 65 is made of a non-magnetic resin material having a non-conductive characteristic. The fixing part 65 respectively fixes the wiring substrate 63 on which the magnetoelectric conversion element 61 is mounted, the bias magnet 62, and the magnetic shield 64 on the external positive electrode bus bar 44.

According to the configuration described above, a magnetic field to be measured that is generated by a flow of the current (current to be detected) of the external positive electrode bus bar 44 passes through the magnetoelectric conversion element 61. Further, a bias magnetic field generated from the bias magnet 62 passes through the magnetoelectric conversion element 61. Accordingly, a combined magnetic field that is composed of the magnetic field to be measured and the bias magnetic field passes through the magnetoelectric conversion element 61.

As shown in FIG. 19 with a straight arrow, the current to be detected flows in the longitudinal direction. As shown in FIG. 19 with a curved arrow, the magnetic field to be measured is generated around the longitudinal direction (lateral plane). The bias magnet 62 is magnetized in the longitudinal direction. Therefore, the bias magnet 62 mainly forms the magnetic field around the lateral direction (longitudinal plane). Accordingly, a magnetic field component along the lateral direction of the magnetic field to be measured passes through the magnetoelectric conversion element 61. Further, a magnetic field component along the longitudinal direction of the bias magnet 62 passes through the magnetic field conversion element 61.

As described above, the magnetic field component along the lateral direction of the magnetic field to be measured and the magnetic field component along the longitudinal direction of the bias magnet 62 pass through the magnetoelectric conversion element 61. The magnetic field component along the lateral direction and the magnetic field component along the longitudinal direction correspond to the above-mentioned combined magnetic field.

An angle θ is formed by the combined magnetic field and the magnetic field component along the longitudinal direction of the bias magnetic field. When the magnetic field to be measured is zero, the combined magnetic field becomes equal to the bias magnetic field. Accordingly, the angle θ becomes zero in the same manner as the magnetic field to be measured. However, when the magnetic field to be measured is finite, the angle θ also becomes finite. Therefore, the angle θ depends on intensity of the magnetic field to be measured.

The magnetoelectric conversion element 61 detects only the magnetic field along the defined plane. The magnetoelectric conversion element 61 is provided with a pin layer (not shown) that is determined by a magnetization direction, a free layer (not shown) that is not determined by the magnetization direction, and a non-magnetic intermediate layer provided between the pin layer and the free layer. The magnetoelectric conversion element 61 is a magnetoresistance effect element, a resistance value of which is determined by an angle that is formed by respective magnetization directions of the pin layer and the free layer. The magnetization direction of the pin layer exists along the defined plane. The magnetization direction of the free layer is determined by the magnetic field along the defined plane.

As described above, the combined magnetic field passes through the magnetoelectric conversion element 61. Therefore, the magnetization direction of the free layer is determined by the direction of the combined magnetic field (angle θ). Thus, the angle that is formed by the magnetization direction of the pin layer and the magnetization direction of the free layer is determined by the angle θ. Thus, the resistance value of the magnetoelectric conversion element 61 is determined by the angle θ. The angle θ depends on the intensity of the magnetic field to be measured. Therefore, the resistance value of the magnetoelectric conversion element 61 is determined by the intensity of the magnetic field to be measured.

A plurality of the magnetoelectric conversion elements 61 are connected to each other in series between a power source and ground, such that a bridge circuit (not shown) is assembled. A midpoint potential of the bridge circuit is inputted to a calculation part (not shown) provided on the wiring substrate 63. The calculation part stores a correlation between the midpoint potential and the angle θ, and a correlation between the angle θ and the magnetic field to be measured (current to be detected). The calculating part calculates the current to be detected based upon the correlation and the midpoint potential.

The wiring substrate 63 of the current sensor 60 and the control substrate 80 of the battery ECU 32 are electrically connected to each other via a sensor connection terminal 66. The current to be detected is inputted to the control substrate 80 via the sensor connection terminal 66. As shown in FIGS. 14 to 16, the sensor connection terminal 66 has a shape extending in the height direction. A connection portion between the wiring substrate 63 and the sensor connection terminal 66 is more closely disposed at the side of the mounting wall 11 than a connection portion between the connection electrode and the bus bar 40 with respect to the system main relay 50 in the height direction. In other words, a connection portion between the sensor connection terminal 66 and the wiring substrate 63 is more closely disposed at a side of the control substrate 80 than a connection portion between the connection electrode and the bus bar 40 in the height direction. Accordingly, a length of the sensor connection terminal 66 in the height direction is shorter than a separation distance between the connection portion between the bus bar 40 and the connection electrode, and the battery ECU 32 in the height direction. The sensor connection terminal 66 is connected to the control substrate 80 with solder.

Further, as described above, the connection portion between the sensor connection terminal 66 and the wiring substrate 63 is more closely disposed at the side of the control substrate 80 than the connection portion between the connection electrode and the bus bar 40 in the height direction. The above-mentioned configuration is described in one of two configurations which will be described hereinafter. That is, the connection portion between the sensor connection terminal 66 and the wiring substrate 63 is disposed between a connection portion between the connection electrode and the internal positive electrode bus bar 43, and a connection portion between the connection electrode and the external positive electrode bus bar 44 in the height direction. The connection portion between the sensor connection terminal 66 and the wiring substrate 63 is more closely disposed at the side of the control substrate 80 than the connection portion between the connection electrode and the internal positive electrode bus bar 43, and the connection portion between the connection electrode and the external positive electrode bus bar 44 in the height direction. In any of the two configurations, the connection portion between the sensor connection terminal 66 and the wiring substrate 63 is more closely disposed at the side of the control substrate 80 than the connection portion between the connection electrode and the internal positive electrode bus bar 43 in the height direction. In any of the two configurations, the length of the sensor connection terminal 66 in the height direction is shorter than a separation distance between the connection portion between the connection electrode and the internal positive electrode bus bar 43, and the control substrate 80 in the height direction.

The magnetic shield 64 suppresses the external magnetic field from passing through the magnetoelectric conversion element 61. The magnetic shield 64 includes the first shield 64a and the second shield 64b that are made of magnetic materials. Each of the first shield 64a and the second shield 64b has a planar shape in which a largest principal surface of an area is orthogonal to the height direction. Each of the first shield 64a and the second shield 64b is arranged in the height direction. The magnetoelectric conversion element 61 is disposed in a space between the first shield 64a and the second shield 64b.

As described above, each of the first shield 64a and the second shield 64b has the planar shape, the principal surface of which is orthogonal to the height direction. Accordingly, when the external magnetic field along the defined plane passes through the current sensor 60, the external magnetic field preferentially passes through the first shield 64a and the second shield 64b. As a result, it is advantageously possible to suppress the external magnetic field from passing through the magnetoelectric conversion element 61.

As described above, the current sensor 60 is arranged with the first permanent magnet 53 and the second permanent magnet 54 on the defined plane. Each of the first permanent magnet 53 and the second permanent magnet 54 mainly generates the magnetic field along the defined plane. Accordingly, the magnetic field along the defined plane passes through the current sensor 60. The magnetic field preferentially passes through the first shield 64a and the second shield 64b. As a result, it is advantageously possible to suppress the magnetic fields generated in the first permanent magnet 53 and the second permanent magnet 54 from passing through the magnetoelectric conversion element 61.

The shielding part 69 is made of a magnetic material such as iron, and the like. As shown in FIGS. 14 to 16, the shielding part 69 forms a rectangle on the lateral plane. The shielding part 69 divides the internal space of the case 70 into two spaces. The system main relay 50 is disposed in one of the two spaces. The current sensor 60 is disposed in the other of the two spaces. The shield part 69 is fixed to the case 70 by a screw, and the like. As shown in FIGS. 15(c) and 16, the shielding part 69 is shown with an outline of an outside shape of the shield part 69 in transparent views in order to avoid ambiguity in an internal structure of the element unit 31.

The shielding part 69 is provided with grooves 69a through which the external positive electrode bus bar 44 and the external negative electrode bus bar 46 respectively pass. Accordingly, strictly speaking, the internal space of the case 70 is not divided into two spaces by the shielding part 69. However, at least a portion of the shielding part 69 is disposed between the system main relay 50 and the current sensor 60 in the longitudinal direction. The grooves 69a are more closely disposed at the side of the control substrate 80 than the magnetoelectric conversion element 61 of the current sensor 60, the first permanent magnet 53 of the system main relay 50, and the second permanent magnet 54 thereof in the height direction.

As described above, the shielding part 69 is provided between the current sensor 60 and the system main relay 50. Accordingly, a magnetic field generated in the system main relay 50 preferentially passes through the shielding part 69. As a result, the solenoid coil and the magnetic fields generated in the first permanent magnet 53 and the second permanent magnet 54 preferentially pass through the shielding part 69.

Further, in the exemplary embodiment, the shielding part 69 and the holding part 55 of the system main relay 50 are separated from each other in the longitudinal direction. However, the shielding part 69 may be arranged in such a manner of contacting the holding part 55 in the longitudinal direction. Additionally, the shielding part 69 may be provided on a surface of the holding part 55 of the system main relay 50 and an inside thereof. In this way, it is advantageously possible to reduce the number of parts. Further, the shielding part 69 may be desirably disposed at least between the current sensor 60 and the system main relay 50 on the defined plane, and may not divide the internal space of the case 70 into the two spaces.

The case 70 is a box-shape. The case 70 is made of a resin material. As shown in FIGS. 11 and 14, the case 70 has a first side wall 71, a second side wall 72, a third side wall 73, a fourth side wall 74, a ceiling wall 75, and a floor wall 76. The first side wall 71 and the second side wall 72 respectively form rectangles on the lateral plane. The third side wall 73 and the fourth side wall 74 respectively form long rectangles in the longitudinal direction on the longitudinal plane. The first side wall 71 and the second side wall 72 are separated from each other and are opposite to each other in the longitudinal direction. The third side wall 73 and the fourth side wall 74 are separated from each other and are opposite to each other in the lateral direction. Accordingly, the first side wall 71, the third side wall 73, the second side wall 72, and the fourth side wall 74 are sequentially arranged in a circumferential direction around the height direction and connected to each other. The first side wall 71, the third side wall 73, the second side wall 72, and the fourth side wall 74 are connected to an edge of a top surface of the ceiling wall 75 and an edge of a floor surface of the floor wall 76. An internal space that is surrounded by the first side wall 71, the second side wall 72, the third side wall 73, and the fourth side wall 74 is partitioned between the top surface and the floor surface.

As described above, the case 70 is composed of six walls, but these six walls may not be separated from each other. For example, as shown in a part (a) of FIG. 15 with a compartment line by a solid line, the case 70 may be composed of three members. Thus, the case 70 may be formed in various shapes. A detailed configuration of the case 70 may be appropriately determined according to a shape, an arrangement, and the like of an element accommodated in the internal space thereof.

A portion of the bus bar 40, the system main relay 50, and the current sensor 60 are provided in the internal space. Holes, through which the portion of the bus bar 40 passes, are respectively provided on the first side wall 71 and the second side wall 72. Specifically, two holes, through which the internal positive electrode bus bar 43 and the internal negative electrode bus bar 45 pass, are provided on the second side wall 72. Accordingly, respective one ends of the internal positive electrode bus bar 43 and the internal negative electrode bus bar 45 are exposed at an outside of the internal space. The internal positive electrode housing 43a is provided at a portion that is exposed at the outside of the internal space of the internal positive electrode bus bar 43. The internal negative electrode housing 45a is provided at a portion that is exposed at the outside of the internal space of the internal negative electrode bus bar 45. Outer opening parts of the two holes provided on the second side wall 72 are covered by the internal positive electrode housing 43a and the internal negative electrode housing 45a.

Two holes, through which the external positive electrode bus bar 44 and the external negative electrode bus bar 46 pass, are provided on the first side wall 71. Accordingly, respective the other ends of the external positive electrode bus bar 44 and the external negative electrode bus bar 46 are exposed at an outside of the internal space. The external positive electrode housing 44a is provided at a portion that is exposed at the outside of the internal space of the external positive electrode bus bar 44. The external negative electrode housing 46a is provided at a portion that is exposed at the outside of the internal space of the external negative electrode bus bar 46. Outer opening parts of the two holes provided on the first side wall 71 are covered by the external positive electrode housing 44*a* and the external negative electrode housing 46*a*.

Additionally, as shown in FIG. 14, a first holding part 71*a* for holding the current sensor 60 is provided. The first holding part 71*a* forms a cylindrical shape having the first side wall 71 as a bottom that is opened to the internal space of the case 70. The current sensor 60 and a portion of the external positive electrode bus bar 44 are provided in a hollow portion of the first holding part 71*a*. Further, a portion of the external negative electrode bus bar 46 may be provided in the first holding part 71*a*.

As shown in FIG. 14, a second holding part 72*a* for holding the internal positive electrode bus bar 43 and the internal negative bus bar 45 is provided. The second holding part 72*a* forms a cylindrical shape that is opened to the internal space of the case 70 and has the second side wall 72 as a bottom with the ceiling wall 75. The internal positive electrode bus bar 43 and the internal negative bus bar 45 are provided in a hollow portion of the second holding part 72*a*. Further, the system main relay 50 is mechanically fixed to the second holding part 72*a* via a flange (not shown). That is, respective housing cases of the first switch 51 and second switch 52 are mechanically fixed to the second holding part 72*a* via the flange.

As shown in FIG. 14, the housing case is separated from the floor wall 76 in the height direction. Therefore, heat of the first switch 51 and the second switch 52 hardly electrically heats the floor wall 76. As a result, the respective heat of the first switch 51 and the second switch 52 is hardly transmitted to the battery ECU 32 that is disposed at a lower portion of the floor wall 76. Additionally, holes, through which the switch connection terminal 56 of the system main relay 50 and the sensor connection terminal 66 of the current sensor 60 respectively pass, are provided on the floor wall 76.

(Configuration of Battery ECU)

As shown in FIG. 4, the battery ECU 32 is mounted on the mounting wall 11. The element unit 31 is provided at an upper portion of the battery ECU 32. The element unit 31 is arranged with the battery cell 240 in the longitudinal direction. Meanwhile, the battery ECU 32 is arranged with the first ventilation space of the battery module 200 and the second ventilation space thereof in the longitudinal direction. Further, as shown in FIG. 13, the control unit 30 including the battery ECU 32 is disposed between the third ventilation hole 17*a* communicating with the first ventilation space and the fourth ventilation hole 17*b* communicating with the second ventilation space in the lateral direction.

Figure 20:
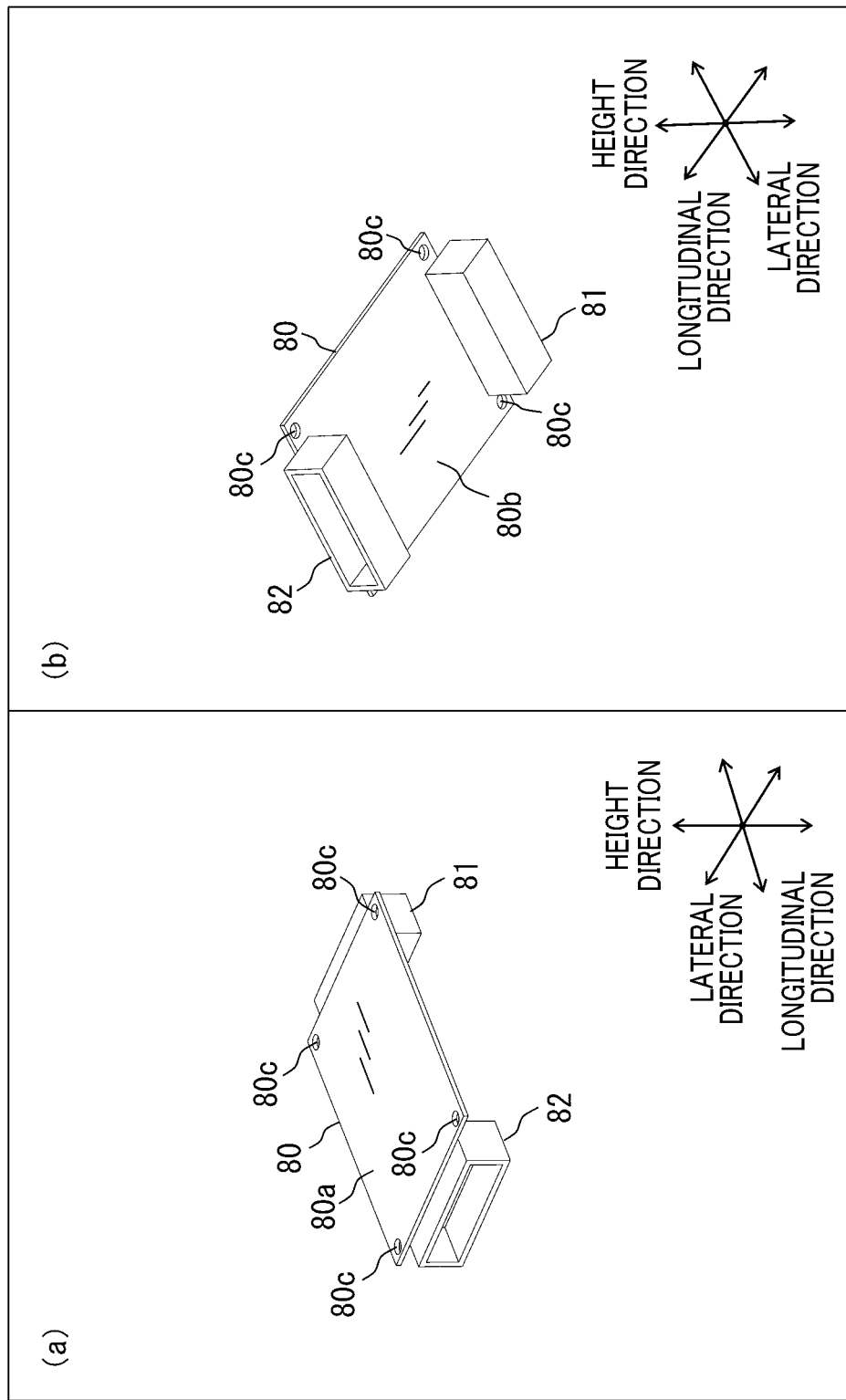
FIG. 20 shows, in its parts (a) and (b), drawings illustrating a control substrate.

As described above, the battery ECU 32 includes the control substrate 80, the internal connector 81, the external connector 82, the spacer 83, and the control cover 84. As shown in FIG. 20, the control substrate 80 has a planar shape along the defined plane. A mounting hole (not shown), through which the sensor connection terminal 66 and the switch connection terminal 56 are electrically connected to each other, is provided on the control substrate 80. A wiring pattern is respectively provided on an upper surface 80*a* of the control substrate 80, a lower surface 80*b* at an opposite side thereof, and also provided between the upper surface 80*a* and the lower surface 80*b*. An electronic element for forming a control circuit is mounted on the upper surface 80*a* of the control substrate 80. The internal connector 81 and the external connector 82 that are electrically connected to the control circuit via the wiring pattern are respectively fixed to the lower surface 80*b*. More specifically, the internal connector 81 is fixed to an end portion at a side of the connecting wall 16 on the lower surface 80*b* of the control substrate 80. The external connector 82 is fixed to an end portion that is separated from the connecting wall 16 on the lower surface 80*b* of the control substrate 80. Thus, the internal connector 81 and the external connector 82 are arranged in the longitudinal direction at a lower portion than the lower surface 80*b*. The internal wire 110 is connected to the internal connector 81. A second wire harness 85*b* shown in FIG. 1 is connected to the external connector 82. The control substrate 80 and the in-vehicle ECU 500 are electrically connected to each other via the second wire harness 85*b*.

A through-hole 80*c* passing through the upper surface 80*a* and the lower surface 80*b* is provided at four corners of the control substrate 80. A screw 86 shown in FIG. 22 passes through the through-hole 80*c*. Further, a plurality of positioning holes (not shown), by which a position of the control substrate 80 with respect to the element unit 31 is determined, are provided on the control substrate 80. A projection part 90 shown in FIG. 21 passes through the positioning hole. The plurality of positioning holes are arranged on the control substrate 80 in a diagonal direction.

Figure 21:
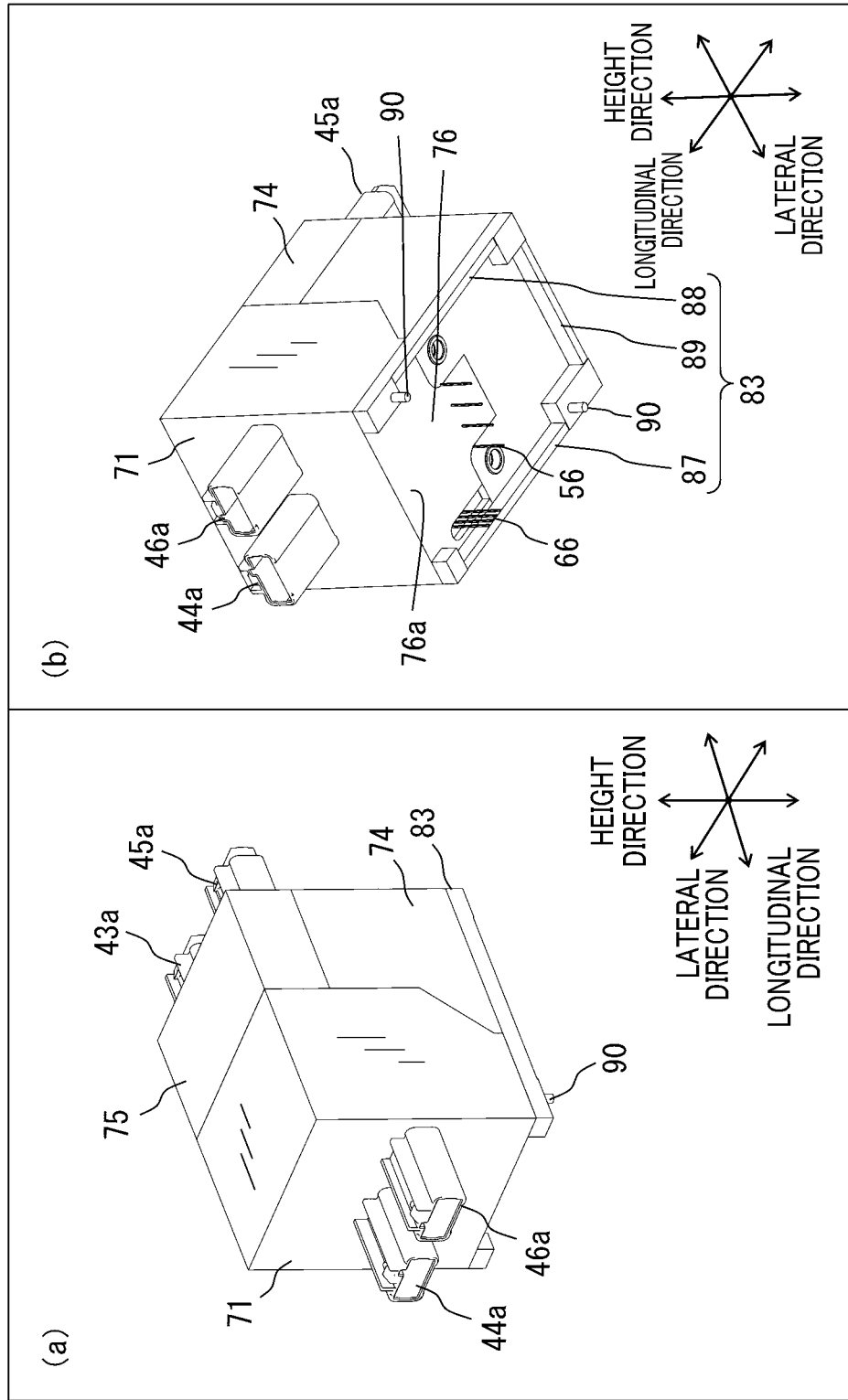
FIG. 21 shows, in its parts (a) and (b), drawings illustrating a spacer.

As shown in FIG. 21, the spacer 83 has a frame shape on the defined plane. The spacer 83 is provided on an outer surface 76*a* of the floor wall 76. The spacer 83 includes a first supporting part 87, a second supporting part 88, and a third supporting part 89. The first supporting parts 87 and the second supporting parts 88 respectively form pillar shapes extending in the longitudinal direction. The third supporting part 89 forms the pillar shape extending in the lateral direction. The first supporting part 87, the second supporting part 88, and the third supporting part 89 have the same length in the height direction. The first supporting parts 87, the second supporting part 88, and the third supporting part 89 are respectively provided at edge portions of the outer surface 76*a*. Accordingly, an enclosed space surrounded by the spacer 83 is formed at a lower portion of the outer surface 76*a*.

As shown in FIG. 21, the first supporting part 87 and the second supporting part 88 are separated from each other and arranged in the lateral direction. The third supporting part 89 is disposed between the first supporting part 87 and the second supporting part 88. More specifically, the third supporting part 89 is disposed at an edge portion at the side of the connecting wall 16 on the outer surface 76*a*. The third supporting part 89 connects the first supporting part 87 and the second supporting part 88. Accordingly, the above-mentioned enclosed space is opened at a portion separated from the connecting wall 16.

The projection part 90 projecting towards the side of the mounting wall 11 is provided at the end portion at the side of the connecting wall 16 of the first supporting part 87 in the height direction. In the same manner, the projection part 90 is provided at an end portion of a side that is opposite to the connecting wall 16 of the second supporting part 88. The two projection parts 90 are arranged in a direction respectively intersecting with the lateral direction and the longitudinal direction on the defined plane. In other words, as described above, the two projection parts 90 are arranged in the diagonal direction of the control substrate 80.

Figure 22:
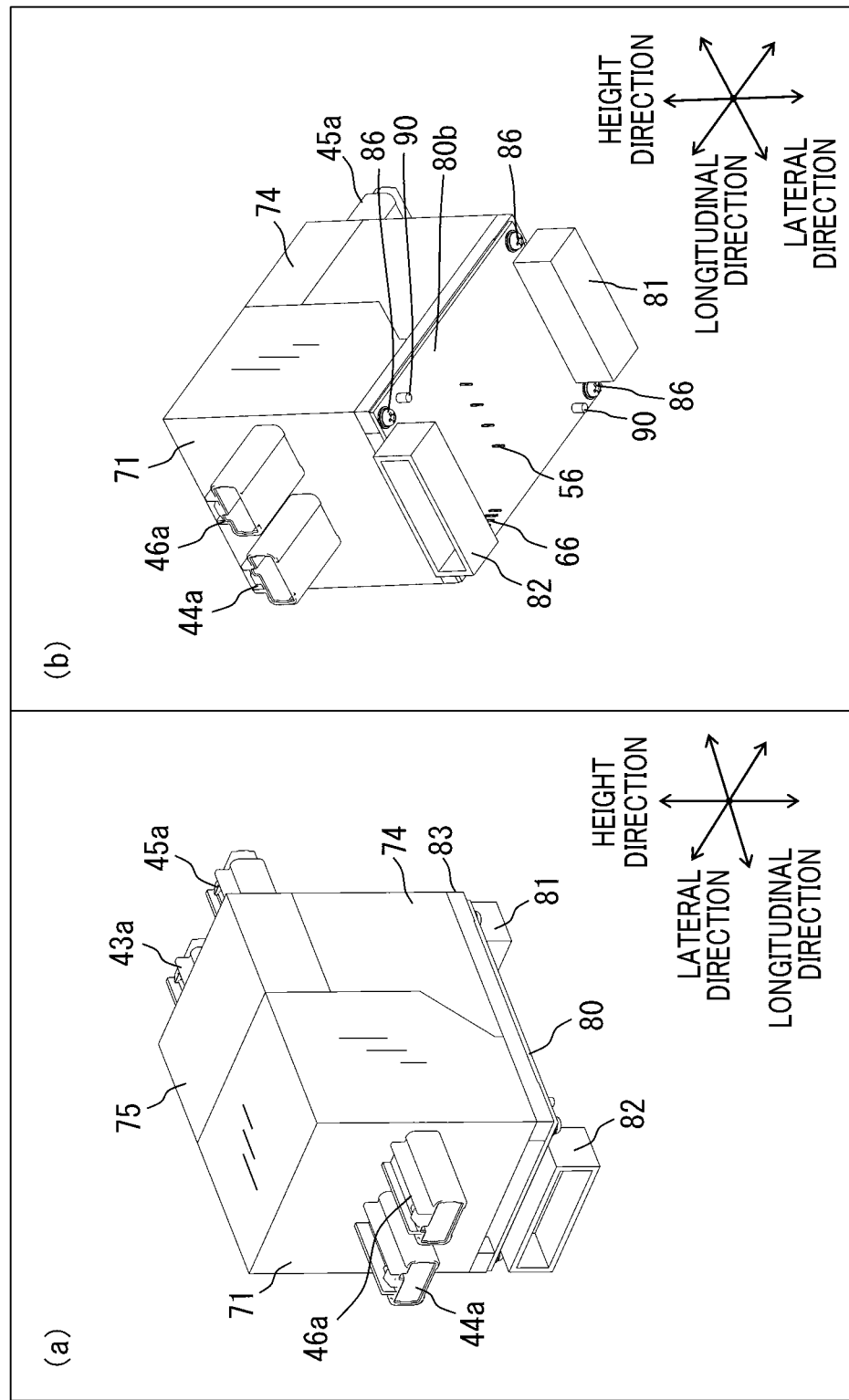
FIG. 22 shows, in its parts (a) and (b), drawings illustrating a state in which the control substrate is fixed to the element unit.

When the control substrate 80 is mounted on the spacer 83, the outer surface 76*a* of the floor wall 76 and the upper surface 80*a* of the control substrate 80 are opposite to each other in the height direction. As shown in FIG. 22, the two projection parts 90 pass through the positioning holes of the control substrate 80. Accordingly, a relative position of the control substrate 80 and the case 70 on the defined plane is determined. Next, the screw 86 passes through the through-hole 80c of the control substrate 80. Thus, the internal connector 81 and the external connector 82 as well as the control substrate 80 are fixed to the case 70 via the spacer 83.

As described above, the electronic element is mounted on the upper surface 80a of the control substrate 80. The enclosed space is formed at the lower portion of the outer surface 76a. Accordingly, the electronic element that is mounted on the upper surface 80a is surrounded by the enclosed space. Further, as described above, the enclosed space is opened at the portion separated from the connecting wall 16. That is, as shown in a part (a) of FIG. 22, the enclosed space is opened to the side that is opposite to the connecting wall 16 in the longitudinal direction. Accordingly, the enclosed space communicates with an external space, and thus consequently heat that is generated by the electronic element of the control substrate 80 is easily radiated.

Figure 23:
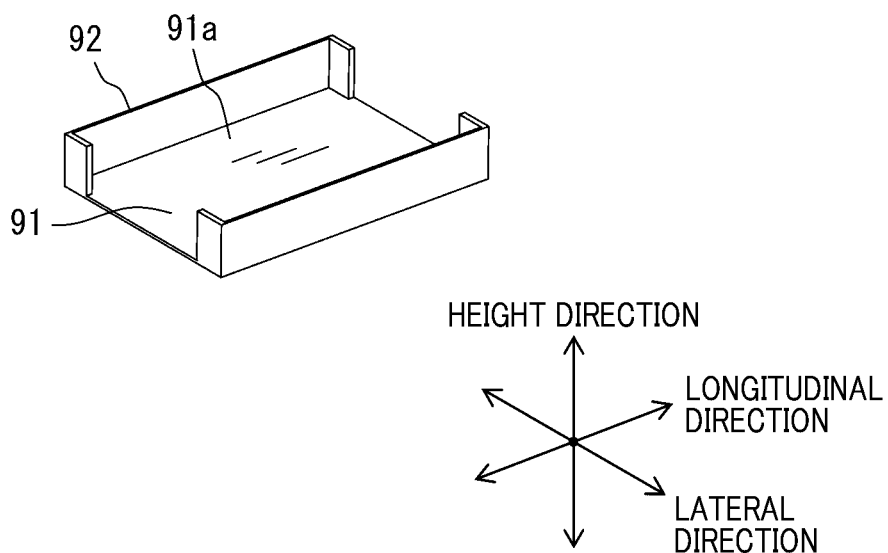
FIG. 23 is a perspective view illustrating a control cover.

The control cover 84 has a function of covering the lower surface 80b of the control substrate 80. The control cover 84 is made of a metal material or a resin material. As shown in FIG. 23, the control cover 84 has an opposite wall 91 and a surrounding wall 92. The opposite wall 91 forms a long rectangle on the defined plane in the longitudinal direction. The surrounding wall 92 is annularly formed along an edge portion of an opposite surface 91a that is opposite to the control substrate 80 with respect to the opposite wall 91. Notches, at which the internal connector 81 and the external connector 82 are provided, are formed at central portions of two walls extending in the lateral direction of the surrounding wall 92.

Figure 24:
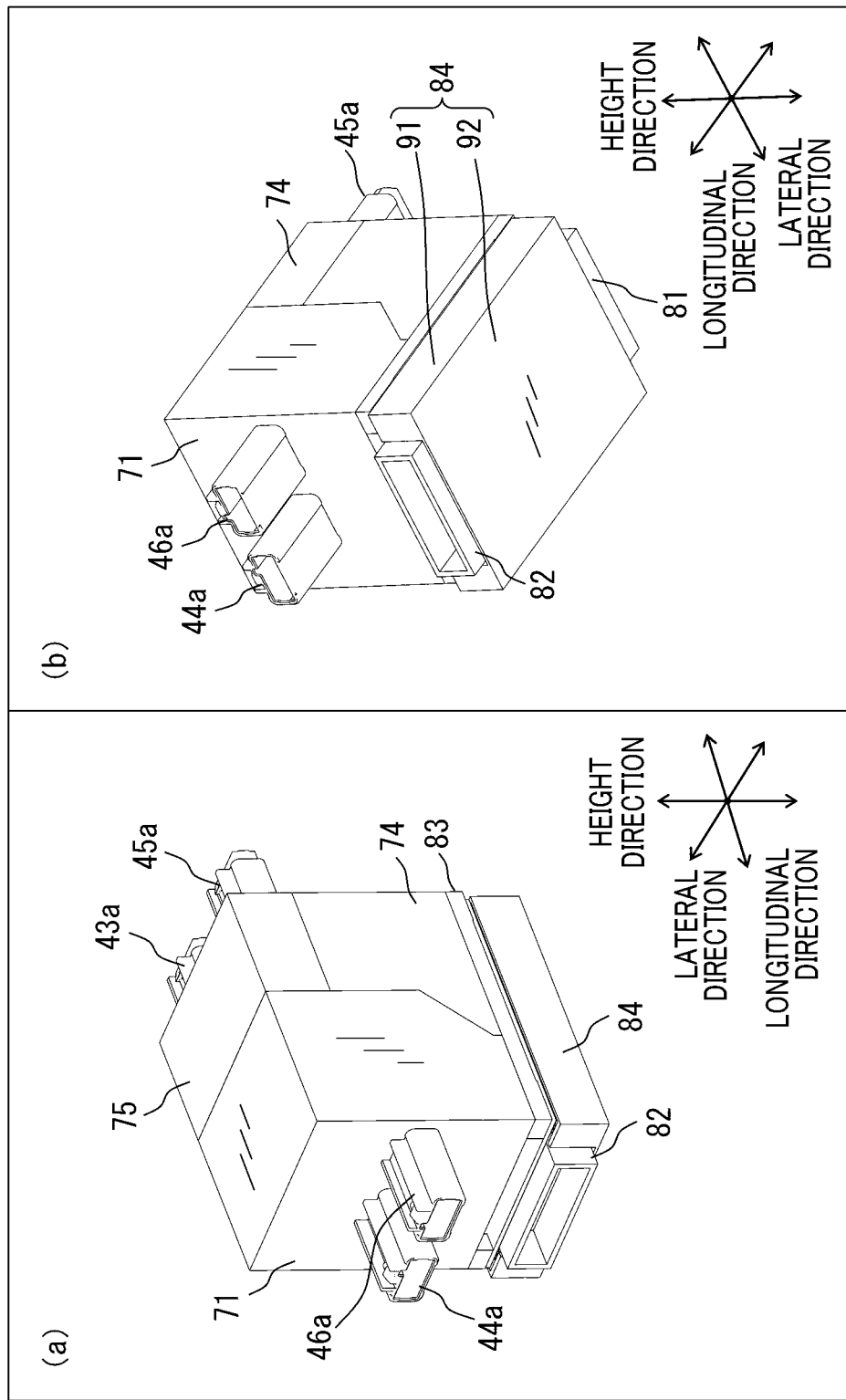
FIG. 24 shows, in its parts (a) and (b), drawings illustrating a state in which the control cover is fixed to the element unit.

When the control cover 84 is mounted on the control substrate 80, the lower surface 80b of the control substrate 80 and the opposite surface 91a that is opposite to the control cover 84 are opposite to each other in the height direction. As shown in FIG. 24, the control cover 84 is provided on the control substrate 80, such that the internal connector 81 and the external connector 82 are disposed at the notches that are formed at the central portions of the two walls extending in the lateral direction of the surrounding wall 92. Accordingly, the lower surface 80b of the control substrate 80 is covered by the control cover 84.

Next, referring back to FIG. 1, the battery module 200, the control module 100, the electric load 400, and the in-vehicle ECU 500 are electrically connected to each other. The above-mentioned electrical connections therebetween will now be described. The battery module 200 includes the first battery stack 231 and the second battery stack 232. The first battery stack 231 and the second battery stack 232 are connected to each other in series via the second series terminal 244. The first battery stack 231 is electrically connected to the internal positive electrode bus bar 43 via the positive electrode input/output terminal 245. The second battery stack 232 is electrically connected to the internal negative electrode bus bar 45 via the negative electrode input/output terminal 246.

The internal positive electrode bus bar 43 is electrically connected to the external positive electrode bus bar 44 via the first switch 51. The internal negative electrode bus bar 45 is electrically connected to the external negative electrode bus bar 46 via the second switch 52. The external positive electrode bus bars 44 and the external negative electrode bus bar 46 are electrically connected to the electric load 400 via the first wire harness 85a.

As described above, the electrical connection between the battery module 200 and the electric load 400 is controlled by opening/closing of the first switch 51 and the second switch 52. The opening/closing of the first switch 51 and the second switch 52 is controlled by the battery ECU 32.

Further, the battery module 200 has the monitoring unit 250. The monitoring unit 250 is electrically connected to the battery ECU 32 via the internal wire 110. The battery ECU 32 is electrically connected to the in-vehicle ECU 500 via the second wire harness 85b.

The in-vehicle ECU 500 outputs a command signal to the battery ECU 32. The battery ECU 32 controls the opening/closing of the first switch 51 and the second switch 52 based upon the command signal outputted from the in-vehicle ECU 500. The monitoring unit 250 detects a voltage of the battery cell 240 and a temperature thereof and outputs the voltage thereof and the temperature thereof to the battery ECU 32. The battery ECU 32 detects respective SOC (states of charge) of the plurality of battery cells 240 based upon an inputted voltage, an inputted temperature and a stored correlation. The battery ECU 32 outputs a command of an equalization process to the monitoring unit 250 based upon the detected SOC. The microcomputer of the monitoring unit 250 controls the switches that respectively correspond to the plurality of battery cells 240 by opening and closing thereof based upon the command of the equalization process outputted from the battery ECU 32. In this way, the equalization process is performed.

The control module 100 includes the first fan 21 and the second fan 22. The first fan 21 and the second fan 22 are electrically connected to the battery ECU 32 by the wire 23. As described above, the monitoring unit 250 includes the temperature sensor as an electronic element for detecting the temperature of the battery cell 240. An electric signal of the temperature sensor is inputted into the battery ECU 32. The battery ECU 32 individually controls driving of the first fan 21 and the second fan 22 based upon the temperature of the temperature sensor. For example, when a temperature of the first battery stack 231 is higher than that of the second battery stack 232, the battery ECU 32 more accelerates a suction-rotation of the first fan 21 than that of the second fan 22. Accordingly, wind that is stronger than that of the second ventilation space is guided into the first ventilation space. As a result, the first battery stack 231 is more strongly cooled than the second battery stack 232.

Further, respective driving circuits of the first fan 21 and the second fan 22 are provided on the control substrate 80 of the battery ECU 32. The driving circuits are electrically connected to respective motors of the first fan 21 and the second fan 22 via the wire 23.

The control module 100 includes the current sensor 60. The current sensor 60 is electrically connected to the battery ECU 32 via the sensor connection terminal 66. Accordingly, the battery ECU 32 detects an input of the current of the battery module 200 and an output thereof. The detected current is outputted to the in-vehicle ECU 500 by the battery ECU 32.

Next, a positional relation between the control substrate 80 and the element unit 31 will now be described with reference to FIG. 14. As shown in FIG. 14, the bus bar 40, the system main relay 50, and the current sensor 60 are provided at an upper portion of the upper surface 80a of the control substrate 80 in the height direction. More specifically, the system main relay 50 is disposed between each of internal positive electrode bus bar 43 and the internal negative electrode bus bar 45 and the control substrate 80. The external positive electrode bus bar 44 and the external negative electrode bus bar 46 are more closely disposed at the side of the control substrate 80 than the internal positive electrode bus bar 43 and the internal negative electrode bus bar 45. The external positive electrode bus bar 44 and the external negative electrode bus bar 46 are arranged with the system main relay 50 in the longitudinal direction.

(Functional Effect)

Hereinafter, a functional effect of the control module 100 will now be described.

(Functional Effect of Connection Terminal and System Main Relay)

A connection portion between the wiring substrate 63 (current sensor 60) and the sensor connection terminal 66 is more closely disposed at a side of the battery ECU 32 (control substrate 80) than a connection portion between a connection electrode of the system main relay 50 and the bus bar 40 in the height direction. Therefore, the length of the sensor connection terminal 66 in the height direction becomes shorter than the separation distance between the connection portion between the connection electrode and the bus bar 40, and the control substrate 80 in the height direction. Accordingly, a vibration of the sensor connection terminal 66 is suppressed, such that it is advantageously possible to suppress connection reliability between the control substrate 80 and the sensor connection terminal 66 from deteriorating.

When connection switching of the system main relay 50 occurs, electromagnetic noise is generated at the connection portion between the connection electrode of the system main relay 50 and the bus bar 40. The connection portion between the connection electrode and the bus bar 40 is more separated from the control substrate 80 than the connection portion between the sensor connection terminal 66 and the current sensor 60. Therefore, it is advantageously possible to suppress the electromagnetic noise that is generated when the connection switching of the system main relay 50 occurs from interfering with the control substrate 80.

The internal positive electrode bus bar 43 and the internal negative electrode bus bar 45 are respectively disposed at the side of the upper end surface 240*a* of the battery cell 240. The external positive electrode bus bar 44 and the external negative electrode bus bar 46 are more closely disposed at the side of the lower end surface 240*b* (control substrate 80) of the battery cell 240 than the internal positive electrode bus bar 43 and the internal negative electrode bus bar 45. The current sensor 60 is provided in the external positive electrode bus bar 44. The external positive electrode bus bar 44 and the external negative electrode bus bar 46 are separated from the control substrate 80 in the height direction.

Accordingly, unlike a configuration in which the external bus bar and the internal bus bar are disposed in the same height direction, a space according to a height of the battery cell 240 is respectively provided at a side of the upper end surface 240*a* of the battery cell 240 and a side of the lower end surface 240*b* thereof in the height direction in the external bus bar. The current sensor 60 is provided in the space. Therefore, it is advantageously possible not only to suppress a length in the height direction of the control module 100 from increasing, but also to suppress a size of the control module 100 from increasing.

Further, the current sensor 60 is provided at the external positive electrode bus bar 44 that is disposed at the side of the control substrate 80. Therefore, it is possible to suppress a length of the sensor connection terminal 66, by which the current sensor 60 and the control substrate 80 are connected to each other, from increasing. Accordingly, it is advantageously possible not only to suppress the sensor connection terminal 66 from being vibrated, but also to suppress the connection reliability between the control substrate 80 and the sensor connection terminal 66 from deteriorating.

(Functional Effect of System Main Relay)

The system main relay 50 is disposed at the upper portion of the upper surface 80*a* of the control substrate 80. Additionally, the system main relay 50 is disposed between the internal positive electrode bus bar 43 and the internal negative electrode bus bar 45 and the control substrate 80.

Provided herein is a space according to the height of the battery 240 for mounting an element between the internal positive electrode bus bar 43 and the internal negative electrode bus bar 45, and the control substrate 80. The system main relay 50 is provided in the space. Therefore, it is advantageously possible not only to suppress the control module 100 from being elongated in the height direction, but also to suppress a size of control module 60 from increasing.

Additionally, the connection portion between the connection electrode of the system main relay 50 and the bus bar 40 is separated from the control substrate 80 at a height of the system main relay 50. Therefore, it is possible to suppress the electromagnetic noise that is generated when the connection switching of the system main relay 50 occurs from interfering with the control substrate 80. In other words, it is advantageously possible to suppress heat that is generated in the system main relay 50 from interfering with the control substrate 80.

An electrical connection of the positive electrode bus bar 41 is controlled by the first switch 51. An electrical connection of the negative electrode bus bar 42 is controlled by the second switch 52. Accordingly, for example, even though one of the first switch 51 and the second switch 52 is fixed in an ON-state, it is possible to control the electrical conduction between the electric load 400 and the battery module 200 by the other thereof.

(Functional Effect of Current Sensor and Permanent Magnet)

The current sensor 60 includes the first shield 64*a* and the second shield 64*b* that have planar shapes, the principal surfaces of which are orthogonal to the height direction. The current sensor 60 is respectively arranged with the first permanent magnet 53 and the second permanent magnet 54 on the defined plane. The first permanent magnet 53 and the second permanent magnet 54 mainly generate the magnetic fields along the defined plane.

Accordingly, the magnetic fields along the defined plane preferentially pass through the first shield 64*a* and the second shield 64*b*. Therefore, it is possible to suppress magnetic fields generated in the first permanent magnet 53 and the second permanent magnet 54 from passing through the magnetoelectric conversion element 61. As a result, it is advantageously possible to suppress detection accuracy of the current sensor 60 from deteriorating.

(Functional Effect of Shield)

The shielding part 69 that is made of a magnetic material is provided between the current sensor 60 and the system main relay 50.

Accordingly, even though a separation distance between the current sensor 60 and the system main relay 50 becomes short by reducing a size of the control module 100, it is possible to suppress the magnetic field generated in the system main relay 50 from passing through the current sensor 60. As a result, it is advantageously possible to suppress the detection accuracy of the current sensor 60 from deteriorating.

The shielding part 69 is provided with the grooves 69*a* through which the external positive electrode bus bar 44 and the external negative electrode bus bar 46 respectively pass. Accordingly, the bus bar 40 is not designed to detour the shielding part 69. Therefore, it is possible to suppress the size of the control module 100 from increasing. Further, unlike a configuration in which a shape of the shielding part is designed to avoid contact with the bus bar, it is possible to suppress a suppression effect, by which the magnetic field generated in the system main relay 50 is suppressed from passing through the current sensor 60, from deteriorating.

(Functional Effect of Battery Pack Installation)

The battery pack 300 is provided in an installation space under a rear seat of the hybrid vehicle. The battery module 200 and the control module 100 of the battery pack 300 are arranged in the longitudinal direction and are mechanically and electrically connected to each other.

A height of the seat is determined according to comfortability of sitting of a user. Further, as the battery stack 230 is configured for high output and high capacity, a size of the battery stack 230 may increase. Therefore, when the battery module 200 including the battery stack 230 is installed in the installation space under a seat of the hybrid vehicle, a size of the battery module 200 in the height direction is determined to be equal to a size of the installation space in the height direction. Accordingly, an extra space between the battery module 200 and the seat is not provided.

Meanwhile, the control module 100 and the battery module 200 are arranged in the longitudinal direction according not to the comfortability of the sitting of the user but to a size of the hybrid vehicle. Accordingly, even though the size of the battery stack 230 increase, the control module 100 and the battery module 200 are easily installed in the installation space.

(Functional Effect of Notch and Ventilation Hole)

The third ventilation hole 17a and the fourth ventilation hole 17b are respectively separated from the third notch 16b and the fourth notch 16c in the height direction. The third notch 16b and the fourth notch 16c are disposed at the upper portion between the first ventilation hole 219a and the second ventilation hole 219b in the lateral direction. The control unit 30 is disposed between the third ventilation hole 17a and the fourth ventilation hole 17b in the lateral direction.

Accordingly, it is possible to suppress the control unit 30 from interfering with wind flowing through the third ventilation hole 17a and the fourth ventilation hole 17b, that is to say, wind flowing through the first fan 21 and the second fan 22. Further, it is possible to suppress wind flowing through the battery stack 230, that is to say, wind flowing through a first ventilation passage and a second ventilation passage from leaking from the third notch 16b and the fourth notch 16c.

The third notch 16b and the fourth notch 16c are provided on the upper surface 16a of the connecting wall 16. The third notch 16b and the first notch 215b are arranged in the longitudinal direction. The fourth notch 16c and the second notch 215c are arranged in the longitudinal direction. At least one of the positive electrode bus bar 41 and the positive electrode input/output terminal 245 is provided at the third notch 16b. At least one of the negative electrode bus bar 42 and the negative electrode input/output terminal 246 is provided at the fourth notch 16c.

Accordingly, unlike a configuration in which the third notch and the fourth notch are provided at a lower portion of the connecting wall 16, the positive electrode input/output terminals 245 and the negative electrode input/output terminals 246 are not required to be bent from the upper end surface 240a, in which the positive electrode terminal 241 of the battery cell 240 and the negative electrode terminal 242 thereof are provided, to the lower end surface 240b. Therefore, the positive electrode input/output terminals 245 and the negative electrode input/output terminals 246 that are connected to the control module 100 are easily designed. Additionally, a wire, and the like for connecting the positive electrode bus bar 41 and the positive electrode input/output terminals 245, and the negative electrode bus bar 42 and the negative electrode input/output terminals 246 may not be provided.

(Functional Effect of Wind of Battery Module)

The positive electrode terminal 241 of the battery cell 240 that is opposite to the left wall 215 of the first battery stack 231 and the negative electrode terminal 242 of that battery cell 240 that is opposite to the left wall 215 of the second battery stack 232 are arranged in the lateral direction between the partition wall 213 by which the storage space and the ventilation space are respectively divided. The positive electrode input/output terminal 245 is connected to the positive electrode terminal 241 disposed at the side of the partition wall 213. The negative electrode input/output terminal 246 is connected to the negative electrode terminal 242 disposed at the side of the partition wall 213.

The first notch 215b, at which the positive electrode bus bar 41 and the positive electrode input/output terminal 245 are electrically connected to each other at the height position of the upper end surface 240a of the battery cell 240, is provided at a center of the upper surface 215a of the left wall 215. In the same manner, the second notch 215c, at which the negative electrode bus bar 42 and the negative electrode input/output terminal 246 are electrically connected to each other at the height position of the upper end surface 240a of the battery cell 240, is provided at the center of the upper surface 215a of the left wall 215.

The first ventilation hole 219a communicating with the first ventilation space and the second ventilation hole 211b communicating with the second ventilation space are provided on the left wall 215. The first ventilation holes 219a and the second ventilation holes 211b are respectively separated from the first notch 215b and the second notch 215c in the height direction. Additionally, the first notch 215b and the second notch 215c are disposed at the upper portion between the first ventilation hole 219a and the second ventilation hole 219b in the lateral direction.

According to the configuration described above, wind that flows through the first storage space and the second storage space and passes through the first ventilation space and the second ventilation space communicates with the first ventilation hole 219a and the second ventilation hole 219b that are respectively separated from the first notch 215b and the second notch 215c. Accordingly, it is advantageously possible to suppress the first notch 215b and the second notch 215c from interfering with the wind flowing through the first storage space and the second storage space.

The first notch 215b is arranged with the third notch 16b in the longitudinal direction. The second notch 215c is arranged with the fourth notch 16c in the longitudinal direction. Accordingly, it is advantageously possible to suppress the third notch 16b and the fourth notch 16c from interfering with the wind flowing through the first storage space and the second storage space.

(Functional Effect of Solder Connection)

The current sensor 60 and the system main relay 50 are disposed at an upper portion of the control substrate 80. The control substrate 80 and the current sensor 60 are electrically connected to each other via the sensor connection terminal 66. The sensor connection terminal 66 is connected to the control substrate 80 with solder. Further, the control substrate 80 and the system main relay 50 are electrically connected to each other via the switch connection terminal 56. The switch connection terminal 56 is connected to the control substrate 80 with the solder.

Accordingly, the current sensor 60 and the system main relay 50 are arranged with the control substrate 80 in the height direction. Therefore, unlike a configuration in which the current sensor and the system main relay are shifted in the longitudinal direction and the lateral direction with respect to the control substrate, thereby not being arranged with the control substrate in the height direction, the current sensor 60 and the system main relay 50 in the exemplary embodiment of the present disclosure are designed to be easily connected to the control substrate 80, respectively. As described above, the sensor connection terminal 66 and the switch connection terminal 56 are desirably connected to the control substrate 80 only by a solder connection. Accordingly, a wire, by which the current sensor 60 and the system main relay 50 are electrically connected to the control substrate 80, is not required. As a result, it is possible to suppress the number of parts from increasing.

(Functional Effect of Fan)

The control unit 30 is disposed between the first fan 21 and the second fan 22. The first sweep-out outlet 21a of the first fan 21 is opened to a side that is opposite to the connecting wall 16 in the longitudinal direction. In the same manner, the second sweep-out outlet 22a of the second fan 22 is opened to the side that is opposite to the connecting wall 16 in the longitudinal direction. Therefore, the first fan 21 discharges the sucked wind in the direction far away from the first sweep-out outlet 21a and the battery module 200. The second fan 22 discharges the sucked wind in the direction far away from the second sweep-out outlet 22a and the battery module 200.

Accordingly, it is possible to suppress the control unit 30 from interfering with the wind discharged from the first fan 21 and the second fan 22. Therefore, it is advantageously possible to suppress the control unit 30 from interfering with the wind flowing through the first storage space and the second storage space.

The respective driving circuits of the first fan 21 and the second fan 22 are provided on the control substrate 80. Accordingly, unlikely a configuration in which the driving circuits are respectively provided at the first fan 21 and the second fan 22, respective sizes of the first fan 21 and the second fan 22 in the exemplary embodiment become small. Further, the driving circuits thereof are integrated on the control substrate 80. Therefore, it is possible to suppress a size of the control module 100 from increasing in comparison with the aforementioned configuration in which the control substrate 80 and the driving circuits are separately provided.

The battery ECU 32 individually controls the driving of the first fan 21 and the second fan 22. Accordingly, respective cooling of the first battery stack 231 and the second battery stack 232 may be individually controlled.

The battery ECU 32 individually controls the driving of the first fan 21 and the second fan 22 based upon the temperature of the temperature sensor. For example, when the temperature of the first battery stack 231 is higher than that of the second battery stack 232, the battery ECU 32 more accelerates the suction-rotation of the first fan 21 than that of the second fan 22. Accordingly, the temperature of the first battery stack 231 and the temperature of the second battery stack 232 are equalized. As a result, it is advantageously possible to suppress lifetime differences between the first battery stack 231 and the second battery stack 232.

(Functional Effect of Fixing)

The system main relay 50 together with the internal positive electrode bus bar 43 and the internal negative electrode bus bar 45 are mechanically fixed to the second holding part 72a. Accordingly, the system main relay 50 together with the internal positive electrode bus bar 43 and the internal negative electrode bus bar 45 becomes easily vibrated in the same frequency. Thus, in comparison with a configuration in which the internal positive electrode bus bar 43 and the internal negative electrode bus bar 45, and the system main relay 50 are respectively vibrated in a different frequency, it is possible to suppress the system main relay 50 from causing an unstable connection between the internal positive electrode bus bar 43 and the internal negative electrode bus bar 45. In the same manner, it is advantageously possible not only to suppress the unstable connection between the internal negative bus bar 45 and the external negative bus bar 46, but also to suppress heat generation caused by friction at respective connection portions between the system main relay 50 and the internal positive electrode bus bar 43, and the system main relay 50 and the external positive electrode bus bar 44.

The current sensor 60 and the system main relay 50 are fixed to the case 70. The control substrate 80 of the battery ECU 32 is also fixed to the case 70. Accordingly, unlike a configuration in which the control substrate 70 is not fixed to the case 70, it is possible to suppress respective relative displacements between the current sensor 60 and the control substrate 80, and between the system main relay 50 and the control substrate 80. Accordingly, it is possible to suppress respective electrical connection reliability between the current sensor 60 and the control substrate 80, and between the system main relay 50 and the control substrate 80 from deteriorating.

As described above, the present disclosure has been described in connection with what is presently considered to be practical exemplary embodiments, it is to be understood that the present disclosure is not limited to the disclosed embodiments, but, on the contrary, is intended to cover various modifications and equivalent arrangements without departing from the technical spirit and essential features of the present disclosure. Singular forms are to include plural forms unless the context clearly indicates otherwise.

First Modified Exemplary Embodiment

Figure 25:
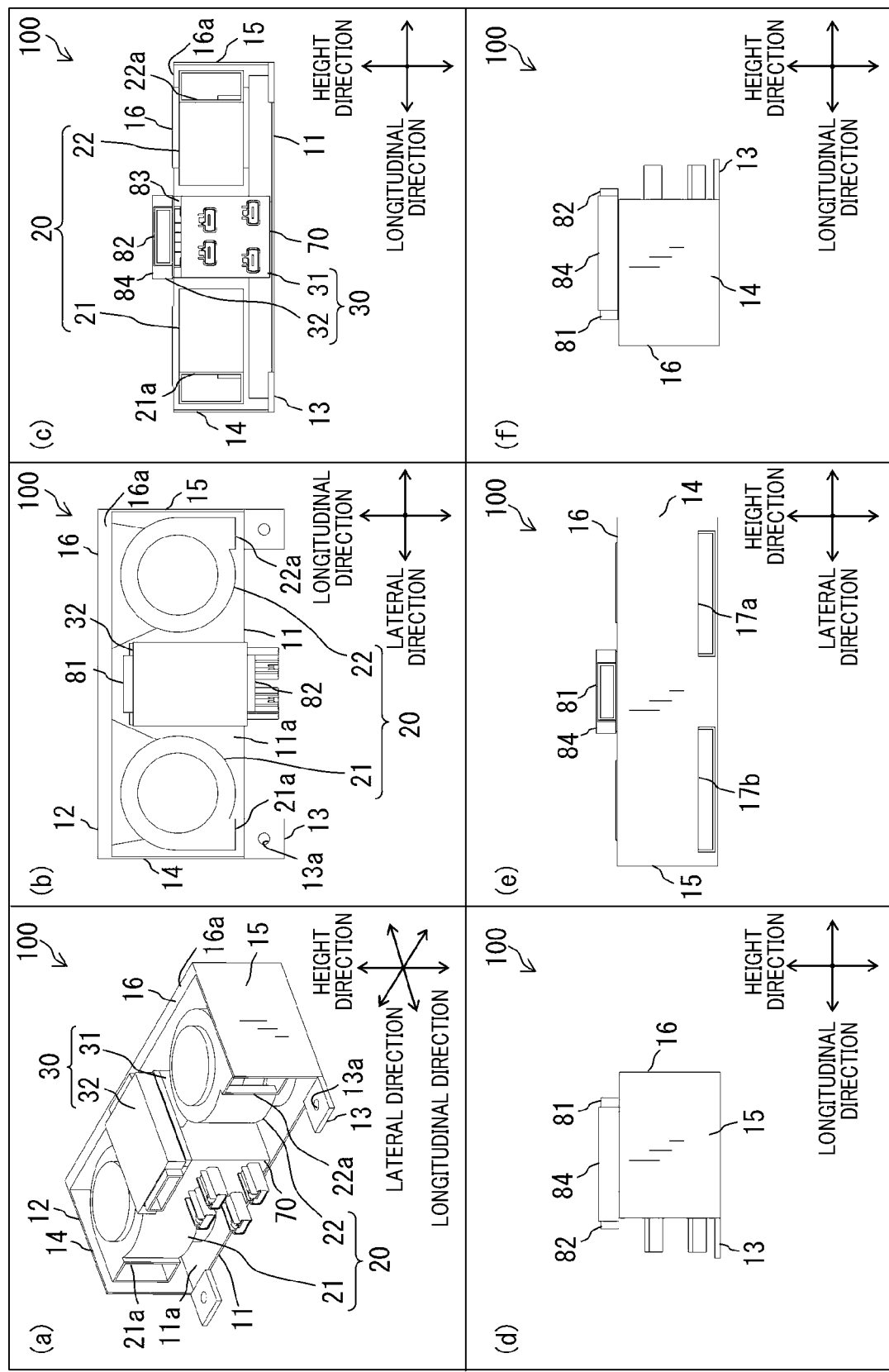
FIG. 25 shows, in its parts (a) to (f), drawings illustrating variations of the control module.
Figure 26:
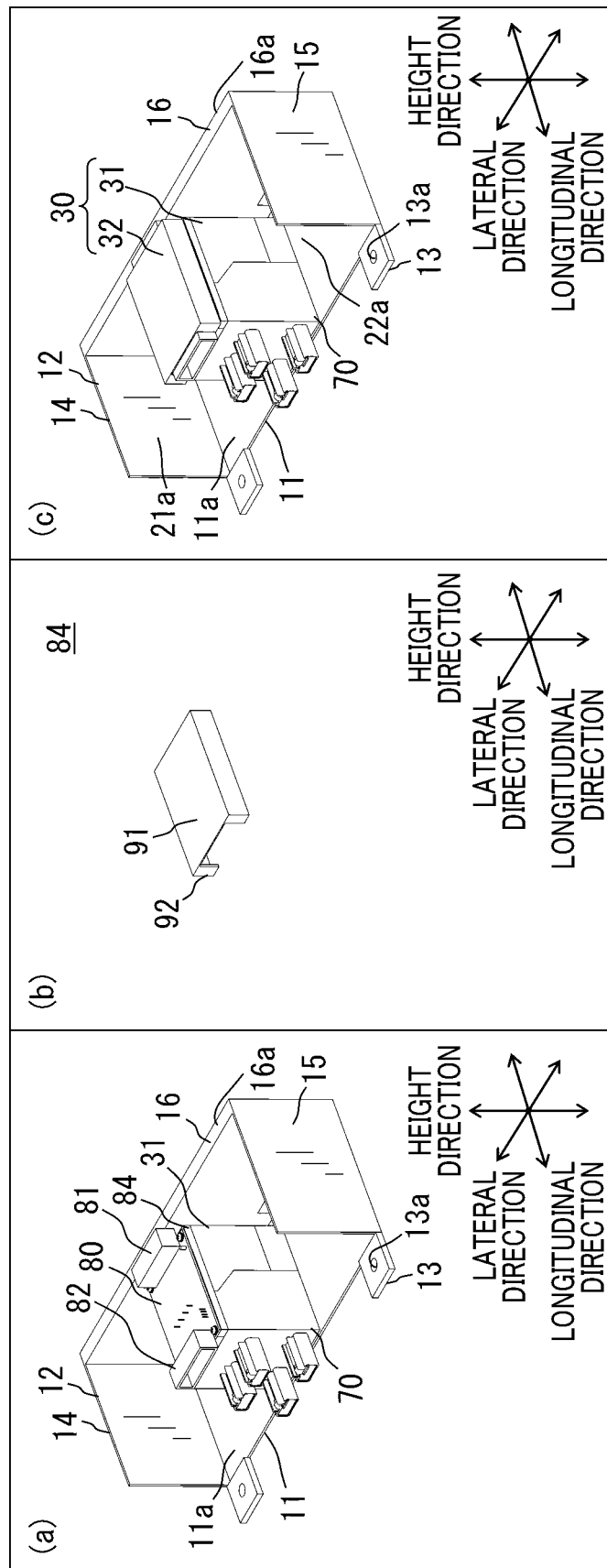
FIG. 26 shows, in its parts (a) to (c), drawings illustrating an assembly process of the control cover.

According to a first modified exemplary embodiment, as shown in FIG. 11, the battery ECU 32 is mounted on the mounting wall 11, such that the element unit 31 is provided at the upper portion of the battery ECU 32. Meanwhile, as shown in FIGS. 25 and 26, the element unit 31 is mounted on the mounting wall 31, such that the battery ECU 32 may be provided at an upper portion of the element unit 31. Accordingly, the system main relay 50 becomes easy to be thermally connected to the mounting wall 11. That is, the system main relay 50 becomes easy to be thermally connected to a body of the hybrid vehicle via the mounting wall 11. Therefore, it is possible to suppress heat generation of the system main relay 50. For example, the system main relay 50 may be mounted on the mounting wall 11. According to the first modified exemplary embodiment, four bus bars are exposed from a surface that is separated from the mounting wall 11 of the case 70 in the longitudinal direction.

Second Modified Exemplary Embodiment

Figure 27:
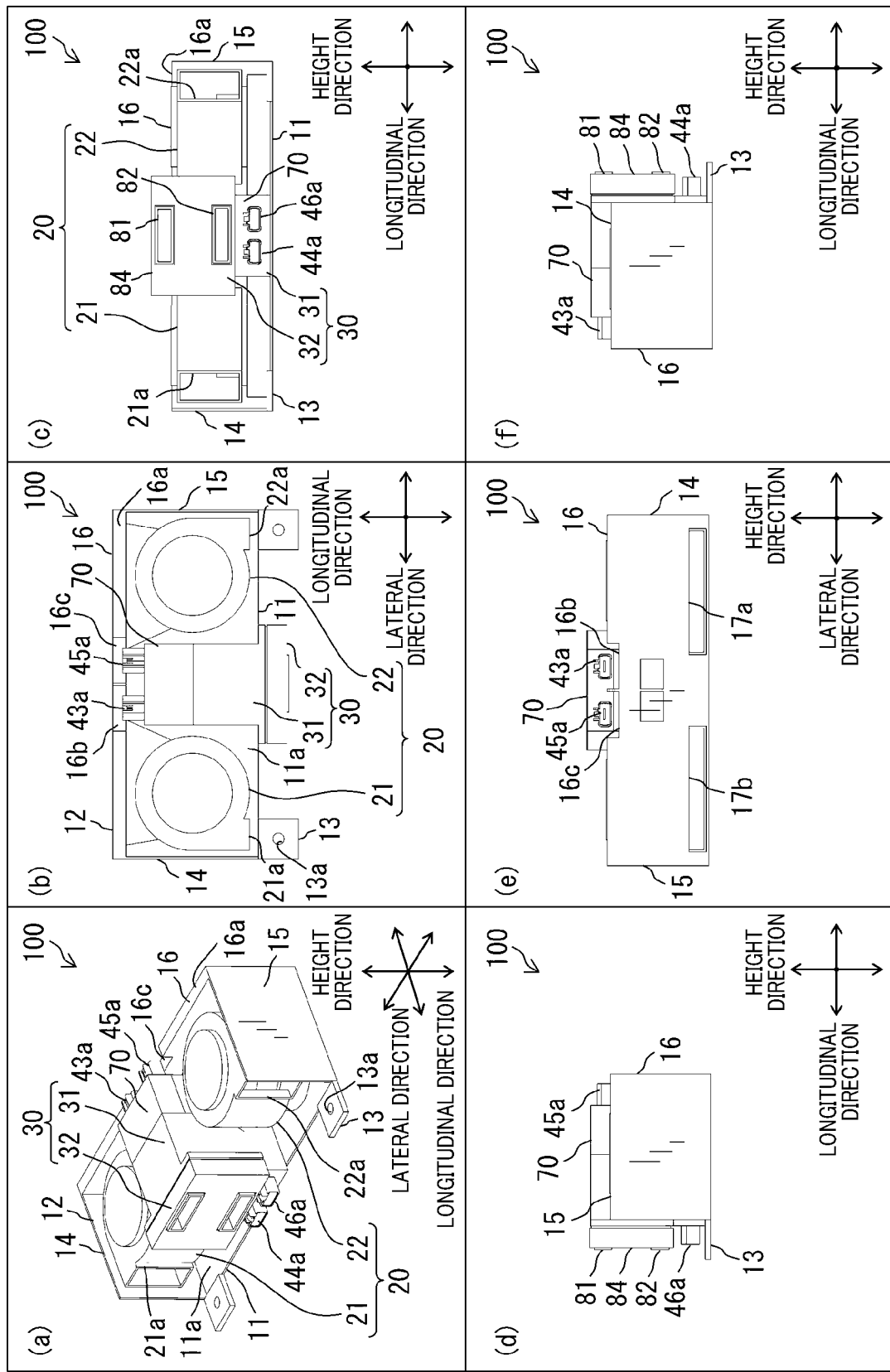
FIG. 27 shows, in its parts (a) to (f), drawings illustrating variations of the control module.
Figure 28:
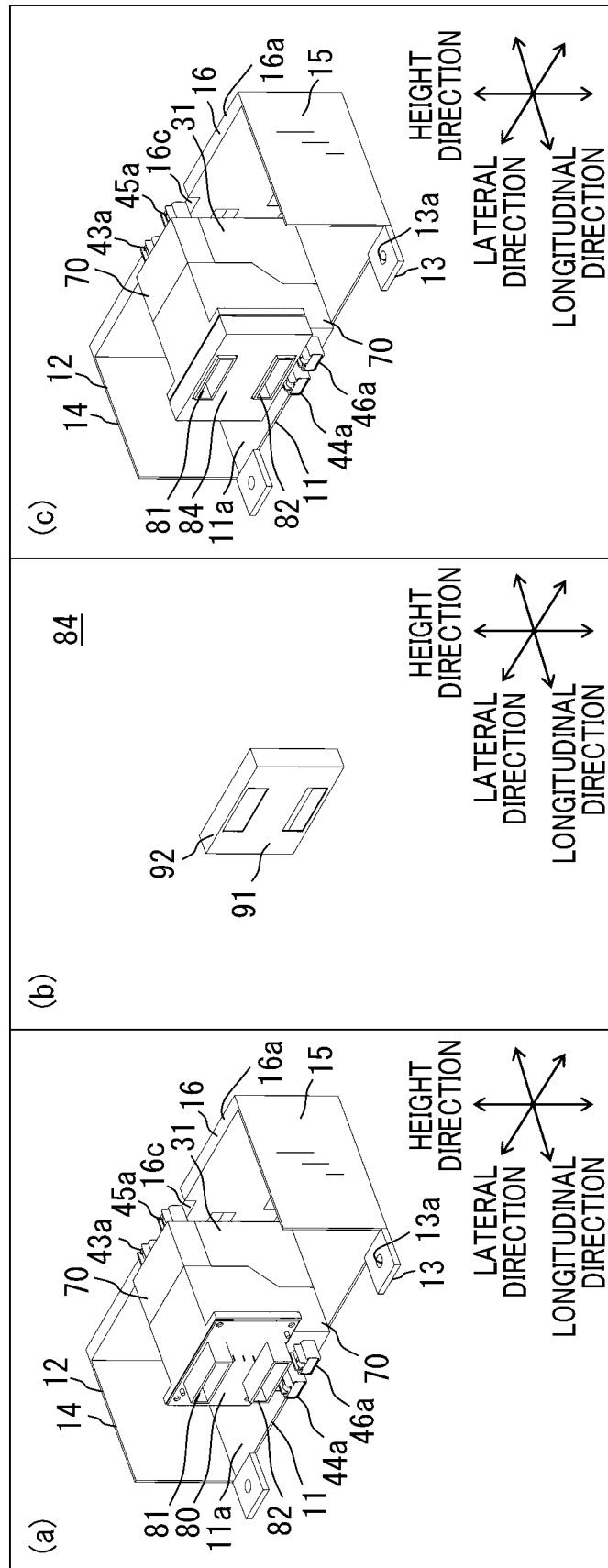
FIG. 28 shows, in its parts (a) to (c), drawings illustrating an assembly process of the control cover.

Further, as shown in FIGS. 27 and 28, the element unit 31 is mounted on the mounting wall 11, such that the battery ECU 32 may be provided on a surface that is separated from the battery module 200 of the element unit 31 in the longitudinal direction, such that it is possible to suppress a length of the control module 100 in the height direction from increasing. Further, for example, the system main relay 50 may be mounted on the mounting wall 11, such that it is possible to suppress the heat generation of the system main relay 50. In the case of this modified exemplary embodiment, two notches, at which the internal connector 81 and the external connector 82 are respectively provided, are formed at two end portions on the opposite wall 91 of the control cover 84 in the height direction.

Other Modified Exemplary Embodiment

In the exemplary embodiment, the battery pack 300 is applied to the hybrid vehicle. Further, the battery pack 300 may be also applied to a plug-in hybrid vehicle and an electric vehicle.

In the exemplary embodiment, the battery module 200 includes the first battery stack 231 and the second battery stack 232. Further, the battery module 200 may include the battery stack in a configuration different from the exemplary embodiment. For example, the battery module 200 may be configured to include four battery stacks.

According to the exemplary embodiment, the frame 210 and the connecting frame 10 are separately provided, such that the right wall 215 and the connecting wall 16 are mechanically connected to each other. Alternatively, the frame 210 and the connecting frame 10 may be configured to be integrally provided. In this case, the connecting wall 16 performs a function as the right wall 215. An integral structure, in which the frame 210 and the connecting frame 10 are provided, is shared by the control module 100 and the battery module 200.

According to the exemplary embodiment, the first sweep-out outlet 21a of the first fan 21 is opened to the side that is opposite to the connecting wall 16 in the longitudinal direction, and the second sweep-out outlet 22a of the second fan 22 is opened to the side that is opposite to the connecting wall 16 in the longitudinal direction. Alternatively, at least one portion of the first sweep-out outlet 21a and the second sweep-out outlet 22a may be opened to a side of the system main relay 50 of the case 70. Accordingly, it is advantageously possible to cool the system main relay 50 by air that is discharged from at least one portion of the first sweep-out outlet 21a and the second sweep-out outlet 22a.

Further, the first sweep-out outlet 21a and the second sweep-out outlet 22a are configured to be arranged in the lateral direction and to be opened to a side of the control unit 30, or may be configured to be opened to an opposite side of the control unit 30 in the lateral direction. The first sweep-out outlet 21a and the second sweep-out outlet 22a may be respectively opened in the height direction.

More specifically, the first sweep-out outlet 21a of the first fan 21 and the second sweep-out outlet 22a of the second fan 22, shown in the part (d) of FIG. 12, may be configured not to have a function of discharging air but to have a function of sucking air.

According to the exemplary embodiment, the system main relay 50 includes the first switch 50 and the second switch 52. Alternatively, the system main relay 50 may be configured to include only one of the first switch 50 and the second switch 52.

According to the exemplary embodiment, the control substrate 80 is covered by the control cover 84 and the case 70. Alternatively, the control cover 84 may not be provided.

In this case, the lower surface of the control substrate 80 is covered by the mounting wall 11.

According to the exemplary embodiment, the control substrate 80 is disposed out of the case 70. Alternatively, the control substrate 80 may be configured to be disposed inside the case 70. Accordingly, the control cover is not required, thereby suppressing the number of parts from increasing.

According to the exemplary embodiment, the current sensor 60 is provided in the external positive electrode bus bar 44. Alternatively, the current sensor 60 may be configured to be respectively provided at the external positive electrode bus bar 44 and the external negative electrode bus bar 46, or the current sensor 60 may be configured to be provided at the external negative electrode bus bar 46.

DESCRIPTION OF PARTIAL SYMBOLS

10: connecting frame
16b: third notch
16c: fourth notch
17a: third ventilation hole
17b: fourth ventilation hole
30: control unit
31: element unit
32: battery ECU
40: bus bar
43: internal positive electrode bus bar
44: external positive electrode bus bar
45: internal negative electrode bus bar
46: external negative electrode bus bar
50: system main relay
53: first permanent magnet
54: second permanent magnet
60: current sensor
61: magnetoelectric conversion element
64: shield
66: sensor connection terminal
69: shielding part
69a: groove
70: case
100: control module
200: battery module
219a: first ventilation hole
219b: second ventilation hole
230: battery stack
231: first battery stack
232: second battery stack
240: battery cell
240a: upper end surface
240b: lower end surface
241: positive electrode terminal
242: negative electrode terminal
245: positive electrode input/output terminal
246: negative electrode input/output terminal
300: battery pack
400: electric load

What is claimed is:

1. A control module that is arranged side by side with a battery module including battery stacks in which a plurality of battery cells are arranged in a longitudinal direction that is orthogonal to a height direction ranging from an upper end surface on which electrodes of the battery cells are provided, to a lower end surface that is disposed at an opposite side of the upper end surface, the control module comprising:
   a bus bar by which the battery module and an electric load are electrically connected to each other;
   a case having a ceiling wall;

a switch by which an electrical connection between the battery module and the electric load via the bus bar is switched on and off, the switch being configured to generate a magnetic field to switch over connections between the bus bar and the electric load based on the generated magnetic field, the switch being disposed within the case, the switch including:
magnets which generate a magnetic force spatially bending a flow of a discharge current caused when an electric connection between the battery module and the electric load changes from an electrically connected state to an electrically disconnected state, the magnets being magnetized in a lateral direction that is orthogonal to the height direction and the longitudinal direction respectively, and the magnets being located on opposite sides of the bus bar in the lateral direction so that a magnetic flux generated by the magnets crosses the bus bar;
a first shielding part disposed within the case; and
a current sensor which is positionally arranged to be opposed to the magnets of the switch in the longitudinal direction, the current sensor being configured to detect current passing through the bus bar, the current sensor being disposed within the case, the current sensor including:
a magnetoelectric conversion element converting, into an electrical signal, the magnetic field in the longitudinal direction, and
a second shielding part which is positionally arranged to be opposed to the magnetoelectric conversion element in the height direction, the second shielding part suppressing the magnetic field in the height direction passing through the magnetoelectric conversion element,
wherein the first shielding part is arranged between the current sensor and the switch, extends from the ceiling wall of the case, is separated from the bus bar, and has a groove, with the bus bar passing through the groove.

2. The control module according to claim 1, further comprising:
a control unit receiving the electrical signal from the current sensor to control the switchover of the switch; and
a connection terminal electrically connecting the current sensor and the control unit,
wherein the current sensor includes a connection portion connected with the connection terminal, the connection portion being located closer to the control unit than a connection portion of the switch is, the bus bar being connected with the connection portion of the switch.

3. The control module according to claim 2, wherein
the bus bar has a first connection end connected to the electric load and a second connection end connected to the battery module, wherein the first connection end is located closer to the control unit than the second connection end is in the height direction;
the switch is provided in the bus bar connected to the second connection end; and
the current sensor is provided in the bus bar connected to the first connection end.

4. The control module according to claim 2, wherein
the bus bar is located facing the upper side surface of the battery cell in the height direction and the control unit is located facing the lower side surface of the battery cell in the height direction; and
the switch is located between the bus bar and the control unit in the height direction.

5. The control module according to claim 1, wherein
the battery module includes a plurality of the battery stacks and a plurality of battery-side ventilation holes through which wind flows to the plurality of the battery stacks; and
the case is arranged between two battery-side ventilation holes among the battery-side ventilation holes, the two battery-side ventilation holes being provided in a lateral direction perpendicular to both the longitudinal direction and the height direction.

6. The control module according to claim 1, further comprising a mounting part containing a part or whole of the bus bar, the switch, the current sensor, and the first shielding part; wherein
the battery module is provided with a plurality of the battery stacks arranged in the lateral direction perpendicular to both the longitudinal and height directions;
the mounting part includes a plurality of control-side ventilation holes through which wind flows to the plurality of the battery stacks, the plurality of control-side ventilation holes being formed in a lateral direction perpendicular to both the longitudinal and height directions; and
a part or whole of the bus bar, the switch, the current sensor, and the first shielding part are arranged between two of the plurality of control-side ventilation holes which are present in the lateral direction.

7. The control module according to claim 6, wherein
the mounting part includes input/output terminals through which power is inputted or outputted to or from the battery stack, and a notch for the bus bar;
wherein the notch is located to face the upper side surface of the battery cell in the height direction, and the control-side ventilation hole is located closer to the lower side surface to the battery cell than the notch is, in the height direction.

8. The control module according to claim 1, further comprising:
a control unit receiving the electrical signal from the current sensor to control the switchover of the switch; and
a connection terminal electrically connecting the current sensor and the control unit,
wherein the current sensor includes a connection portion connected with the connection terminal, the connection portion being located closer to the control unit than a connection portion of the switch is, the bus bar being connected with the connection portion of the switch.

9. The control module according to claim 8, wherein
the bus bar is located facing the upper side surface of the battery cell in the height direction and the control unit is located facing the lower side surface of the battery cell in the height direction; and
the switch is located between the bus bar and the control unit in the height direction.

10. The control module according to claim 8, wherein
the bus bar has a first connection end connected to the electric load and a second connection end connected to the battery module, wherein the first connection end is located closer to the control unit than the second connection end is in the height direction;
the switch is provided in the bus bar connected to the second connection end; and
the current sensor is provided in the bus bar connected to the first connection end.

11. The control module according to claim 10, wherein
the bus bar is located facing the upper side surface of the battery cell in the height direction and the control unit is located facing the lower side surface of the battery cell in the height direction; and
the switch is located between the bus bar and the control unit in the height direction.

12. The control module according to claim 8,
wherein the control module is arranged side by side with the battery module in the longitudinal direction, and is provided at an installation space under a seat of a vehicle including a generator as at least one of a power supply source and a power generation source.

13. A system mounted in a vehicle, the system comprising:
a battery module including battery stacks in which a plurality of battery cells are arranged in a longitudinal direction that is orthogonal to a height direction ranging from an upper end surface on which electrodes of the battery cells are provided, to a lower end surface that is disposed at an opposite side of the upper end surface; and
a control module that is arranged side by side with the battery module,
wherein the control module comprises
a bus bar by which the battery module and an electric load are electrically connected to each other;
a case having a ceiling wall;
a switch by which an electrical connection between the battery module and the electric load via the bus bar is switched on and off, the switch being configured to generate a magnetic field to switch over connections between the bus bar and the electric load based on the generated magnetic field, the switch being disposed within the case, the switch including:
magnets which generate a magnetic force spatially bending a flow of a discharge current caused when an electric connection between the battery module and the electric load changes from an electrically connected state to an electrically disconnected state, the magnets being magnetized in a lateral direction that is orthogonal to the height direction and the longitudinal direction respectively, and the magnets being located on opposite sides of the bus bar in the lateral direction so that a magnetic flux generated by the magnets crosses the bus bar;
a first shielding part disposed within the case; and
a current sensor which is positionally arranged to be opposed to the magnets of the switch in the longitudinal direction, the current sensor being configured to detect current passing through the bus bar, the current sensor including:
a magnetoelectric conversion element converting, into an electrical signal, the magnetic field in the longitudinal direction, and
a second shielding part which is positionally arranged to be opposed to the magnetoelectric conversion element in the height direction, the second shielding part suppressing the magnetic field in the height direction passing through the magnetoelectric conversion element,
wherein the first shielding part is arranged between the current sensor and the switch, extends from the ceiling wall of the case, is separated from the bus bar, and has a groove, with the bus bar passing through the groove.

* * * * *